(12) United States Patent
Kang et al.

(10) Patent No.: US 12,527,219 B2
(45) Date of Patent: Jan. 13, 2026

(54) ORGANIC ELECTROLUMINESCENT COMPOUND AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: Hee-Ryong Kang, Gyeonggi-do (KR); So-Young Jung, Gyeonggi-do (KR); Jeong-Hwan Jeon, Gyeonggi-do (KR); Sang-Hee Cho, Gyeonggi-do (KR)

(73) Assignee: DuPont Specialty Materials Korea Ltd. (KR)

( * ) Notice: Subject to any disclaimer, the term of this patent is extended or adjusted under 35 U.S.C. 154(b) by 0 days.

(21) Appl. No.: 17/499,773

(22) Filed: Oct. 12, 2021

(65) Prior Publication Data
US 2022/0123230 A1    Apr. 21, 2022

(30) Foreign Application Priority Data

Oct. 20, 2020  (KR) ........................ 10-2020-0135750

(51) Int. Cl.

| | |
|---|---|
| *C07D 403/04* | (2006.01) |
| *C07D 403/10* | (2006.01) |
| *C07D 403/14* | (2006.01) |
| *C07D 405/10* | (2006.01) |
| *C07D 405/12* | (2006.01) |
| *C07D 405/14* | (2006.01) |
| *C07D 409/10* | (2006.01) |
| *C07D 409/14* | (2006.01) |
| *C07D 413/04* | (2006.01) |
| *C07D 413/12* | (2006.01) |
| *C07D 487/04* | (2006.01) |
| *C07D 487/06* | (2006.01) |
| *C07D 487/16* | (2006.01) |
| *C07D 491/06* | (2006.01) |
| *C07D 495/04* | (2006.01) |
| *C09K 11/06* | (2006.01) |
| *H10K 85/60* | (2023.01) |
| *H10K 50/11* | (2023.01) |
| *H10K 101/10* | (2023.01) |

(52) U.S. Cl.
CPC ....... *H10K 85/6572* (2023.02); *C07D 403/04* (2013.01); *C07D 403/10* (2013.01); *C07D 405/12* (2013.01); *C07D 405/14* (2013.01); *C07D 487/04* (2013.01); *C09K 11/06* (2013.01); *H10K 85/636* (2023.02); *H10K 85/6574* (2023.02); *C09K 2211/1018* (2013.01); *H10K 50/11* (2023.02); *H10K 2101/10* (2023.02)

(58) Field of Classification Search
CPC .. C07D 403/04; C07D 403/10; C07D 403/14; C07D 405/10; C07D 405/12; C07D 405/14; C07D 409/10; C07D 409/14; C07D 413/04; C07D 413/12; C07D 487/04; C07D 487/06; C07D 487/16; C07D 491/06; C07D 495/04; C09K 11/06; C09K 2211/1018; C09K 2211/1011; C09K 2211/1022; C09K 2211/1037; C09K 2211/1029; C09K 2211/1044; C09K 2211/1059; C09K 2211/1088; C09K 2211/1092
See application file for complete search history.

(56) References Cited

U.S. PATENT DOCUMENTS

| | | | |
|---|---|---|---|
| 6,280,859 B1 * | 8/2001 | Onikubo ............ | H10K 85/626 252/301.16 |
| 7,541,096 B2 | 6/2009 | Rogers et al. | |
| 7,714,099 B2 * | 5/2010 | Morishita ............ | C08G 73/18 313/506 |
| 9,123,897 B2 * | 9/2015 | Yokoyama .......... | H10K 85/654 |
| 2007/0003783 A1 * | 1/2007 | Morishita ............ | H05B 33/14 428/690 |
| 2008/0027226 A1 * | 1/2008 | Rogers ................ | C07D 403/10 546/199 |
| 2009/0036623 A1 * | 2/2009 | Tsuda .................. | H10K 85/342 526/242 |
| 2012/0012831 A1 | 1/2012 | Shuichi et al. | |
| 2017/0186976 A1 | 6/2017 | Tanabe et al. | |
| 2020/0172558 A1 | 6/2020 | Joo et al. | |
| 2020/0365809 A1 * | 11/2020 | Kase .................... | H10K 50/10 |

(Continued)

FOREIGN PATENT DOCUMENTS

| | | | |
|---|---|---|---|
| CN | 104119388 | * | 10/2014 |
| CN | 104119390 | * | 10/2014 |

(Continued)

OTHER PUBLICATIONS

Tomkute-Luksiene et al., 2-Phenyl-1,2,3-benzotriazole Ir(III) complexes with additional donor fragment for single-layer PhOLED devices, Dyes and Pigments, vol. 96, No. 1, pp. 278-286 (Year: 2013).*

(Continued)

*Primary Examiner* — Brenda L Coleman
(74) *Attorney, Agent, or Firm* — G. Creston Campbell

(57) ABSTRACT

The present disclosure relates to an organic electroluminescent compound, and an organic electroluminescent device comprising the same. By comprising the organic electroluminescent compound according to the present disclosure in a light-emitting layer, it is possible to produce an organic electroluminescent device having an improved driving voltage, luminous efficiency and/or lifetime properties.

4 Claims, No Drawings

(56) References Cited

U.S. PATENT DOCUMENTS

| | | | |
|---|---|---|---|
| 2021/0226132 A1 | 7/2021 | Kase et al. | |
| 2021/0305514 A1* | 9/2021 | Kim | H10K 85/636 |
| 2022/0209127 A1* | 6/2022 | Kim | H10K 85/636 |

FOREIGN PATENT DOCUMENTS

| | | | |
|---|---|---|---|
| CN | 104119393 | * | 10/2014 |
| CN | 112538060 | * | 3/2021 |
| JP | 2017057355 A | | 3/2017 |
| KR | 20150106067 A | | 9/2015 |
| KR | 2020115813 | * | 10/2020 |
| KR | 2020115813 A | | 10/2020 |

OTHER PUBLICATIONS

RSC Advances, Issue 3, Rigid triarylamine-based D-A-p-A structural organic sensitizers for solar cells: the significant enhancement of open-circuit photovoltage with a long alkyl group, p. 22544-22553, (2013).

Request for the Submission of an Opinion from Korea Intellectual Patent Office for Korea patent Application No. 10-2020-0135750; Application Date: Oct. 20, 2020.

Search Report from China National Intellectual Property Administration for China Patent Application No. 202111206047.X; Application Date: Oct. 14, 2021.

* cited by examiner

ORGANIC ELECTROLUMINESCENT COMPOUND AND ORGANIC ELECTROLUMINESCENT DEVICE COMPRISING THE SAME

TECHNICAL FIELD

The present disclosure relates to an organic electroluminescent compound and an organic electroluminescent device comprising the same.

BACKGROUND ART

A small molecular green organic electroluminescent device (OLED) was first developed by Tang, et al., of Eastman Kodak in 1987 by using TPD/Alq3 bi-layer consisting of a light-emitting layer and a charge transport layer. Thereafter, the development of OLEDs was rapidly effected and OLEDs have been commercialized. At present, OLEDs primarily use phosphorescent materials having excellent luminous efficiency in panel implementation. However, in many applications such as TVs and lightings, the lifetime of OLEDs is insufficient and higher efficiency of OLEDs is still required. Typically, the higher the luminance of an OLED, the shorter the lifetime that OLED has. Therefore, an OLED having high luminous efficiency and/or long lifetime characteristics is required for long time use and high resolution of a display.

In order to enhance luminous efficiency, driving voltage and/or lifetime, various materials or concepts for an organic layer of an OLED have been proposed. However, they were not satisfactory in practical use.

Meanwhile, U.S. Pat. No. 7,541,096 discloses a specific 2H-benzotriazole compound as a light-emitting layer material. Korean Patent Application Laying-Open No. 2011-133030 discloses a compound having a benzotriazole ring structure as an electron transport layer material. Korean Patent Application Laying-Open No. 2016-0141808 discloses a 2H-benzotriazole derivative as a light-emitting layer material.

However, the benzotriazole derivatives disclosed in said references have structures unsuitable as a phosphorescent light-emitting material, as well as not being developed as materials used in a phosphorescent light-emitting layer. Currently, it is difficult to expect them to have sufficiently excellent properties in OLEDs. The present disclosure intends to develop a compound having improved performances, for example, improved driving voltage, luminous efficiency and/or lifetime properties, compared to conventional compounds by introducing a substituent capable of having excellent performance in phosphorescence into a 1,2,3-benzotriazole ring structure.

DISCLOSURE OF INVENTION

Technical Problem

The objective of the present disclosure is to provide an organic electroluminescent compound having a new structure suitable for applying it to an organic electroluminescent device. Another objective of the present disclosure is to provide an improved organic electroluminescent material capable of providing an organic electroluminescent device having improved luminous efficiency and/or lifetime properties. Still another objective of the present disclosure is to provide an organic electroluminescent device having improved luminous efficiency and/or lifetime properties by developing a light-emitting compound having improved electron transport ability.

Solution to Problem

The present inventors found that the above objective can be achieved by a compound represented by the following formula 1.

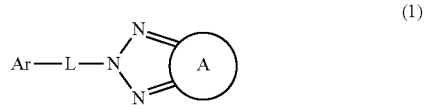

(1)

In formula 1,

Ar represents a substituted or unsubstituted (C1-C30) alkyl, a substituted or unsubstituted (C6-C30)aryl, or a substituted or unsubstituted (3- to 30-membered)heteroaryl;

L represents a single bond, a substituted or unsubstituted (C6-C30)arylene, or a substituted or unsubstituted (3- to 30-membered)heteroarylene;

ring A represents a substituted or unsubstituted (C6-C30) arene, or a substituted or unsubstituted (3- to 30-membered)heteroarene, with the proviso that ring A is substituted with at least one of $-L_1(Ar_1)a$ and $-L_2-N(R')(R'')$;

a represents an integer of 1 or 2, where if a is an integer of 2, each of $Ar_1$ may be the same or different:

$L_1$ and $L_2$, each independently, represent a single bond, a substituted or unsubstituted (C6-C30)arylene, or a substituted or unsubstituted (3- to 30-membered)heteroarylene;

$Ar_1$, each independently, represents a substituted or unsubstituted (C6-C30)aryl, or a substituted or unsubstituted (3- to 30-membered)heteroaryl, with the proviso that $Ar_1$ does not include a pyridyl and $Ar_1$ does not represent any one of

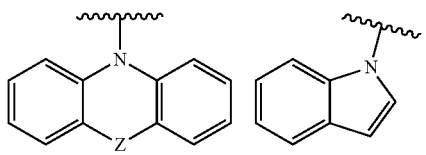

and

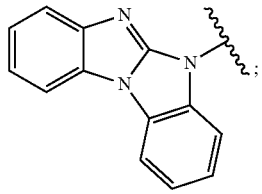 [SMILES: *n1c2ccccc2n2c3ccccc3nc12]

Z represents O, S. C(O), N(Rx), or C(Ry)(Rz);

Rx represents an unsubstituted phenyl, and Ry and Rz, each independently, represent an unsubstituted methyl; and R' and R'', each independently, represent a substituted or unsubstituted (C6-C30)aryl, a substituted or unsubstituted (3- to 30-membered)heteroaryl, or a substituted or unsubstituted (C3-C30)cycloalkyl, with the proviso that any one of R' and R" represents a substituted or unsubstituted (C11-C30)aryl, or a substituted or unsubstituted (3- to 30-membered)heteroaryl;

wherein if ring A represents a (C6-C10)arene substituted with one -L$_1$(Ar$_1$)a, in which L$_1$ represents a single bond, a represents an integer of 1, and Ar$_1$ represents

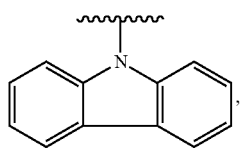 [SMILES: *n1c2ccccc2c2ccccc21]

Ar is not an unsubstituted phenyl, an unsubstituted naphthyl, or an unsubstituted carbazolyl.

Advantageous Effects of Invention

The organic electroluminescent compound according to the present disclosure exhibits performances suitable for using it in an organic electroluminescent device. In addition, an organic electroluminescent device having improved luminous efficiency and/or lifetime properties compared to conventional organic electroluminescent devices is provided by comprising the compound according to the present disclosure in a light-emitting layer.

MODE FOR THE INVENTION

Hereinafter, the present disclosure will be described in detail. However, the following description is intended to explain the present disclosure and is not meant in any way to restrict the scope of the present disclosure.

The term "organic electroluminescent compound" in the present disclosure means a compound that may be used in an organic electroluminescent device, and may be comprised in any layer constituting an organic electroluminescent device, as necessary.

The term "an organic electroluminescent material" in the present disclosure means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport zone material, a light-emitting material (including a host material and a dopant material), an electron buffer material, a hole blocking material, an electron transport material, an electron injection material, etc. The hole transport zone material may be at least one selected from the group consisting of a hole transport material, a hole injection material, an electron blocking material, a hole auxiliary material, and a light-emitting auxiliary material.

The organic electroluminescent material of the present disclosure may comprise at least one compound represented by formula 1. The compound represented by formula 1 may be comprised in a light-emitting layer, but is not limited thereto.

Herein, the term "(C1-C30)alkyl" is meant to be a linear or branched alkyl having 1 to 30 carbon atoms constituting the chain, in which the number of carbon atoms is preferably 1 to 10, and more preferably 1 to 6. The above alkyl may include methyl, ethyl, n-propyl, isopropyl, n-butyl, isobutyl, tert-butyl, sec-butyl, etc. The term "(C3-C30)cycloalkyl" is meant to be a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, cyclopentylmethyl, cyclohexylmethyl, etc. The term "(3- to 7-membered)heterocycloalkyl" is meant to be a cycloalkyl having 3 to 7 ring backbone atoms, and including at least one heteroatom selected from the group consisting of B, N, O, S, Si, and P, and preferably the group consisting of O, S. and N. The above heterocycloalkyl may include tetrahydrofuran, pyrrolidine, thiolan, tetrahydropyran, etc. The term "(C6-C30) aryl," "(C6-C30)arylene," or "(C6-C30)arene" is meant to be a monocyclic or fused ring radical derived from an aromatic hydrocarbon having 6 to 30 ring backbone carbon atoms. The above aryl, arylene, or arene may be partially saturated, and may comprise a spiro structure. The above aryl may include phenyl, biphenyl, terphenyl, naphthyl, binaphthyl, phenylnaphthyl, naphthylphenyl, fluorenyl, phenylfluorenyl, diphenylfluorenyl, benzofluorenyl, dibenzofluorenyl, phenanthrenyl, phenylphenanthrenyl, anthracenyl, indenyl, triphenylenyl, pyrenyl, tetracenyl, perylenyl, chrysenyl, naphthacenyl, fluoranthenyl, spirobifluorenyl, spiro[fluorene-benzofluoren]yl, azulenyl, tetramethyldihydrophenanthrenyl, etc. Specifically, the above aryl may include phenyl, 1-naphthyl, 2-naphthyl, 1-anthryl, 2-anthryl, 9-anthryl, benzanthryl, 1-phenanthryl, 2-phenanthryl, 3-phenanthryl, 4-phenanthryl, 9-phenanthryl, naphthacenyl, pyrenyl, 1-chrysenyl, 2-chrysenyl, 3-chrysenyl, 4-chrysenyl, 5-chrysenyl, 6-chrysenyl, benzo[c]phenanthryl, benzo[g] chrysenyl, 1-triphenylenyl, 2-triphenylenyl, 3-triphenylenyl, 4-triphenylenyl, 1-fluorenyl, 2-fluorenyl, 3-fluorenyl, 4-fluorenyl, 9-fluorenyl, benzo[a]fluorenyl, benzo[b]fluorenyl, benzo[c]fluorenyl, dibenzofluorenyl, 2-biphenyl, 3-biphenyl, 4-biphenyl, ε-terphenyl, m-terphenyl-4-yl, m-terphenyl-3-yl, m-terphenyl-2-yl, p-terphenyl-4-yl, p-terphenyl-3-yl, p-terphenyl-2-yl, m-quaterphenyl, 3-fluoranthenyl, 4-fluoranthenyl, 8-fluoranthenyl, 9-fluoranthenyl, benzofluoranthenyl, o-tolyl, m-tolyl, p-tolyl, 2,3-xylyl, 3,4-xylyl, 2,5-xylyl, mesityl, o-cumenyl, m-cumenyl, p-cumenyl, p-tert-butylphenyl, p-(2-phenylpropyl)phenyl, 4'-methylbiphenyl, 4"-tert-butyl-p-terphenyl-4-yl, 9,9-dimethyl-1-fluorenyl, 9,9-dimethyl-2-fluorenyl, 9,9-dimethyl-3-fluorenyl, 9,9-dimethyl-4-fluorenyl, 9,9-diphenyl-1-fluorenyl, 9,9-diphenyl-2-fluorenyl, 9,9-diphenyl-3-fluorenyl, 9,9-diphenyl-4-fluorenyl, 11,11-dimethyl-1-benzo[a]fluorenyl, 11,11-dimethyl-2-benzo[a]fluorenyl, 11,11-dimethyl-3-benzo[a]fluorenyl, 11,11-dimethyl-4-benzo[a]fluorenyl, 11,11-dimethyl-5-benzo[a]fluorenyl, 11,11-dimethyl-6-benzo[a]fluorenyl, 11,11-dimethyl-7-benzo[a]fluorenyl, 11,11-dimethyl-8-benzo[a]fluorenyl, 11,11-dimethyl-9-benzo[a]fluorenyl, 11,11-dimethyl-10-benzo[a]fluorenyl, 11,11-dimethyl-1-benzo[b]fluorenyl, 11,11-dimethyl-2-benzo[b]fluorenyl, 11,11-dimethyl-3-benzo[b]fluorenyl, 11,11-dimethyl-4-benzo[b]fluorenyl, 11,11-dimethyl-5-benzo[b]fluorenyl, 11,11-dimethyl-6-benzo[b]fluorenyl, 11,11-dimethyl-7-benzo[b]fluorenyl, 11,11-dimethyl-8-benzo[b]fluorenyl, 11,11-dimethyl-9-benzo[b]fluorenyl, 11,11-dimethyl-10-benzo[b]fluorenyl, 11,11-dimethyl-1-benzo[c]fluorenyl, 11,11-dimethyl-2-benzo[c]fluorenyl, 11,11-dimethyl-3-benzo[c]fluorenyl, 11,11-dimethyl-4-benzo[c]fluorenyl, 11,11-dimethyl-5-benzo[c]fluorenyl, 11,11-dimethyl-6-benzo[c]fluorenyl, 11,11-dimethyl-7-benzo[c]fluorenyl, 11,11-dimethyl-8-benzo[c]fluorenyl, 11,11-dimethyl-9-benzo[c]fluorenyl, 11,11-dimethyl-10-benzo[c]fluorenyl, 11,11-diphenyl-1-benzo[a]

fluorenyl, 11,11-diphenyl-2-benzo[a]fluorenyl, 11,11-diphenyl-3-benzo[a]fluorenyl, 11,11-diphenyl-4-benzo[a]fluorenyl, 11,11-diphenyl-5-benzo[a]fluorenyl, 11,11-diphenyl-6-benzo[a]fluorenyl, 11,11-diphenyl-7-benzo[a]fluorenyl, 11,11-diphenyl-8-benzo[a]fluorenyl, 11,11-diphenyl-9-benzo[a]fluorenyl, 11,11-diphenyl-10-benzo[a]fluorenyl, 11,11-diphenyl-1-benzo[b]fluorenyl, 11,11-diphenyl-2-benzo[b]fluorenyl, 11,11-diphenyl-3-benzo[b]fluorenyl, 11,11-diphenyl-4-benzo[b]fluorenyl, 11,11-diphenyl-5-benzo[b]fluorenyl, 11,11-diphenyl-6-benzo[b]fluorenyl, 11,11-diphenyl-7-benzo[b]fluorenyl, 11,11-diphenyl-8-benzo[b]fluorenyl, 11,11-diphenyl-9-benzo[b]fluorenyl, 11,11-diphenyl-10-benzo[b]fluorenyl, 11,11-diphenyl-1-benzo[c]fluorenyl, 11,11-diphenyl-2-benzo[c]fluorenyl, 11,11-diphenyl-3-benzo[c]fluorenyl, 11,11-diphenyl-4-benzo[c]fluorenyl, 11,11-diphenyl-5-benzo[c]fluorenyl, 11,11-diphenyl-6-benzo[c]fluorenyl, 11,11-diphenyl-7-benzo[c]fluorenyl, 11,11-diphenyl-8-benzo[c]fluorenyl, 11,11-diphenyl-9-benzo[c]fluorenyl, 11,11-diphenyl-10-benzo[c]fluorenyl, 9,9,10,10-tetramethyl-9,10-dihydro-1-phenanthrenyl, 9,9,10,10-tetramethyl-9,10-dihydro-2-phenanthrenyl, 9,9,10,10-tetramethyl-9,10-dihydro-3-phenanthrenyl, 9,9,10,10-tetramethyl-9,10-dihydro-4-phenanthrenyl, etc.

The term "(3- to 30-membered)heteroaryl," "(3- to 30-membered)heteroarylene," or "(3- to 30-membered)heteroarene" is meant to be an aryl, an arylene, or an arene having 3 to 30 ring backbone atoms, and including at least one, preferably 1 to 4 heteroatoms selected from the group consisting of B, N, O, S. Si, and P. The above heteroaryl, heteroarylene, or heteroarene may be a monocyclic ring, or a fused ring condensed with at least one benzene ring; may be partially saturated; may be one formed by linking at least one heteroaryl or aryl group to a heteroaryl group via a single bond(s); and may comprise a spiro structure. The above heteroaryl may include a monocyclic ring-type heteroaryl such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, and pyridazinyl, and a fused ring-type heteroaryl such as benzofuranyl, benzothiophenyl, isobenzofuranyl, dibenzofuranyl, dibenzothiophenyl, dibenzoselenophenyl, naphthobenzofuranyl, naphthobenzothiophenyl, benzofuroquinolinyl, benzofuroquinazolinyl, benzofuronaphthyridinyl, benzofuropyrimidinyl, naphthofuropyrimidinyl, benzothienoquinolinyl, benzothienoquinazolinyl, benzothienonaphthyridinyl, benzothienopyrimidinyl, naphthothienopyrimidinyl, pyrimidoindolyl, benzopyrimidoindolyl, benzofuropyrazinyl, naphthofuropyrazinyl, benzothienopyrazinyl, naphthothienopyrazinyl, pyrazinoindolyl, benzopyrazinoindolyl, benzimidazolyl, benzothiazolyl, benzoisothiazolyl, benzoisoxazolyl, benzoxazolyl, isoindolyl, indolyl, indazolyl, benzothiadiazolyl, quinolyl, isoquinolyl, cinnolinyl, quinazolinyl, quinoxalinyl, carbazolyl, benzocarbazolyl, dibenzocarbazolyl, phenoxazinyl, phenanthridinyl, benzodioxolyl, dihydroacridinyl, benzotriazolphenazinyl, imidazopyridyl, chromenoquinazolinyl, thiochromenoquinazolinyl, dimethylbenzoperimidinyl, indolocarbazolyl, indenocarbazolyl, etc. More specifically, the above heteroaryl may include 1-pyrrolyl, 2-pyrrolyl, 3-pyrrolyl, pyrazinyl, 2-pyridyl, 2-pyrimidinyl, 4-pyrimidinyl, 5-pyrimidinyl, 6-pyrimidinyl, 1,2,3-triazin-4-yl, 1,2,4-triazin-3-yl, 1,3,5-triazin-2-yl, 1-imidazolyl, 2-imidazolyl, 1-pyrazolyl, 1-indolidinyl, 2-indolidinyl, 3-indolidinyl, 5-indolidinyl, 6-indolidinyl, 7-indolidinyl, 8-indolidinyl, 2-imidazopyridyl, 3-imidazopyridyl, 5-imidazopyridyl, 6-imidazopyridyl, 7-imidazopyridyl, 8-imidazopyridyl, 3-pyridyl, 4-pyridyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, azacarbazolyl-1-yl, azacarbazolyl-2-yl, azacarbazolyl-3-yl, azacarbazolyl-4-yl, azacarbazolyl-5-yl, azacarbazolyl-6-yl, azacarbazolyl-7-yl, azacarbazolyl-8-yl, azacarbazolyl-9-yl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-tert-butylpyrrol-4-yl, 3-(2-phenylpropyl)pyrrol-1-yl, 2-methyl-1-indolyl, 4-methyl-1-indolyl, 2-methyl-3-indolyl, 4-methyl-3-indolyl, 2-tert-butyl-1-indolyl, 4-tert-butyl-1-indolyl, 2-tert-butyl-3-indolyl, 4-tert-butyl-3-indolyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-naphtho-[1,2-b]-benzofuranyl, 2-naphtho-[1,2-b]-benzofuranyl, 3-naphtho-[1,2-b]-benzofuranyl, 4-naphtho-[1,2-b]-benzofuranyl, 5-naphtho-[1,2-b]-benzofuranyl, 6-naphtho-[1,2-b]-benzofuranyl, 7-naphtho-[1,2-b]-benzofuranyl, 8-naphtho-[1,2-b]-benzofuranyl, 9-naphtho-[1,2-b]-benzofuranyl, 10-naphtho-[1,2-b]-benzofuranyl, 1-naphtho-[2,3-b]-benzofuranyl, 2-naphtho-[2,3-b]-benzofuranyl, 3-naphtho-[2,3-b]-benzofuranyl, 4-naphtho-[2,3-b]-benzofuranyl, 5-naphtho-[2,3-b]-benzofuranyl, 6-naphtho-[2,3-b]-benzofuranyl, 7-naphtho-[2,3-b]-benzofuranyl, 8-naphtho-[2,3-b]-benzofuranyl, 9-naphtho-[2,3-b]-benzofuranyl, 10-naphtho-[2,3-b]-benzofuranyl, 1-naphtho-[2,1-b]-benzofuranyl, 2-naphtho-[2,1-b]-benzofuranyl, 3-naphtho-[2,1-b]-benzofuranyl, 4-naphtho-[2,1-b]-benzofuranyl, 5-naphtho-[2,1-b]-benzofuranyl, 6-naphtho-[2,1-b]-benzofuranyl, 7-naphtho-[2,1-b]-benzofuranyl, 8-naphtho-[2,1-b]-benzofuranyl, 9-naphtho-[2,1-b]-benzofuranyl, 10-naphtho-[2,1-b]-benzofuranyl, 1-naphtho-[1,2-b]-benzothiophenyl, 2-naphtho-[1,2-b]-benzothiophenyl, 3-naphtho-[1,2-b]-benzothiophenyl, 4-naphtho-[1,2-b]-benzothiophenyl, 5-naphtho-[1,2-b]-benzothiophenyl, 6-naphtho-[1,2-b]-benzothiophenyl, 7-naphtho-[1,2-b]-benzothiophenyl, 8-naphtho-[1,2-b]-benzothiophenyl, 9-naphtho-[1,2-b]-benzothiophenyl, 10-naphtho-[1,2-b]-benzothiophenyl, 1-naphtho-[2,3-b]-benzothiophenyl, 2-naphtho-[2,3-b]-benzothiophenyl, 3-naphtho-[2,3-b]-benzothiophenyl, 4-naphtho-[2,3-b]-benzothiophenyl, 5-naphtho-[2,3-b]-benzothiophenyl, 1-naphtho-[2,1-b]-benzothiophenyl, 2-naphtho-[2,1-b]-benzothiophenyl, 3-naphtho-[2,1-b]-benzothiophenyl, 4-naphtho-[2,1-b]-benzothiophenyl, 5-naphtho-[2,1-b]-benzothiophenyl, 6-naphtho-[2,1-b]-benzothiophenyl, 7-naphtho-[2,1-b]-benzothiophenyl, 8-naphtho-[2,1-b]-benzothiophenyl, 9-naphtho-[2,1-b]-benzothiophenyl, 10-naphtho-[2,1-b]-benzothiophenyl, 2-benzofuro[3,2-d]pyrimidinyl, 6-benzofuro[3,2-d]pyrimidinyl, 7-benzofuro[3,2-d]pyrimidinyl, 8-benzofuro

[3,2-d]pyrimidinyl, 9-benzofuro[3,2-d]pyrimidinyl, 2-benzothio[3,2-d]pyrimidinyl, 6-benzothio[3,2-d]pyrimidinyl, 7-benzothio[3,2-d]pyrimidinyl, 8-benzothio[3,2-d]pyrimidinyl, 9-benzothio[3,2-d]pyrimidinyl, 2-benzofuro[3,2-d]pyrazinyl, 6-benzofuro[3,2-d]pyrazinyl, 7-benzofuro[3,2-d]pyrazinyl, 8-benzofuro[3,2-d]pyrazinyl, 9-benzofuro[3,2-d]pyrazinyl, 2-benzothio[3,2-d]pyrazinyl, 6-benzothio[3,2-d]pyrazinyl, 7-benzothio[3,2-d]pyrazinyl, 8-benzothio[3,2-d]pyrazinyl, 9-benzothio[3,2-d]pyrazinyl, 1-silafluorenyl, 2-silafluorenyl, 3-silafluorenyl, 4-silafluorenyl, 1-germafluorenyl, 2-germafluorenyl, 3-germafluorenyl, 4-germafluorenyl, 1-dibenzoselenophenyl, 2-dibenzoselenophenyl, 3-dibenzoselenophenyl, 4-dibenzoselenophenyl, etc. Furthermore, "halogen" includes F, Cl, Br, and I.

In addition, "ortho (o-)," "meta (m-)," and "para (p-)" are prefixes, which represent the relative positions of substituents respectively. Ortho indicates that two substituents are adjacent to each other, and for example, when two substituents in a benzene derivative occupy positions 1 and 2, it is called an ortho position. Meta indicates that two substituents are at positions 1 and 3, and for example, when two substituents in a benzene derivative occupy positions 1 and 3, it is called a meta position. Para indicates that two substituents are at positions 1 and 4, and for example, when two substituents in a benzene derivative occupy positions 1 and 4, it is called a para position.

Herein, "substituted" in the expression "substituted or unsubstituted" means that a hydrogen atom in a certain functional group is replaced with another atom or another functional group, i.e., a substituent, and also includes that the hydrogen atom is replaced with a group formed by a linkage of two or more substituents of the above substituents. For example, the "group formed by a linkage of two or more substituents" may be pyridine-triazine. That is, pyridine-triazine may be interpreted as a heteroaryl substituent, or as substituents in which two heteroaryl substituents are linked. Herein, the substituent(s) of the substituted alkyl, the substituted aryl, the substituted arylene, the substituted arene, the substituted heteroaryl, the substituted heteroarylene, the substituted heteroarene, and the substituted cycloalkyl, each independently, are at least one selected from the group consisting of deuterium; a halogen; a cyano; a carboxyl; a nitro; a hydroxyl; a phosphineoxide; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (3- to 30-membered)heteroaryl unsubstituted or substituted with a (C6-C30)aryl(s); a (C6-C30)aryl unsubstituted or substituted with a (3- to 30-membered)heteroaryl(s); a tri(C1-C30)alkylsilyl; a tri(C6-C30)arylsilyl; a di(C1-C30)alkyl(C6-C30)arylsilyl; a (C1-C30)alkyldi(C6-C30)arylsilyl; an amino; a mono- or di-(C1-C30)alkylamino; a mono- or di-(C2-C30)alkenylamino; a mono- or di-(C6-C30)arylamino unsubstituted or substituted with a (C1-C30)alkyl(s); a mono- or di-(3- to 30-membered)heteroarylamino; a (C1-C30)alkyl(C2-C30)alkenylamino; a (C1-C30)alkyl(C6-C30)arylamino; a (C1-C30)alkyl(3- to 30-membered)heteroarylamino; a (C2-C30)alkenyl(C6-C30)arylamino; a (C2-C30)alkenyl(3- to 30-membered)heteroarylamino; a (C6-C30)aryl(3- to 30-membered)heteroarylamino; a (C1-C30)alkylcarbonyl; a (C1-C30)alkoxycarbonyl; a (C6-C30)arylcarbonyl; a (C6-C30)arylphosphine; a di(C6-C30)arylboronyl; a di(C1-C30)alkylboronyl; a (C1-C30)alkyl(C6-C30)arylboronyl; a (C6-C30)aryl(C1-C30)alkyl; and a (C1-C30)alkyl(C6-C30)aryl. According to one embodiment of the present disclosure, the substituent(s), each independently, are at least one selected from the group consisting of a (C1-C20)alkyl; and a (C6-C25)aryl unsubstituted or substituted with a (C6-C18)aryl(s). According to another embodiment of the present disclosure, the substituent(s), each independently, are at least one selected from the group consisting of a (C1-C10)alkyl; and a (C6-C25)aryl unsubstituted or substituted with a (C6-C12)aryl(s). For example, the substituent(s) may be at least one selected from the group consisting of a methyl, a phenyl, a naphthyl, a diphenylfluorenyl, and a phenylfluorenyl.

Herein, a ring formed by a linkage of adjacent substituents means that at least two adjacent substituents are linked to or fused with each other to form a substituted or unsubstituted, mono- or polycyclic, (3- to 30-membered) alicyclic or aromatic ring, or the combination thereof. Preferably, the ring may be a substituted or unsubstituted, mono- or polycyclic, (3- to 26-membered) alicyclic or aromatic ring, or the combination thereof. More preferably, the ring may be an unsubstituted mono- or polycyclic, (5- to 20-membered) aromatic ring. In addition, the formed ring may contain at least one heteroatom selected from B, N, O, S, Si, and P, preferably at least one heteroatom selected from N, O, and S. For example, the ring may be a benzene ring, a cyclopentane ring, an indane ring, a fluorene ring, a phenanthrene ring, an indole ring, a xanthene ring, etc.

In the present disclosure, heteroaryl, heteroarylene, and heterocycloalkyl may, each independently, contain at least one heteroatom selected from B, N, O, S, Si, and P. In addition, the heteroatom may be bonded to at least one selected from the group consisting of hydrogen, deuterium, a halogen, a cyano, a substituted or unsubstituted (C1-C30)alkyl, a substituted or unsubstituted (C6-C30)aryl, a substituted or unsubstituted (5- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C2-C30)alkenylamino, a substituted or unsubstituted mono- or di-(C6-C30)arylamino, a substituted or unsubstituted mono- or di-(3- to 30-membered)heteroarylamino, a substituted or unsubstituted (C1-C30)alkyl(C2-C30)alkenylamino, a substituted or unsubstituted (C1-C30)alkyl(C6-C30)arylamino, a substituted or unsubstituted (C1-C30)alkyl(3- to 30-membered)heteroarylamino, a substituted or unsubstituted (C2-C30)alkenyl(C6-C30)arylamino, a substituted or unsubstituted (C2-C30)alkenyl(3- to 30-membered)heteroarylamino, and a substituted or unsubstituted (C6-C30)aryl(3- to 30-membered)heteroarylamino.

In formula 1, Ar represents a substituted or unsubstituted (C1-C30)alkyl, a substituted or unsubstituted (C6-C30)aryl, or a substituted or unsubstituted (3- to 30-membered)heteroaryl.

According to one embodiment of the present disclosure, Ar represents a substituted or unsubstituted (C6-C25)aryl, or a substituted or unsubstituted (5- to 25-membered)heteroaryl. According to another embodiment of the present disclosure. Ar represents a (C6-C18)aryl unsubstituted or substituted with a (C6-C12)aryl(s), or an unsubstituted (5- to 20-membered)heteroaryl. For example, Ar may be a phenyl, a naphthyl, a phenylnaphthyl, a biphenyl, a terphenyl, a dibenzofuranyl, etc. However, if ring A represents a (C6-

C10)arene substituted with one -L$_1$(Ar$_1$)a, in which L$_1$ represents a single bond, a represents an integer of 1, and Ar$_1$ represents

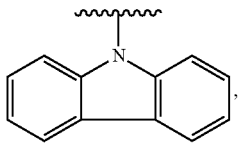 [SMILES: *n1c2ccccc2c2ccccc21]

Ar may not be an unsubstituted phenyl, an unsubstituted naphthyl, or an unsubstituted carbazolyl.

In formula 1, L represents a single bond, a substituted or unsubstituted (C6-C30)arylene, or a substituted or unsubstituted (3- to 30-membered)heteroarylene. According to one embodiment of the present disclosure, L represents a single bond, a substituted or unsubstituted (C6-C25)arylene, or a substituted or unsubstituted (5- to 25-membered)heteroarylene. According to another embodiment of the present disclosure, L represents a single bond.

In formula 1, ring A represents a substituted or unsubstituted (C6-C30)arene, or a substituted or unsubstituted (3- to 30-membered)heteroarene, with the proviso that ring A is substituted with at least one of -L$_1$(Ar$_1$)a and -L$_2$-N(R')(R''). According to one embodiment of the present disclosure, ring A represents a substituted or unsubstituted (C6-C25)arene. According to another embodiment of the present disclosure, ring A represents a (C6-C18)arene unsubstituted or substituted with a (C6-C12)aryl(s). Specifically, ring A may be a benzene, a naphthalene, a phenanthrene, a triphenylene, a pyridine, a quinoline, a quinazoline, a quinoxaline, a dibenzofuran, a dibenzothiophene, or a fluorene. For example, ring A may be a benzene unsubstituted or substituted with a phenyl(s), a naphthalene, a phenanthrene, etc.

a represents an integer of 1 or 2, where if a is an integer of 2, each of Ar$_1$ may be the same or different.

L$_1$ and L$_2$, each independently, represent a single bond, a substituted or unsubstituted (C6-C30)arylene, or a substituted or unsubstituted (3- to 30-membered)heteroarylene. According to one embodiment of the present disclosure, L$_1$ and L$_2$, each independently, represent a single bond, a (C6-C25)arylene unsubstituted or substituted with a (C6-C18)aryl(s), or a substituted or unsubstituted (5- to 25-membered)heteroarylene. According to another embodiment of the present disclosure, L$_1$ represents a single bond, a (C6-C18)arylene unsubstituted or substituted with a (C6-C12) aryl(s), or an unsubstituted (5- to 20-membered)heteroarylene; and L$_2$ represents a single bond. For example, L$_1$ may be a single bond, a phenylene unsubstituted or substituted with a phenyl(s), a naphthylene, a biphenylene, a dibenzofuranylene, a carbazolylene, etc.; and L$_2$ may be a single bond.

Ar$_1$, each independently, represents a substituted or unsubstituted (C6-C30)aryl, or a substituted or unsubstituted (3- to 30-membered)heteroaryl, with the proviso that Ar$_1$ does not include a pyridyl and Ar$_1$ does not represent any one of

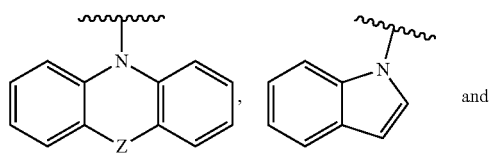

and

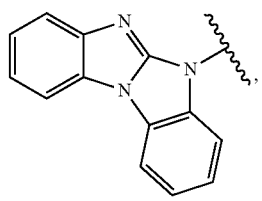

in which Z represents O, S, C(O), N(Rx), or C(Ry)(Rz); Rx represents an unsubstituted phenyl; and Ry and Rz, each independently, represent an unsubstituted methyl. According to one embodiment of the present disclosure, Ar$_1$, each independently, represents a substituted or unsubstituted (5- to 30-membered)heteroaryl. According to another embodiment of the present disclosure, Ar$_1$, each independently, represents a (5- to 26-membered)heteroaryl unsubstituted or substituted with at least one of a (C1-C10)alkyl(s) and a (C6-C12)aryl(s). For example, Ar$_1$, each independently, represents a carbazolyl unsubstituted or substituted with a phenyl(s); a benzocarbazolyl unsubstituted or substituted with a phenyl(s); a dibenzocarbazolyl; a benzothienocarbazolyl; a benzothienobenzocarbazolyl; an indolocarbazolyl substituted with a phenyl(s) or a naphthyl(s); an indenocarbazolyl substituted with a methyl(s); a benzoindolocarbazolyl substituted with a phenyl(s); a dibenzofuranyl unsubstituted or substituted with at least one of a phenyl(s) and a diphenylfluorenyl(s); a benzonaphthofuranyl; a benzofluorenofuranyl substituted with a methyl(s); a benzophenanthrofuranyl; a dibenzothiophenyl; a phenanthrooxazolyl substituted with a phenyl(s); a nitrogen-containing 23-membered heteroaryl unsubstituted or substituted with a phenyl(s); a nitrogen and/or oxygen-containing 26-membered heteroaryl unsubstituted or substituted with a phenyl(s), etc.

According to one embodiment of the present disclosure, Ar$_1$, each independently, may be represented by any one of the following formulas 1-11 to 1-20.

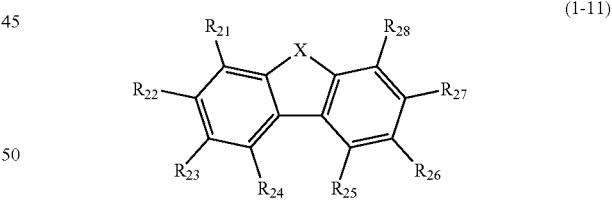

(1-11)

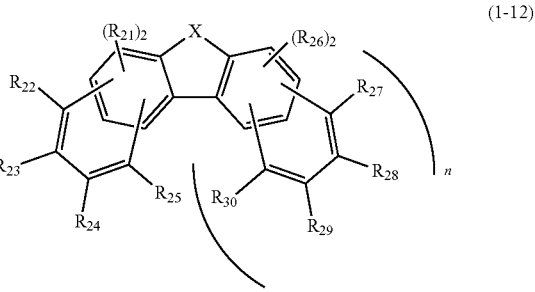

(1-12)

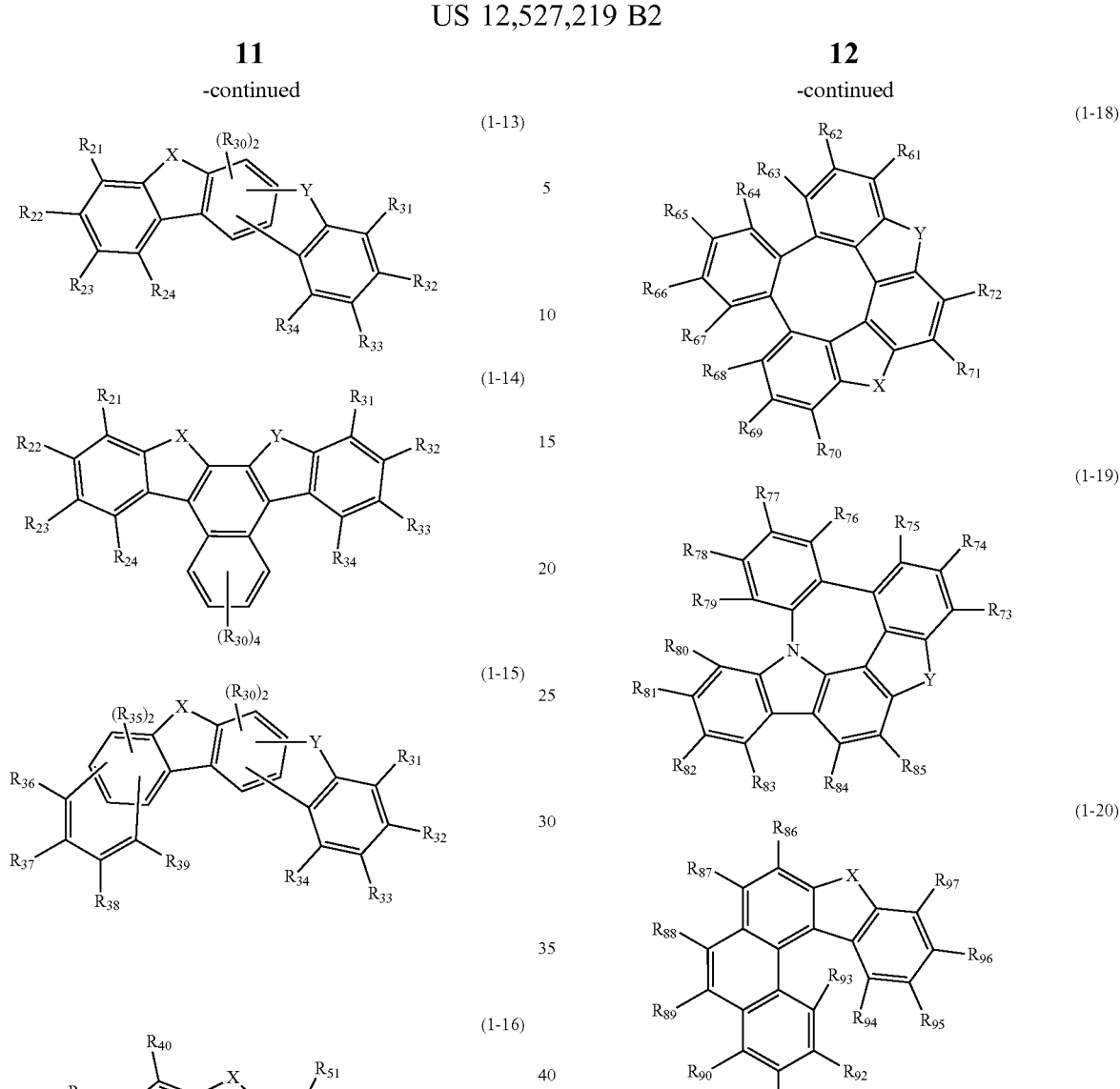

In formulas 1-11 to 1-20, X represents O, S, or N(Ra); Y represents O, S, N(Ra), or C(Rb)(Rc); and n represents an integer of 0 or 1.

In formulas 1-11 to 1-20, $R_{21}$ to $R_{97}$ and Ra to Rc, each independently, represent a position linked to $L_1$, or represent hydrogen, deuterium, a substituted or unsubstituted (C1-C30)alkyl, a substituted or unsubstituted (C6-C30)aryl, or a substituted or unsubstituted (3- to 30-membered)heteroaryl, in which each of two $R_{25}$, each of two $R_{30}$, and each of two $R_{35}$ may be the same or different. According to one embodiment of the present disclosure, $R_{21}$ to $R_{97}$ and Ra to Rc, each independently, represent a position linked to $L_1$, or represent hydrogen, a substituted or unsubstituted (C1-C10)alkyl, or a substituted or unsubstituted (C6-C25)aryl. According to another embodiment of the present disclosure, $R_{21}$ to $R_{97}$, each independently, represent a position linked to $L_1$, or represent hydrogen, or a or (C6-C25)aryl unsubstituted or substituted with a (C6-C20)aryl(s); Ra represents a position linked to $L_1$, or represents an unsubstituted (C6-C18)aryl; and Rb and Rc, each independently, represent an unsubstituted (C1-C10)alkyl. For example, $R_{21}$ to $R_{59}$ and $R_{61}$ to $R_{97}$, each independently, may be a position linked to $L_1$, or may be hydrogen, a phenyl, a diphenylfluorenyl, etc.; $R_{60}$ may be a phenyl, etc.; Ra may be a position linked to $L_1$, or may be a phenyl, a naphthyl, etc.; and Rb and Rc, each independently, may be a methyl, etc.

R' and R", each independently, represent a substituted or unsubstituted (C6-C30)aryl, a substituted or unsubstituted (3- to 30-membered)heteroaryl, or a substituted or unsubstituted (C3-C30)cycloalkyl, with the proviso that any one of R' and R" represents a substituted or unsubstituted (C11-C30)aryl, or a substituted or unsubstituted (3- to 30-membered)heteroaryl. According to one embodiment of the present disclosure, R' and R", each independently, represent a substituted or unsubstituted (C6-C25)aryl, or a substituted or unsubstituted (5- to 25-membered)heteroaryl. According to another embodiment of the present disclosure, R' and R", each independently, represent an unsubstituted (C6-C18) aryl, or a (5- to 25-membered)heteroaryl unsubstituted or substituted with a (C6-C12)aryl(s). According to still another embodiment of the present disclosure, any one of R' and R" represents a substituted or unsubstituted (C18-C30) aryl, or a substituted or unsubstituted (3- to 30-membered) heteroaryl. For example, R' and R", each independently, may be a phenyl, a biphenyl, a chrysenyl, a dibenzofuranyl, a phenanthrooxazolyl substituted with a phenyl(s), a benzophenanthrofuranyl, etc., and any one of R' and R" may be a chrysenyl, a dibenzofuranyl, a phenanthrooxazolyl substituted with a phenyl(s), a benzophenanthrofuranyl, etc.

According to one embodiment of the present disclosure, the formula 1 may be represented by at least one of the following formulas 1-1 to 1-7.

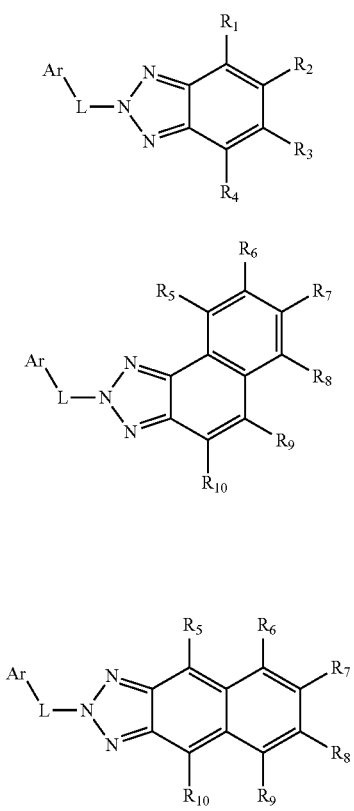

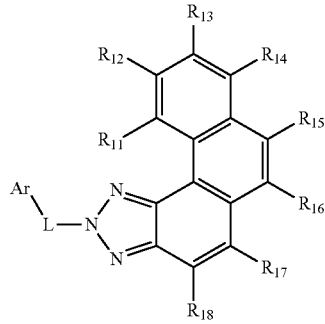

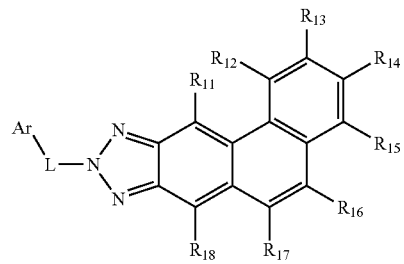

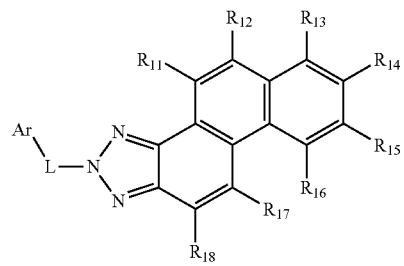

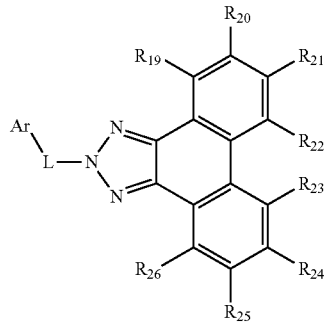

In formulas 1-1 to 1-7, $R_1$ to $R_{26}$, each independently, represent hydrogen, deuterium, a halogen, a cyano, a carboxyl, a nitro, a hydroxyl, a (C1-C30)alkyl, a halo(C1-C30)alkyl, a (C2-C30)alkenyl, a (C2-C30)alkynyl, a (C1-C30)alkoxy, a (C1-C30)alkylthio, a (C3-C30)cycloalkyl; a (C3-C30)cycloalkenyl, a (3- to 7-membered)heterocycloalkyl, a (C6-C30)aryloxy, a (C6-C30)arylthio, a (C6-C30)aryl, a tri(C1-C30)alkylsilyl, a di(C6-C30)arylsilyl, a di(C1-C30)alkyl(C6-C30)arylsilyl, a (C1-C30)alkyldi(C6-C30)arylsilyl, a (C1-C30)alkylcarbonyl, a (C1-C30)alkoxycarbonyl, a (C6-C30)arylcarbonyl, a di(C6-C30)arylboronyl, a di(C1-C30)alkylboronyl, a (C1-C30)alkyl(C6-C30)arylboronyl, a (C6-C30)aryl(C1-C30)alkyl, a (C1-C30)alkyl(C6-C30)aryl, -$L_1(Ar_1)$a, or -$L_2$-N(R')(R"), with the proviso that at least one of $R_1$ to $R_4$ represents -$L_1(Ar_1)$a or -$L_2$-N(R')(R"), at least one of $R_5$ to $R_{10}$ represents -$L_1(Ar_1)$a or -$L_2$-N(R')(R"), at least one of $R_{11}$ to $R_{18}$ represents -$L_1(Ar_1)$a or -$L_2$-N(R')

(R″), and at least one of $R_{19}$ to $R_{26}$ represents $-L_1(Ar_1)a$ or $-L_2-N(R')(R'')$. According to one embodiment of the present disclosure, $R_1$ to $R_{18}$, each independently, represent hydrogen, $-L_1(Ar_1)a$, or $-L_2-N(R')(R'')$, with the proviso that any one or two of $R_1$ to $R_4$ represent $-L_1(Ar_1)a$ or $-L_2-N(R')(R'')$, any one or two of $R_5$ to $R_{10}$ represent $-L_1(Ar_1)a$ or $-L_2-N(R')(R'')$, any one or two of $R_{11}$ to $R_{18}$ represent $-L_1(Ar_1)a$ or $-L_2-N(R')(R'')$, and any one or two of $R_{19}$ to $R_{26}$ represent $-L_1(Ar_1)a$ or $-L_2-N(R')(R'')$.

L, $L_1$, $L_2$, Ar, $Ar_1$, R', R″, and a are as defined in formula 1.

The compound represented by formula 1 may be at least one selected from the following compounds, but is not limited thereto.

C-1

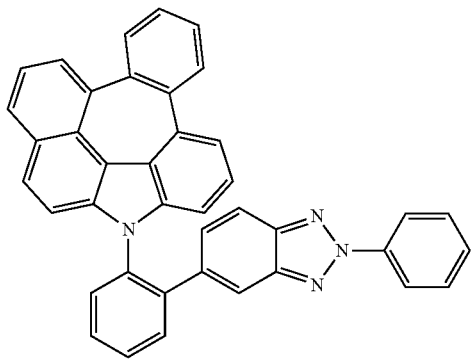

C-2

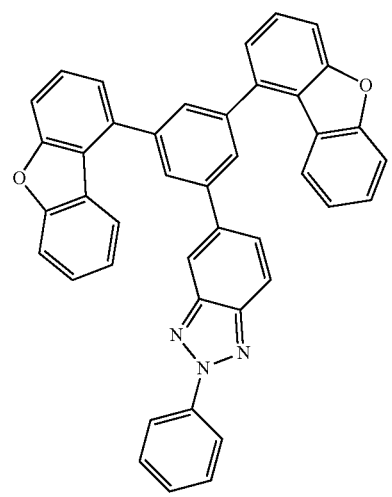

C-3

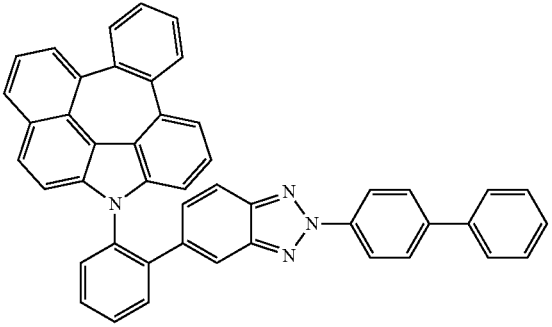

C-4

C-5

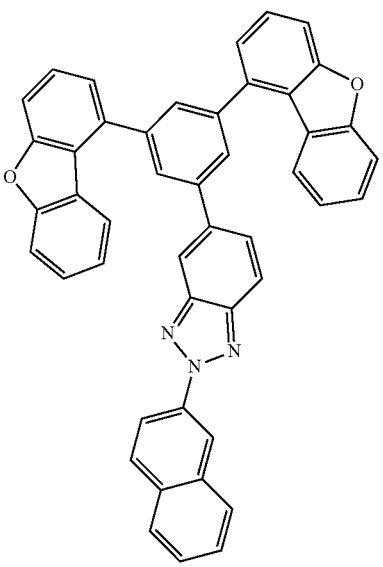

C-6

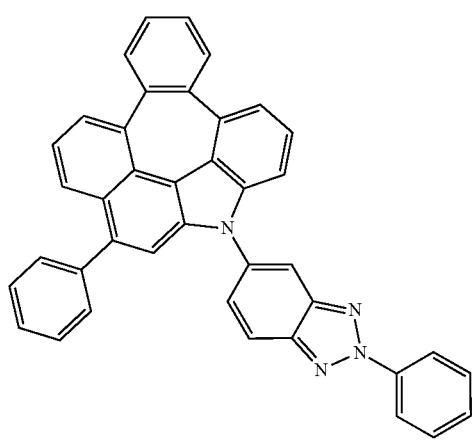

C-7
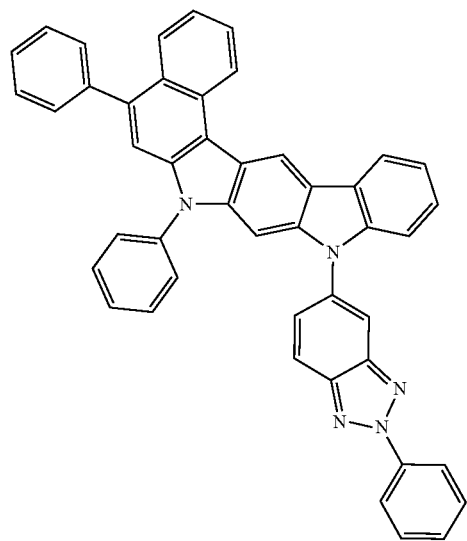
C-8
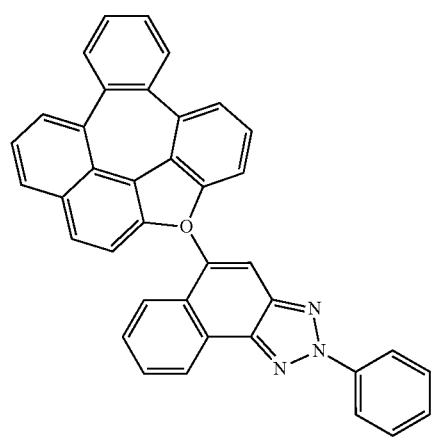
C-9
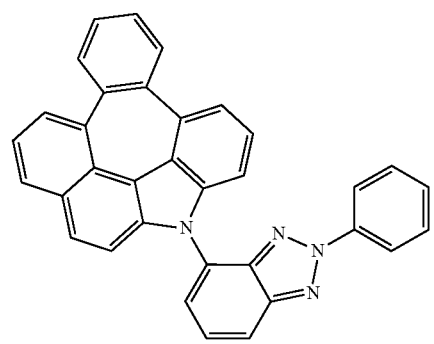
C-10
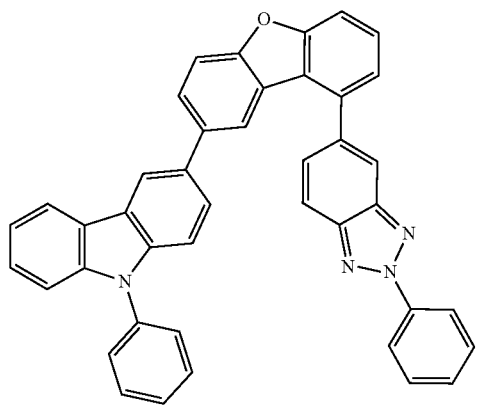
C-11
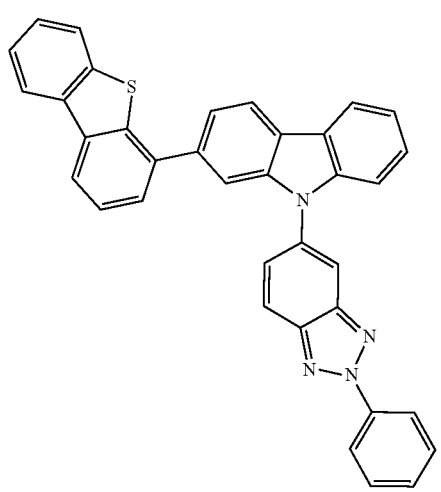
C-12
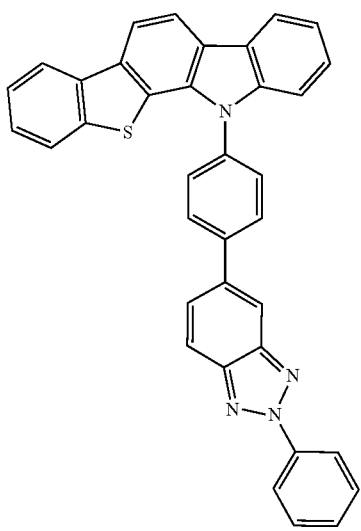

C-13
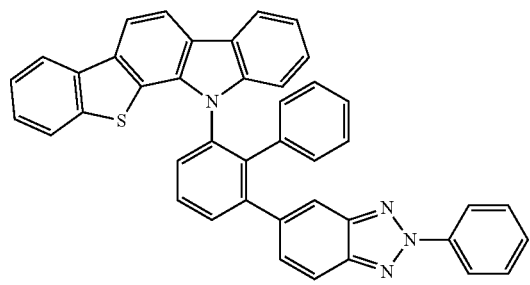
C-14
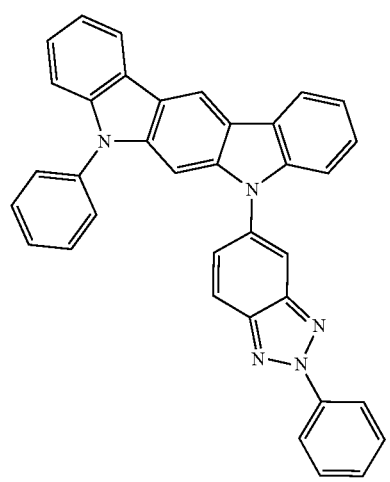
C-15
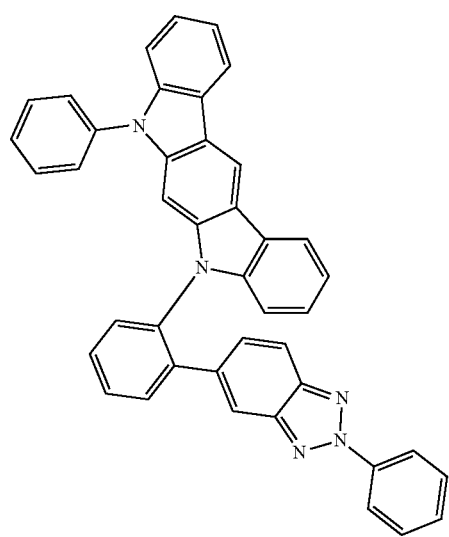
C-16
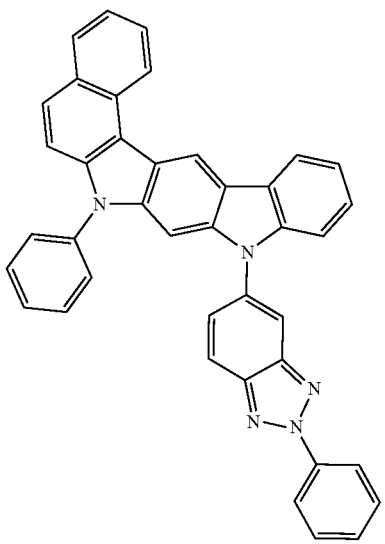
C-17
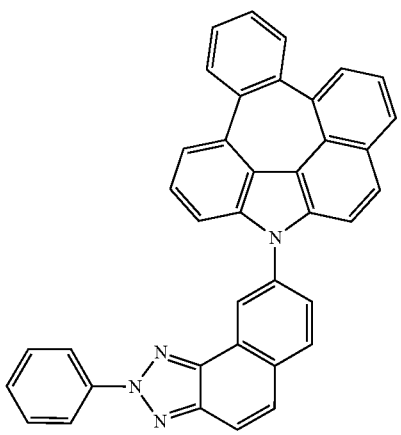
C-18
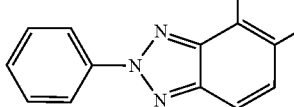

C-19
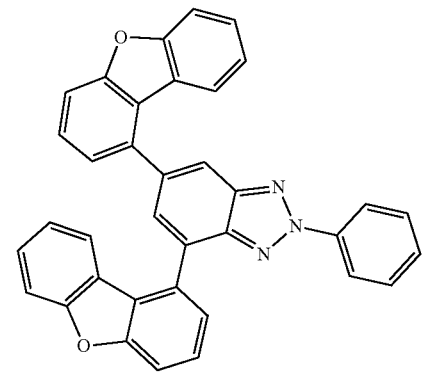
C-20
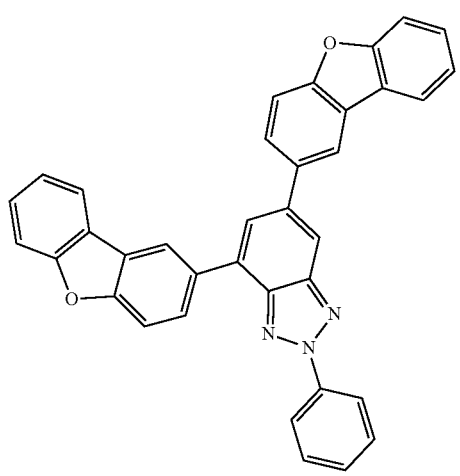
C-21
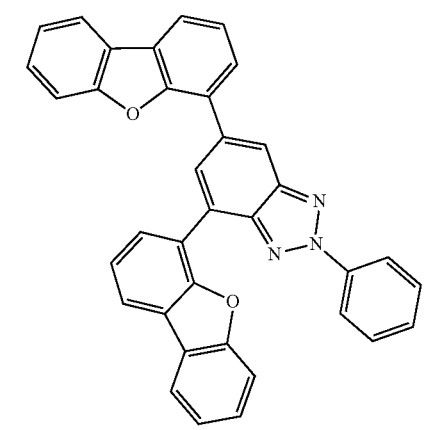
C-22
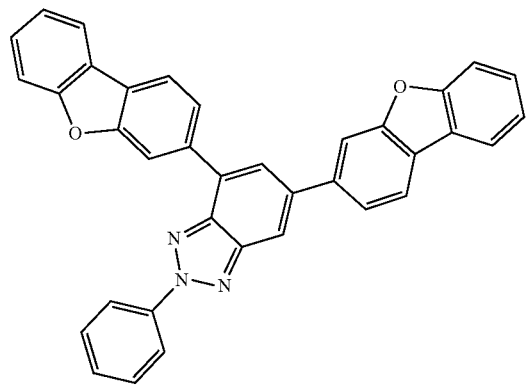
C-23
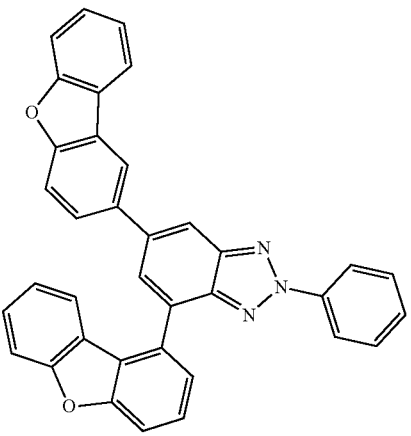
C-24
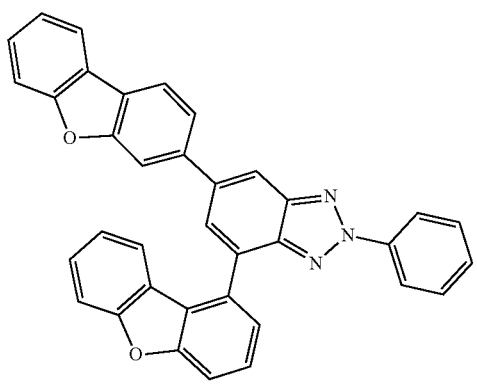
C-25
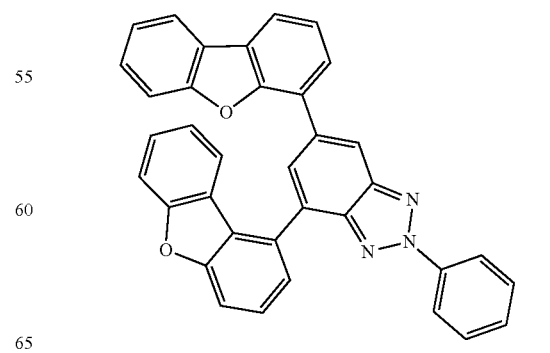

C-26
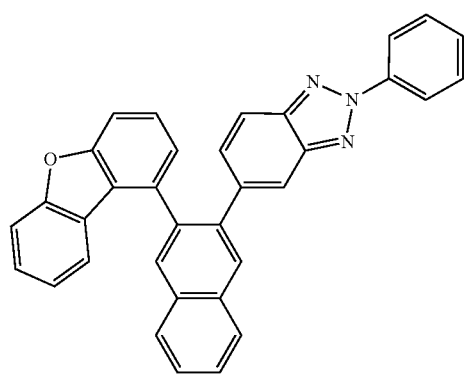
C-27
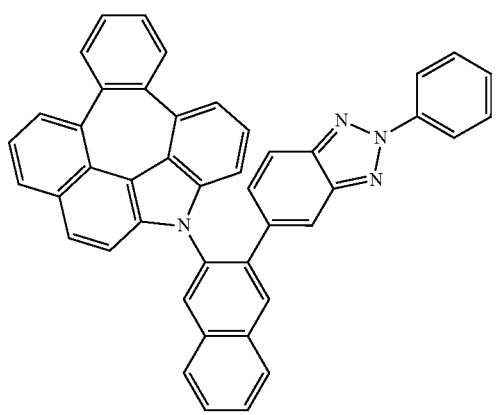
C-28
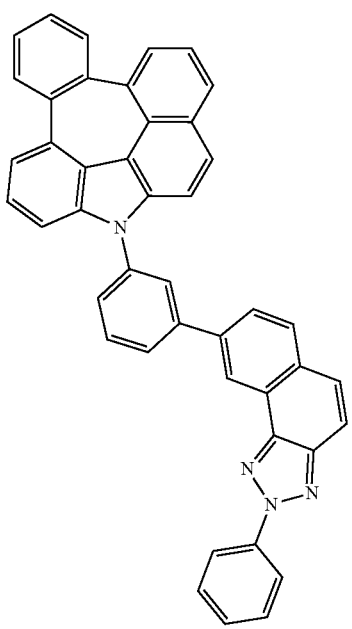
C-29
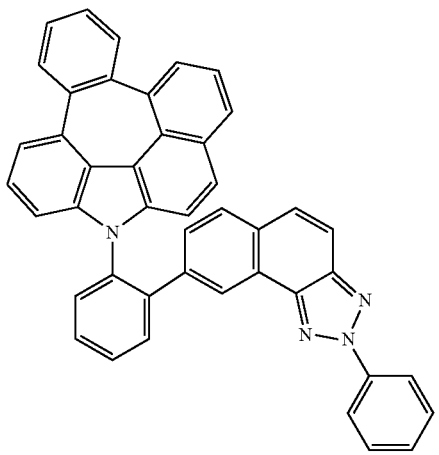
C-30
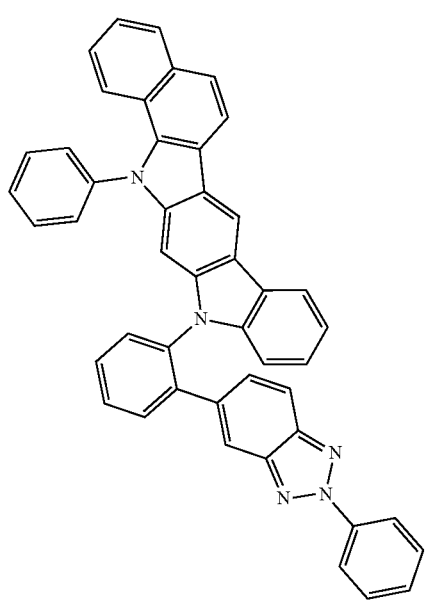
C-31
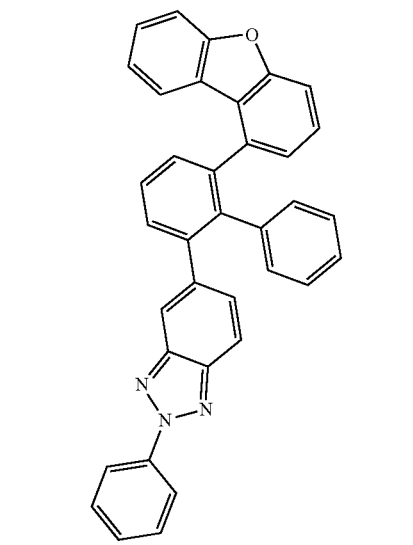

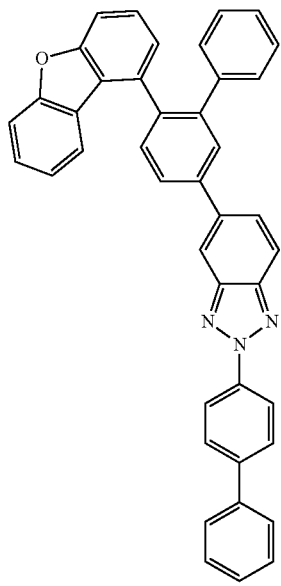
C-32
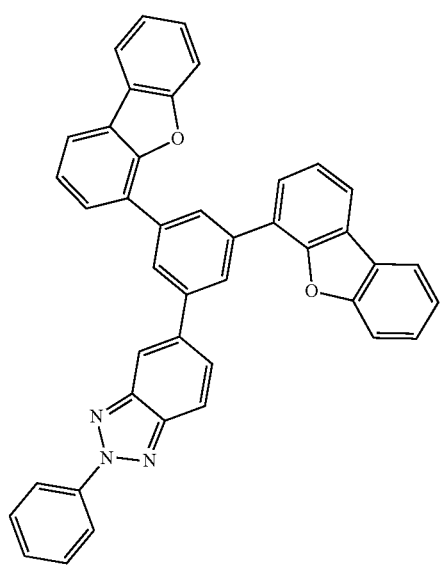
C-33
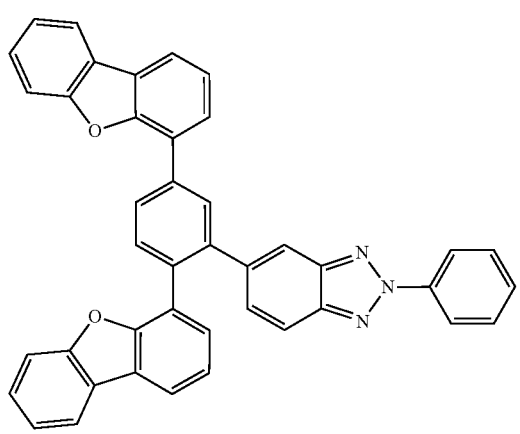
C-34
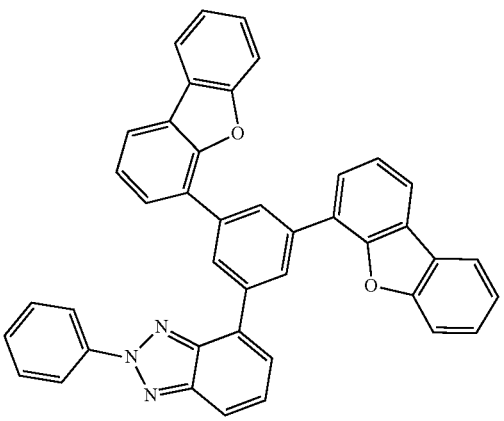
C-35
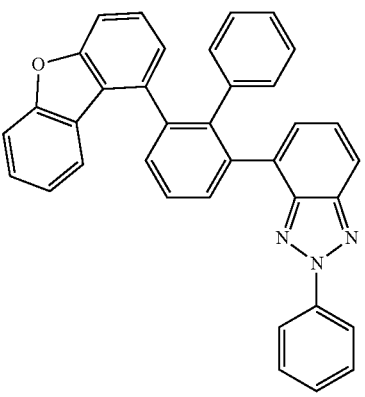
C-36
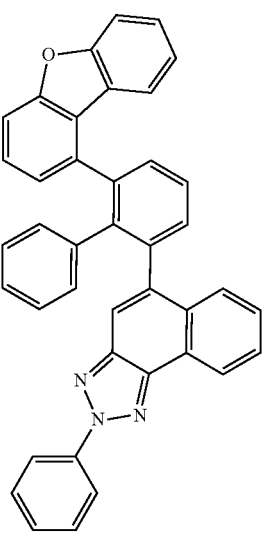
C-37

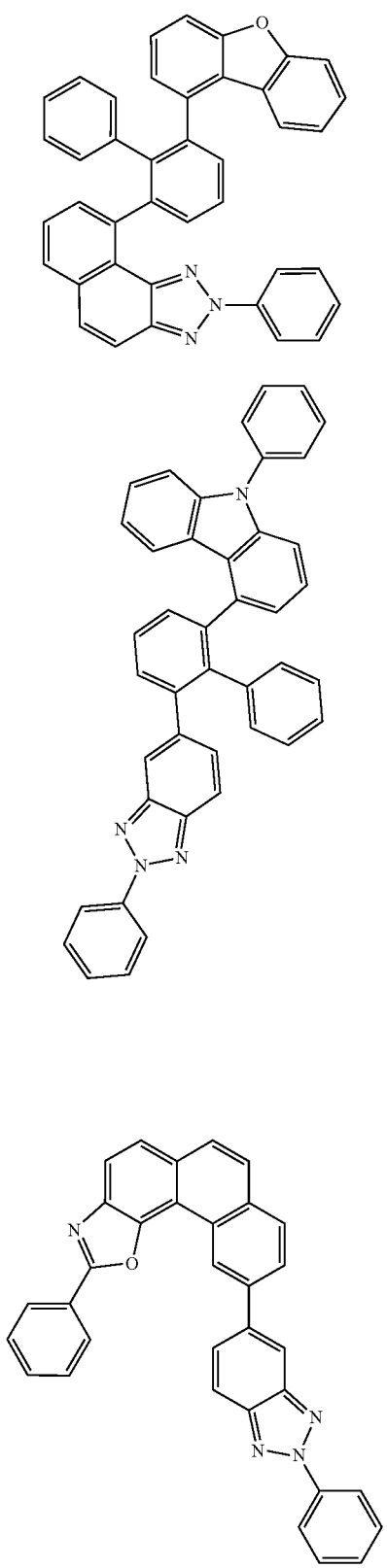
C-38
C-39
C-40
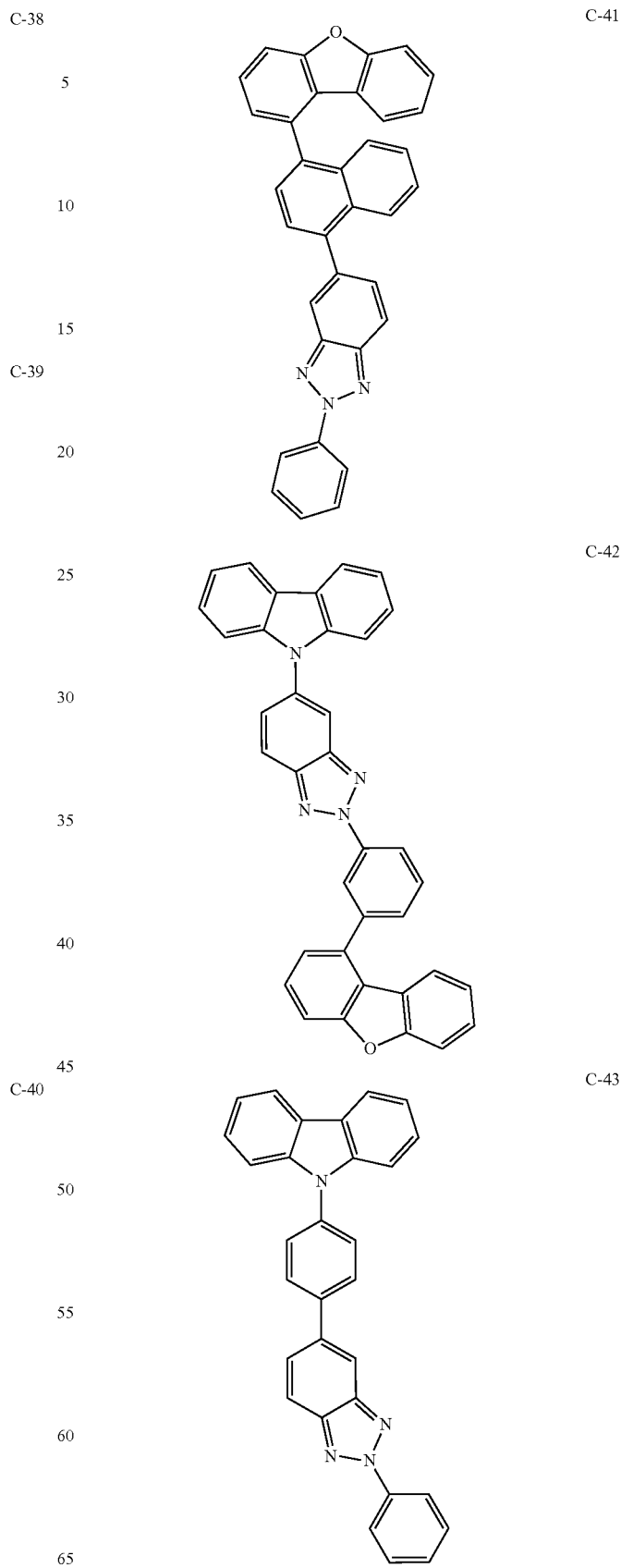
C-41
C-42
C-43

C-44
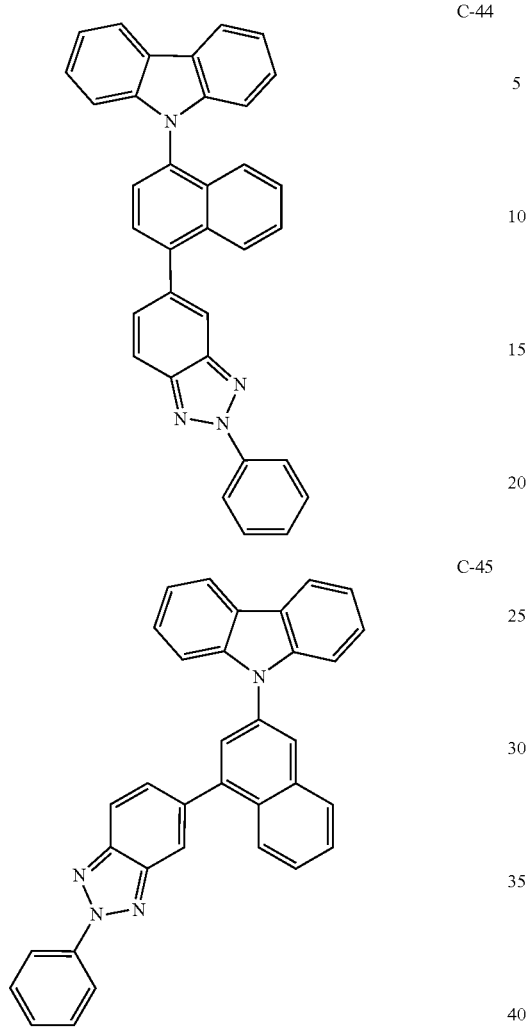
C-45
C-46
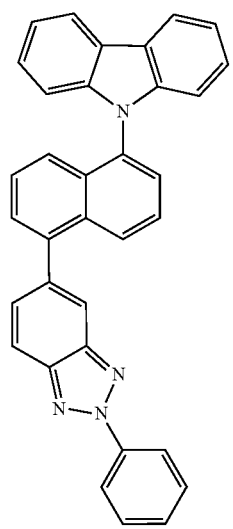
C-47
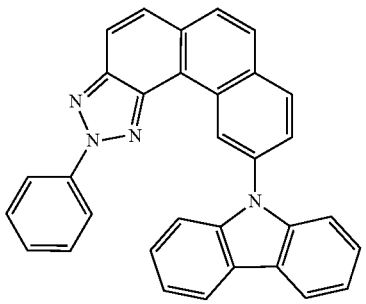
C-48
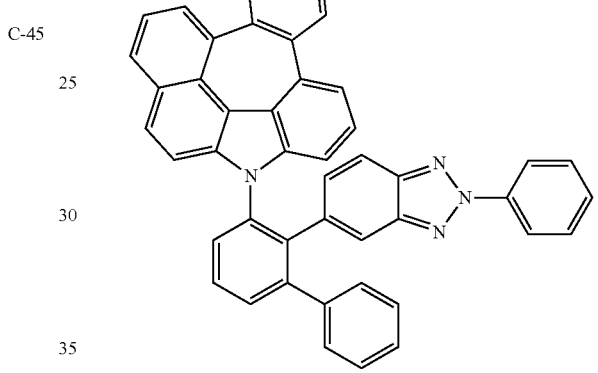
C-49
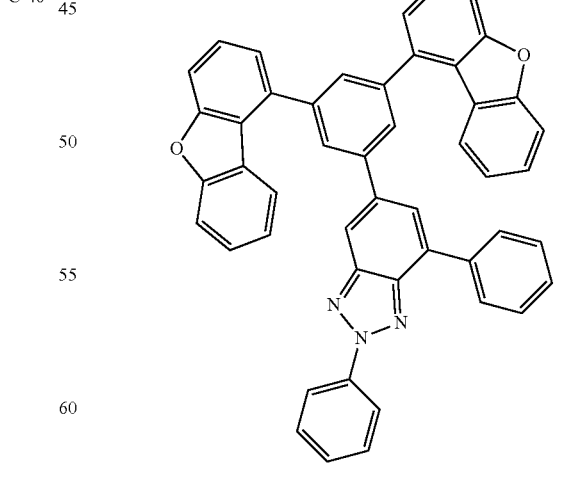

C-50
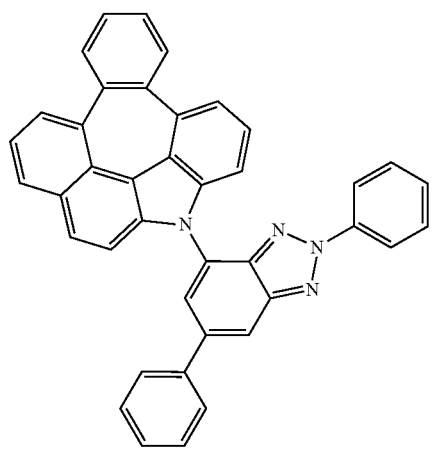
C-51
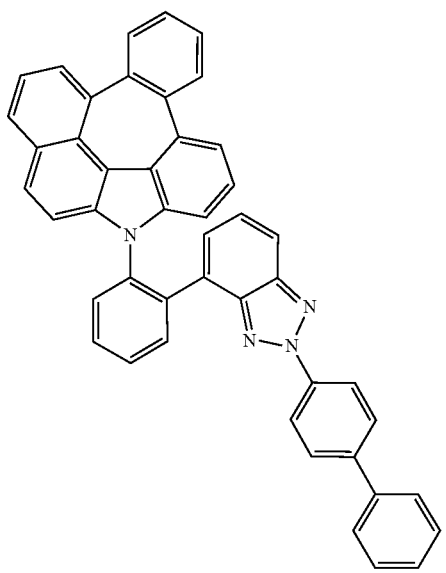
C-52
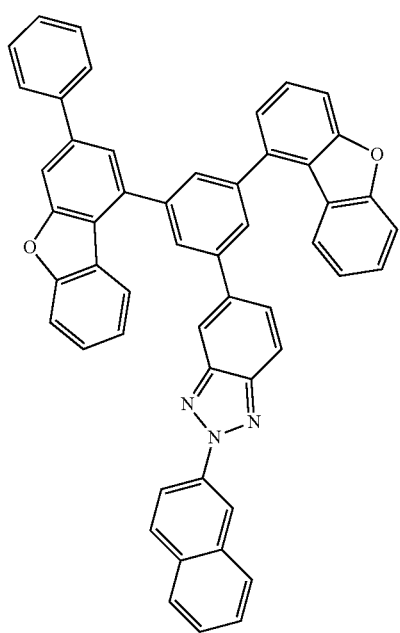
C-53
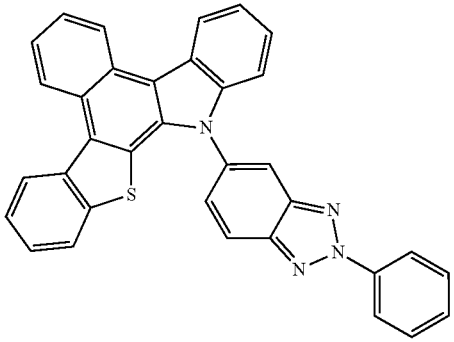
C-54
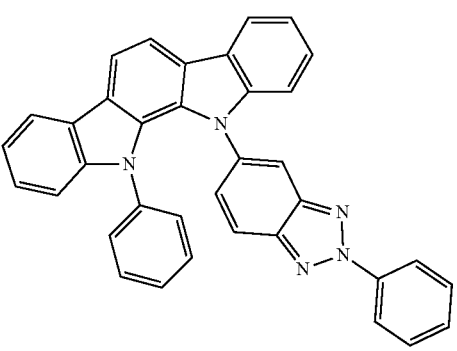
C-55
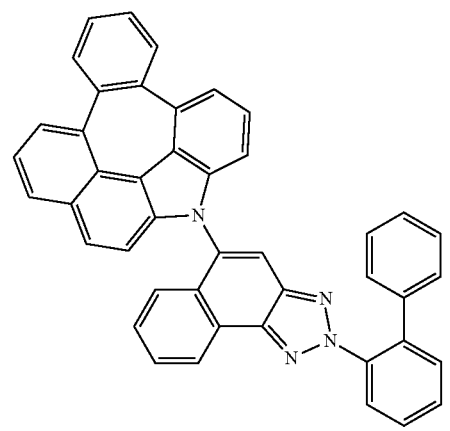
C-56
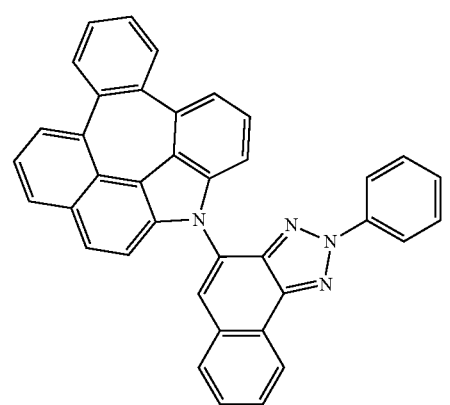

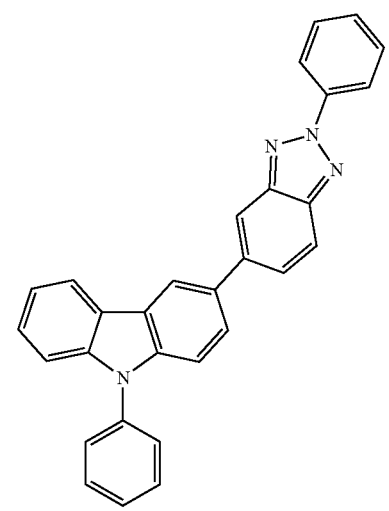
C-57
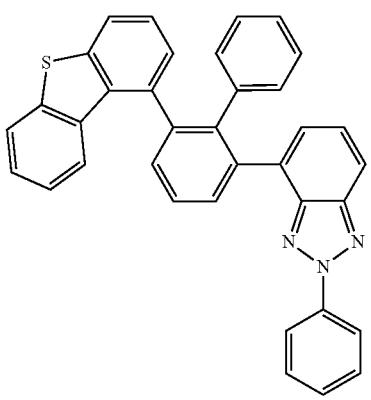
C-60
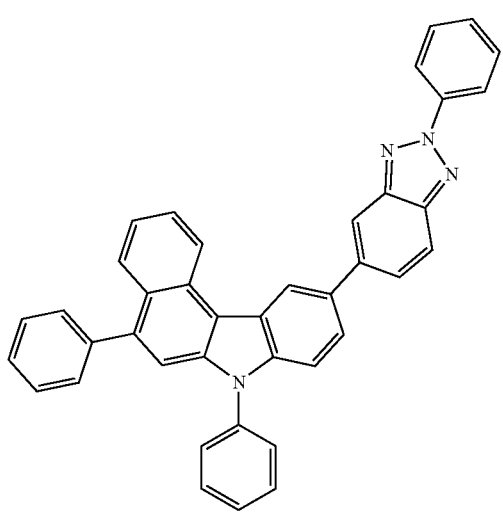
C-58
C-59
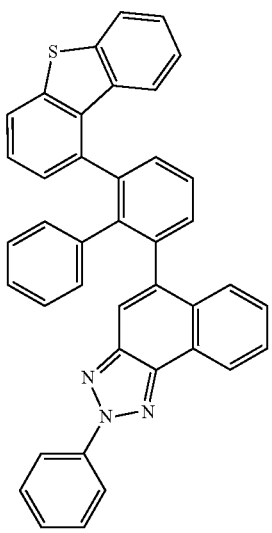
C-61
C-62

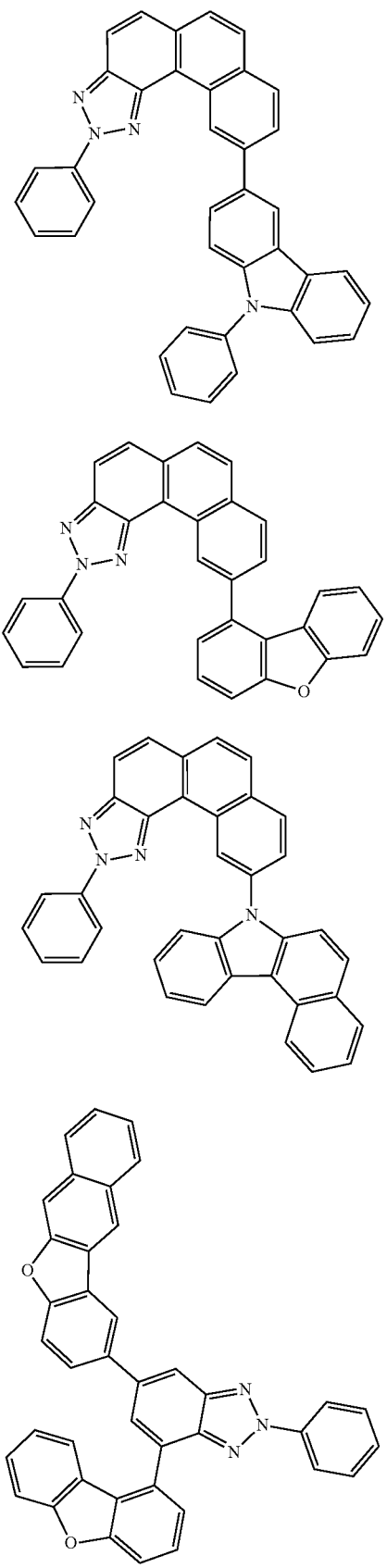
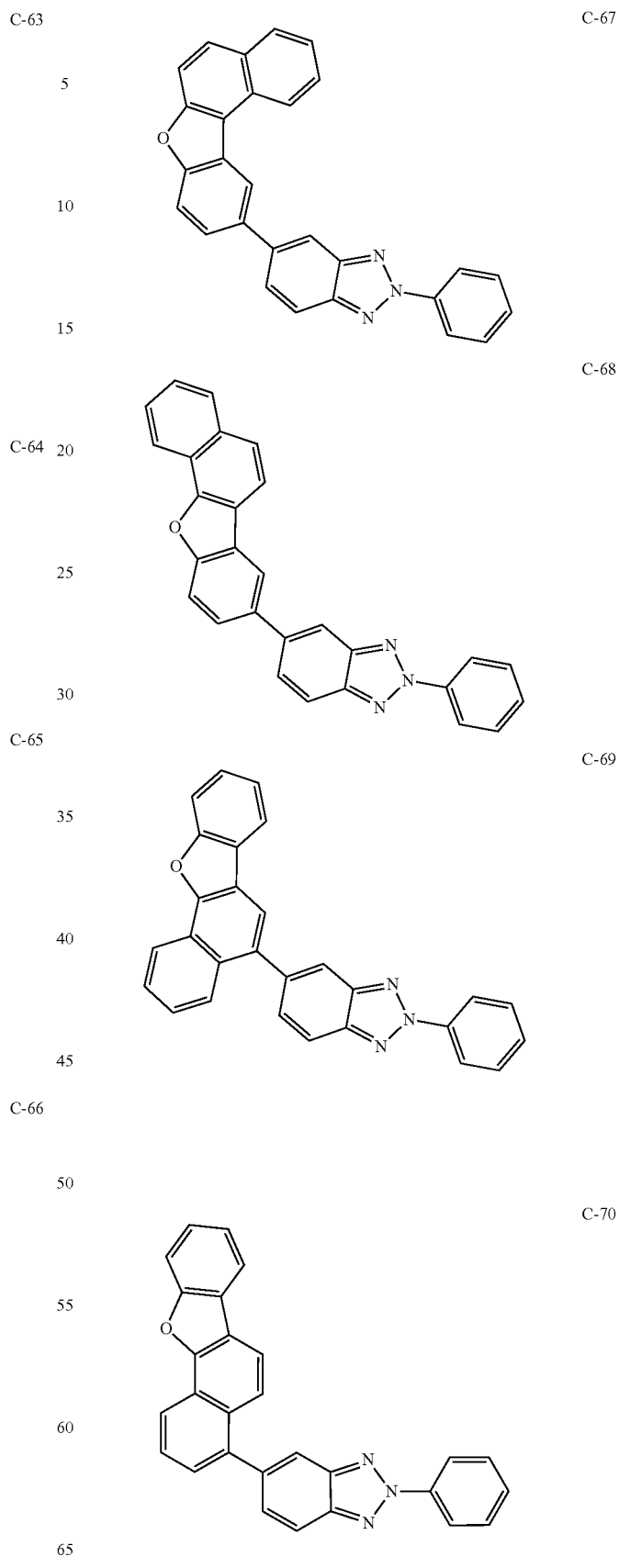

C-71
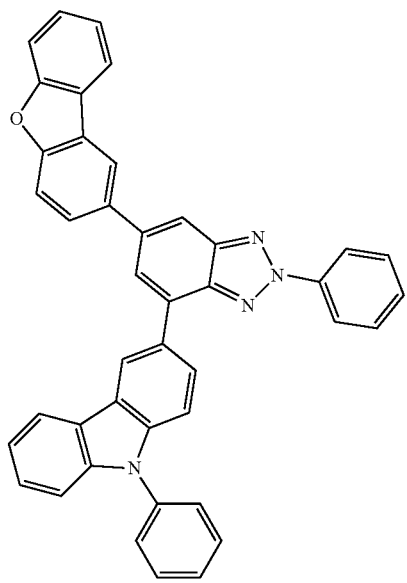
C-72
C-73
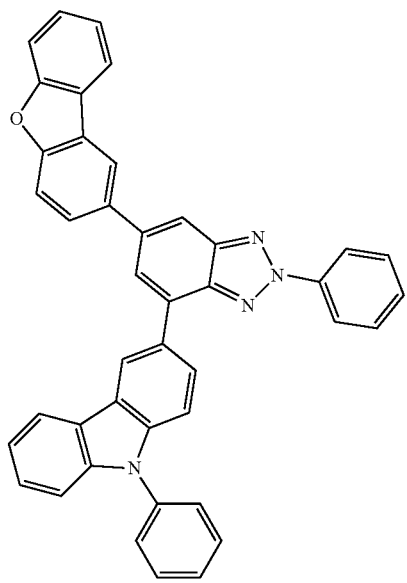
C-74
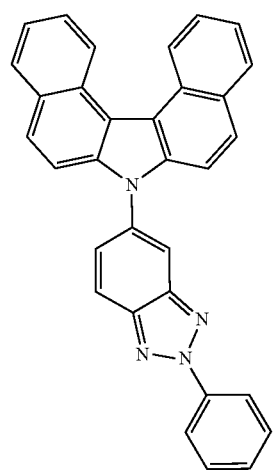
C-75
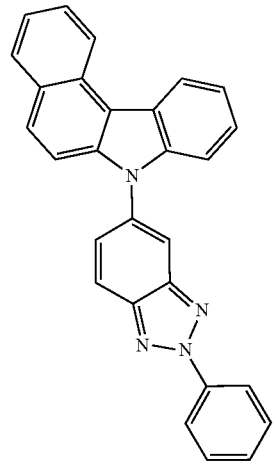

C-76
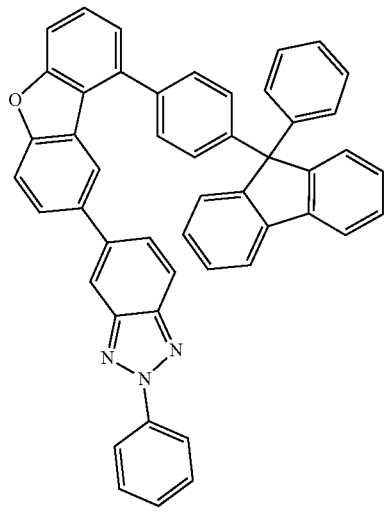
C-77
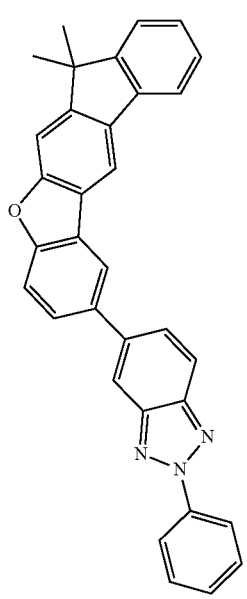
C-78
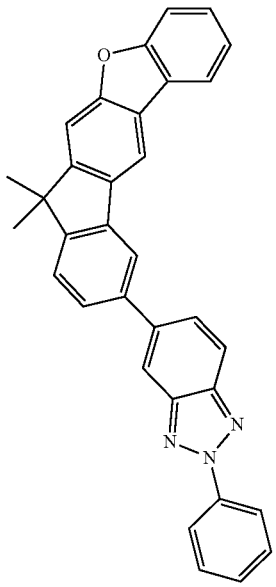
C-79
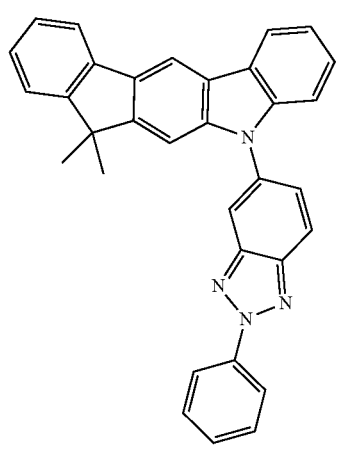
C-80
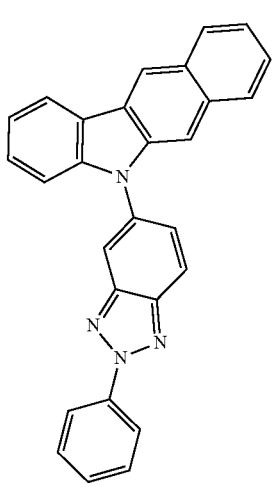

-continued
C-81
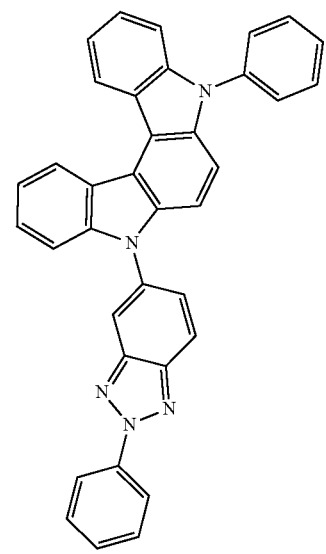
C-82
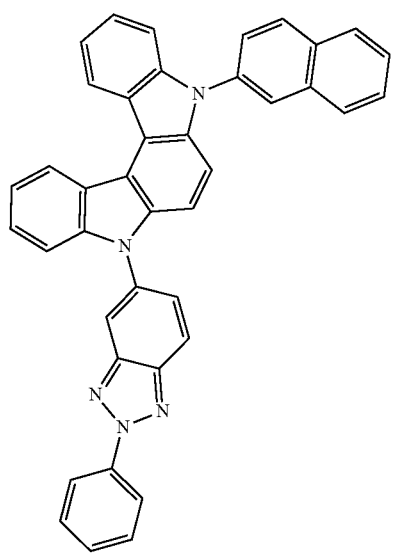
C-83
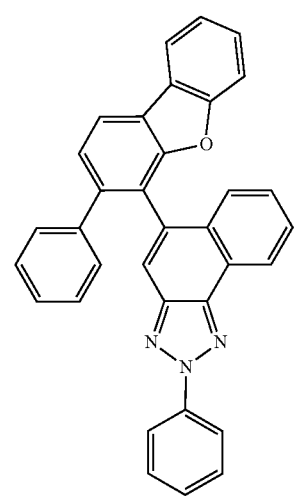
-continued
C-84
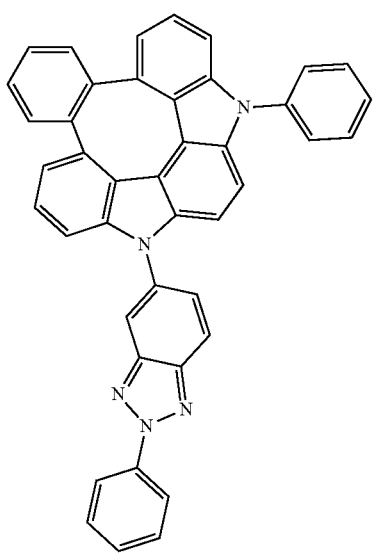
C-85
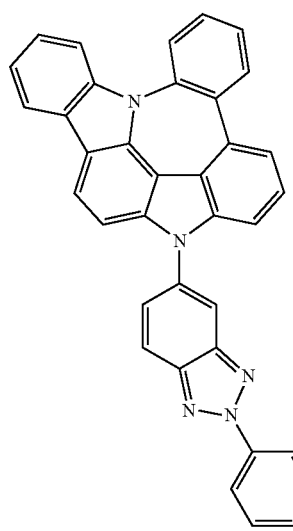
C-86
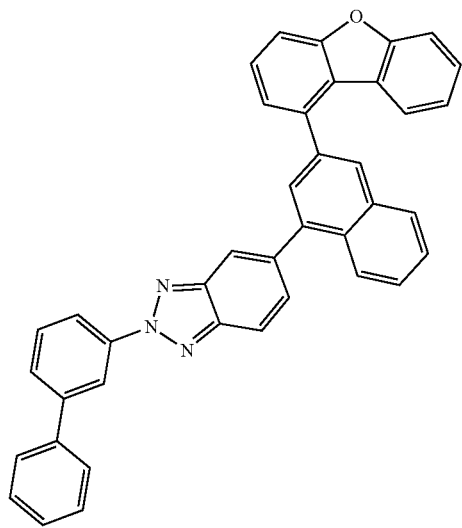

C-87
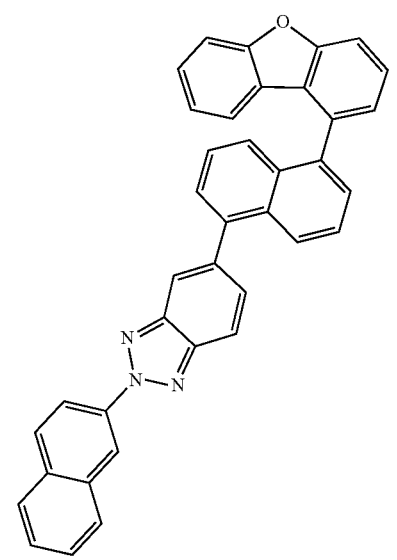
C-87
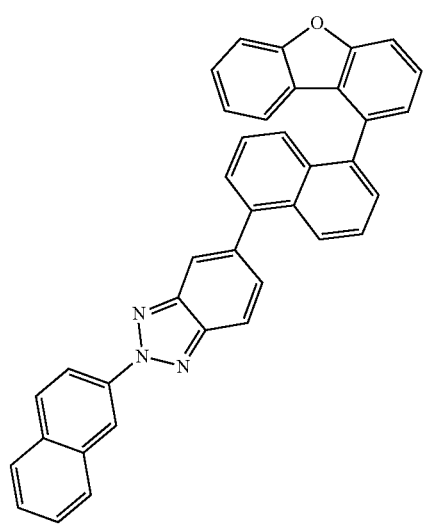
C-88
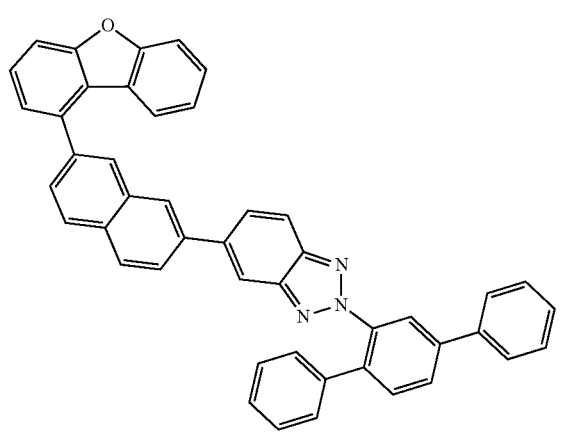
C-89
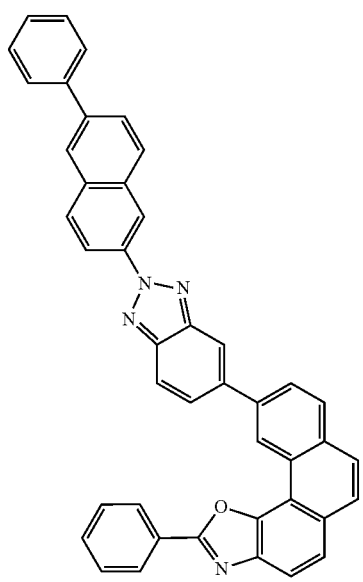
C-90
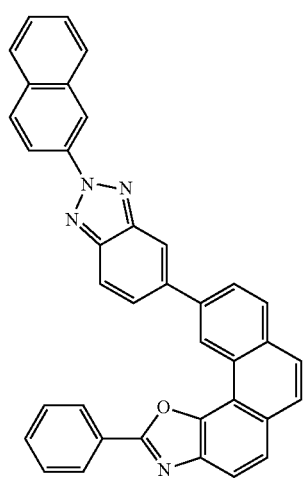
C-91
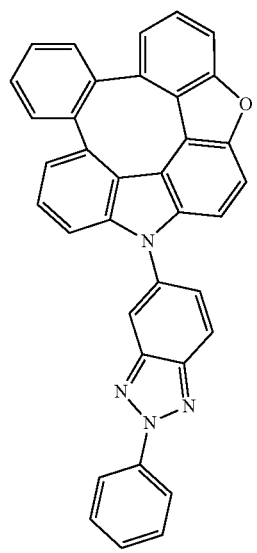

C-92
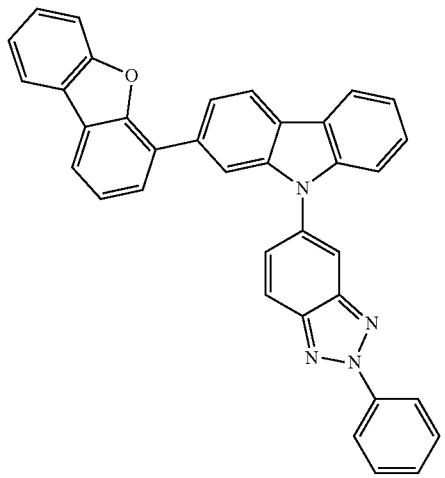
C-93
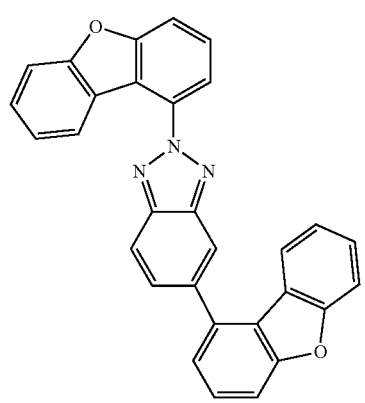
C-94
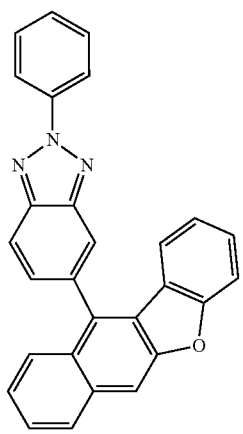
C-95
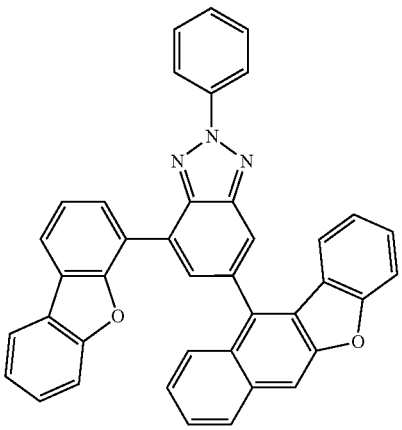
C-96
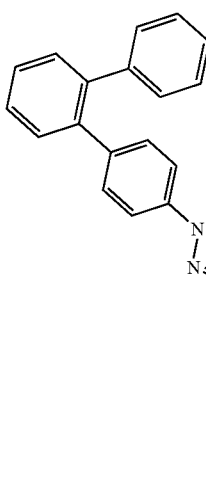
C-97
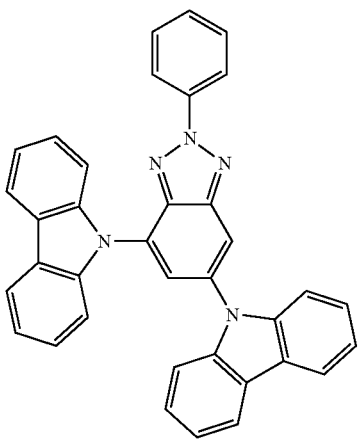

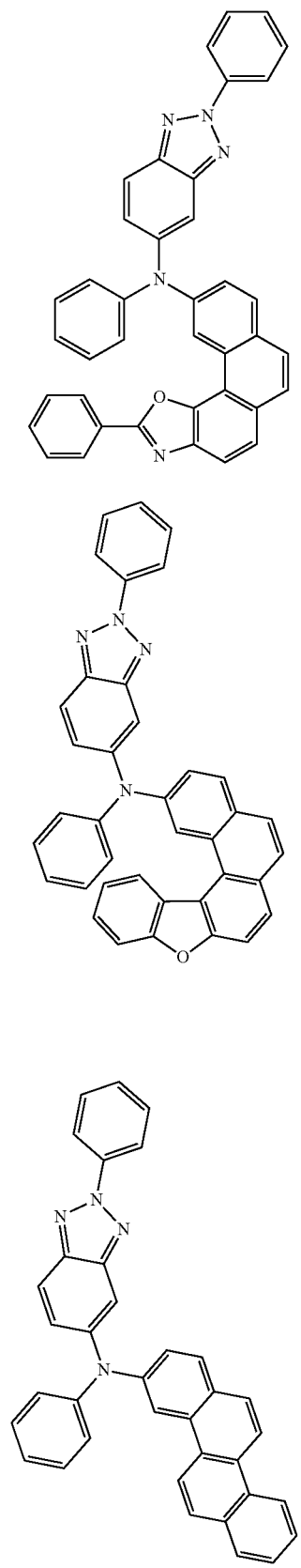
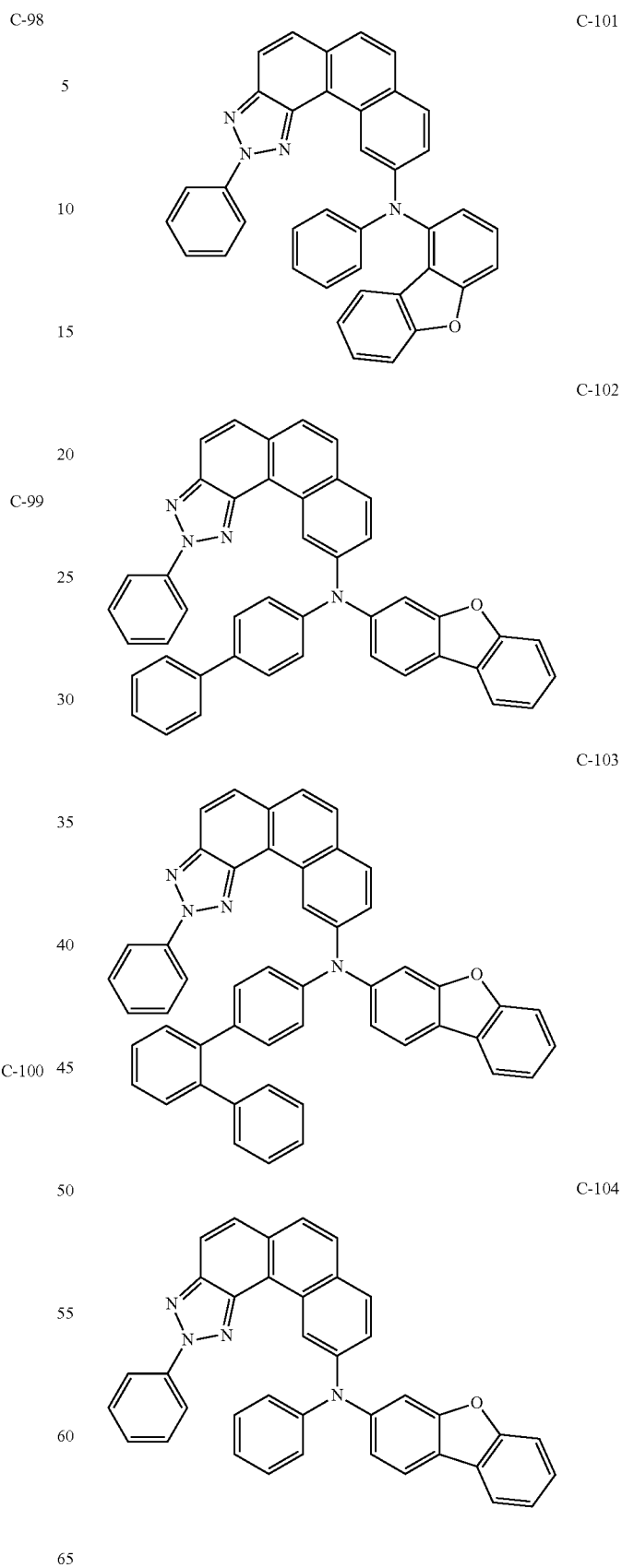

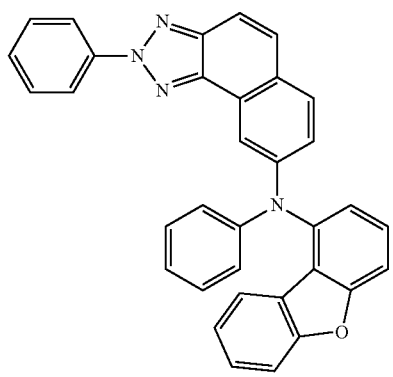
C-105
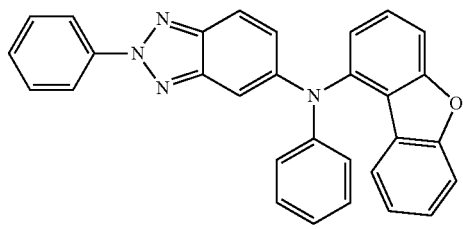
C-109
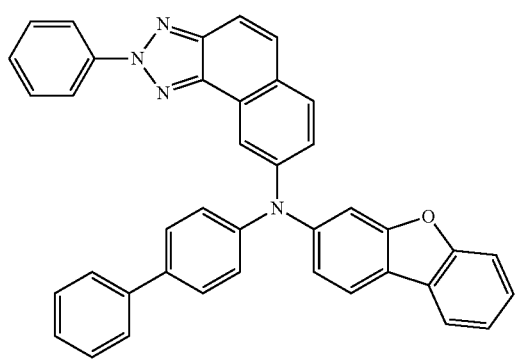
C-106
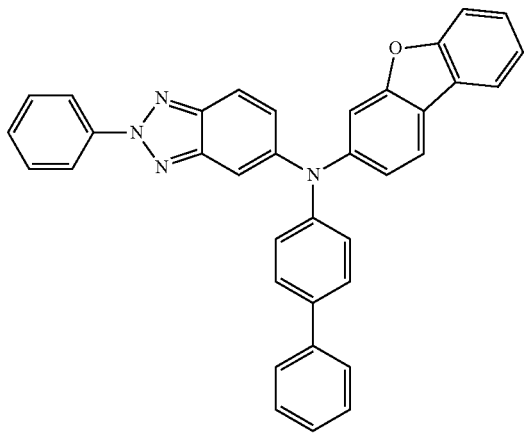
C-110
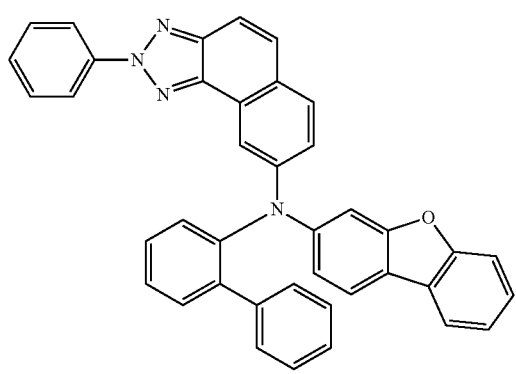
C-107
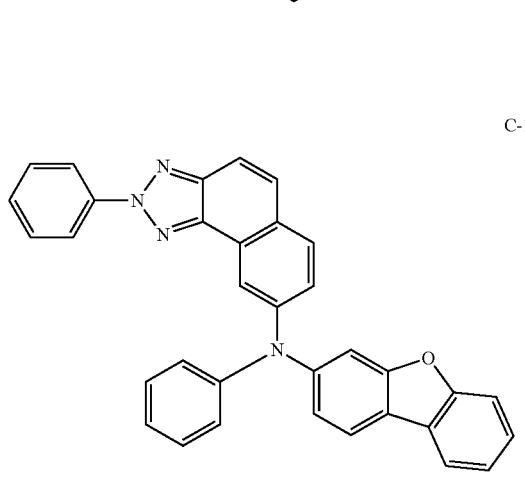
C-108
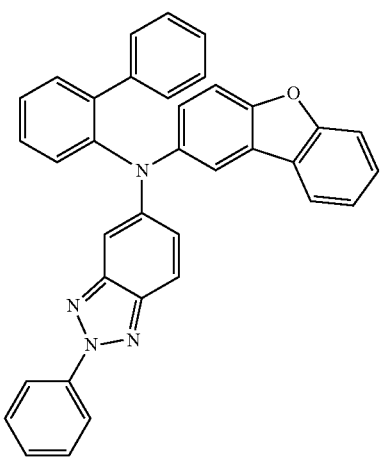
C-111

C-112
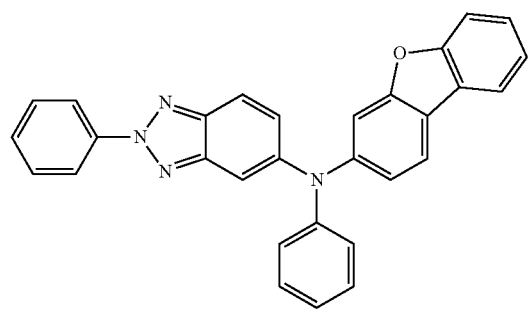
C-114
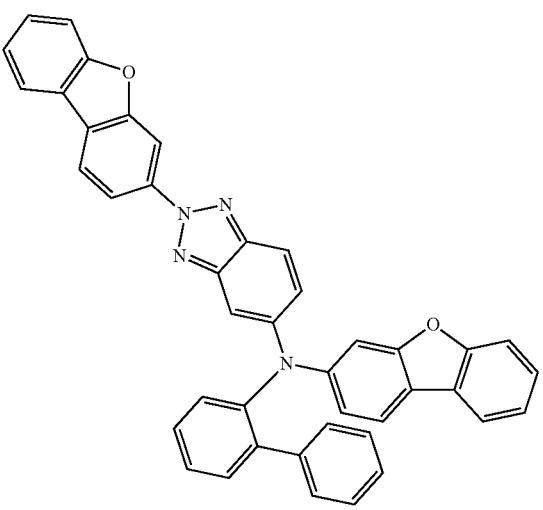
C-113
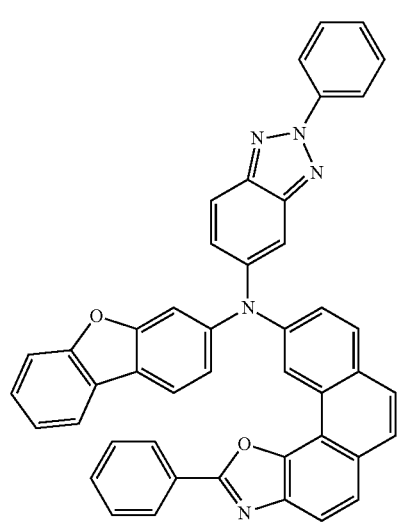
C-115
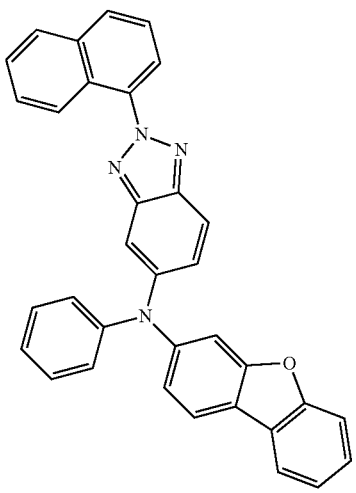
The compound represented by formula 1 according to the present disclosure may be produced by a synthetic method known to one skilled in the art, and for example, according to the following reaction scheme 1, but is not limited thereto.

[Reaction Scheme 1]

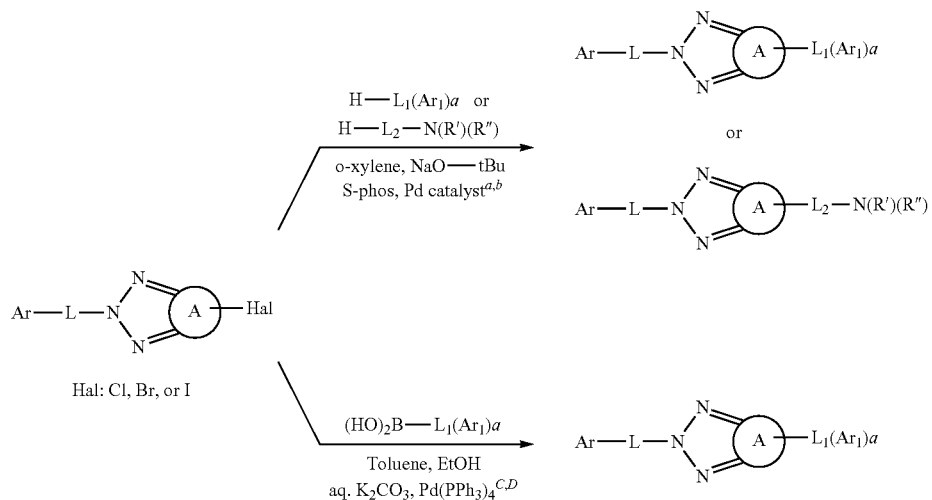

[a] Buchwald-Hartwig Cross Coupling Reaction
[b] J. Org. Chem., 2006, 71, 6522-6529.
[c] Suzuki reaction
[d] Tetrahedron Letters. 40 (27): 4947-4949.

In reaction scheme 1, each of the substituents is as defined in formula 1.

Although illustrative synthesis examples of the compound represented by formula are described above, one skilled in the art will be able to readily understand that all of them are based on a Buchwald-Hartwig cross-coupling reaction, an N-arylation reaction, a H-mont-mediated etherification reaction, a Miyaura borylation reaction, a Suzuki cross-coupling reaction, an Intramolecular acid-induced cyclization reaction, a Pd(II)-catalyzed oxidative cyclization reaction, a Grignard reaction, a Heck reaction, a Cyclic Dehydration reaction, an $SN_1$ substitution reaction, an $SN_2$ substitution reaction, and a Phosphine-mediated reductive cyclization reaction, etc., and the reactions above proceed even when substituents which are defined in formula 1 above, but are not specified in the specific synthesis examples, are bonded.

The dopant comprised in the organic electroluminescent device of the present disclosure may be at least one phosphorescent or fluorescent dopant, and is preferably a phosphorescent dopant. The phosphorescent dopant material applied to the organic electroluminescent device of the present disclosure is not particularity limited, but may be preferably selected from the metallated complex compounds of iridium (Ir), osmium (Os), copper (Cu), and platinum (Pt), more preferably selected from ortho-metallated complex compounds of iridium (Ir), osmium (Os), copper (Cu), and platinum (Pt), and even more preferably ortho-metallated iridium complex compounds.

The dopant comprised in the organic electroluminescent device of the present disclosure may comprise a compound represented by the following formula 101, but is not limited thereto.

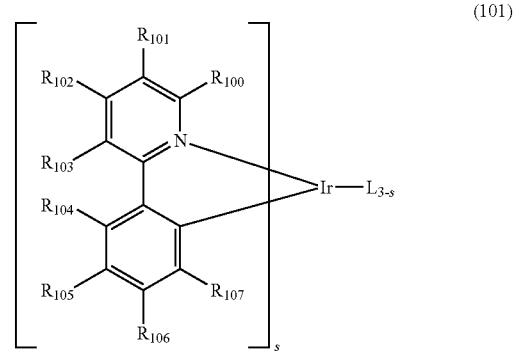

(101)

In formula 101,

L is selected from the following structures 1 to 3:

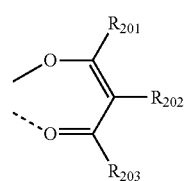

[Structure 1]

[Structure 2]

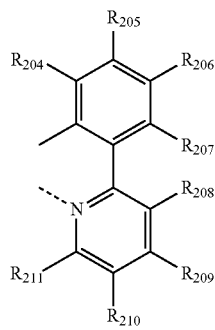

[Structure 3]

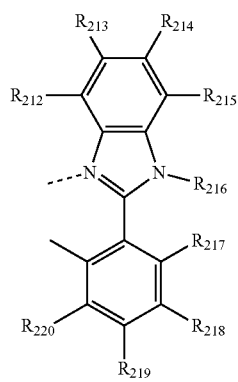

R$_{100}$ to R$_{103}$, each independently, represent hydrogen, deuterium, a halogen, a (C1-C30)alkyl unsubstituted or substituted with deuterium and/or a halogen(s), a substituted or unsubstituted (C3-C30)cycloalkyl, a substituted or unsubstituted (C6-C30)aryl, a cyano, a substituted or unsubstituted (3- to 30-membered)heteroaryl, or a substituted or unsubstituted (C1-C30)alkoxy; or at least two adjacent ones of R$_{100}$ to R$_{103}$ may be linked to each other to form a ring(s), e.g., a substituted or unsubstituted, quinoline, benzofuropyridine, benzothienopyridine, indenopyridine, benzofuroquinoline, benzothienoquinoline, or indenoquinoline, together with pyridine;

R$_{104}$ to R$_{107}$, each independently, represent hydrogen, deuterium, a halogen, a (C1-C30)alkyl unsubstituted or substituted with deuterium and/or a halogen(s), a substituted or unsubstituted (C3-C30)cycloalkyl, a substituted or unsubstituted (C6-C30)aryl, a substituted or unsubstituted (3- to 30-membered)heteroaryl, a cyano, or a substituted or unsubstituted (C1-C30)alkoxy; or at least two adjacent ones of R$_{104}$ to R$_{107}$ may be linked to each other to form a ring(s), e.g., a substituted or unsubstituted, naphthalene, fluorene, dibenzothiophene, dibenzofuran, indenopyridine, benzofuropyridine, or benzothienopyridine, together with benzene;

R$_{201}$ to R$_{220}$, each independently, represent hydrogen, deuterium, a halogen, a (C1-C30)alkyl unsubstituted or substituted with deuterium and/or a halogen(s), a substituted or unsubstituted (C3-C30)cycloalkyl, or a substituted or unsubstituted (C6-C30)aryl; or at least two adjacent ones of R$_{201}$ to R$_{220}$ may be linked to each other to form a substituted or unsubstituted ring(s); and s represents an integer of 1 to 3.

The specific examples of the dopant compound are as follows, but are not limited thereto.

D-1

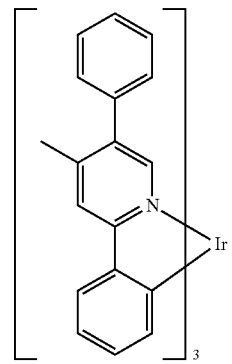

D-2

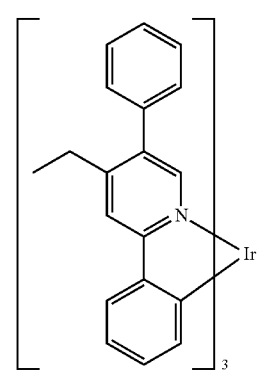

D-3

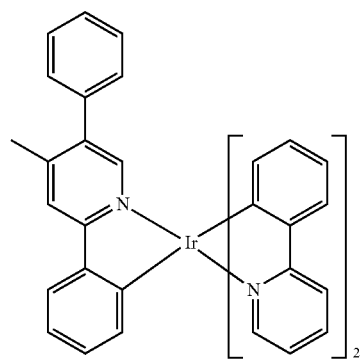

D-4

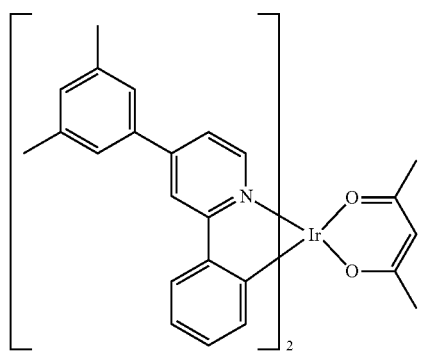

D-5
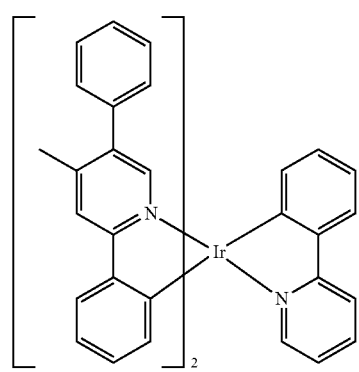
D-6
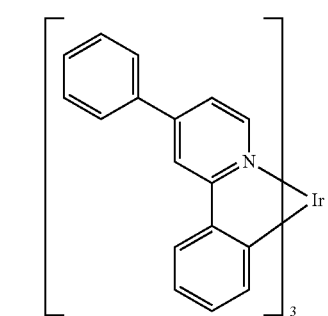
D-7
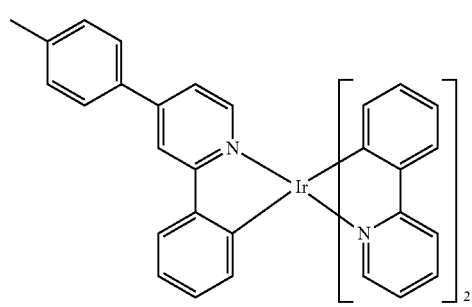
D-8
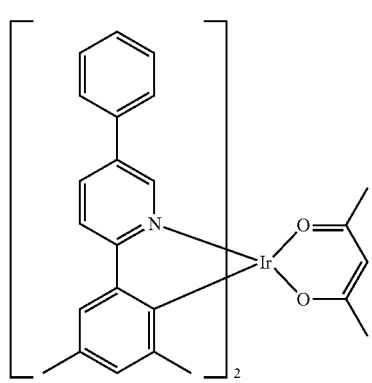
D-9
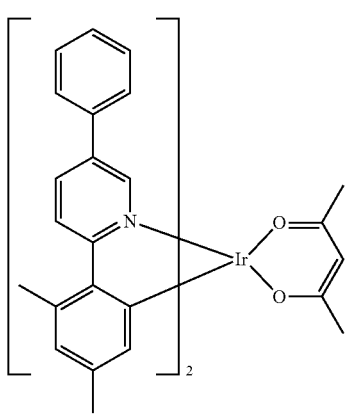
D-10
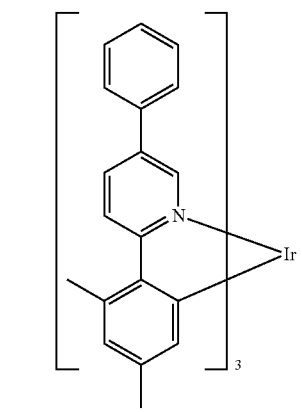
D-11
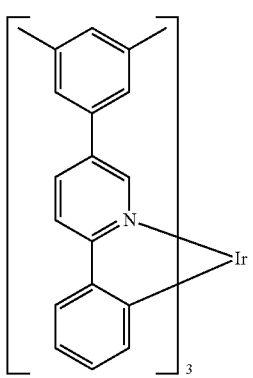
D-12

D-13
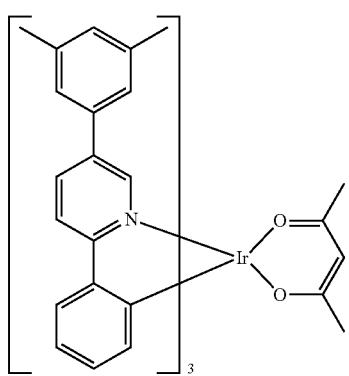
D-14
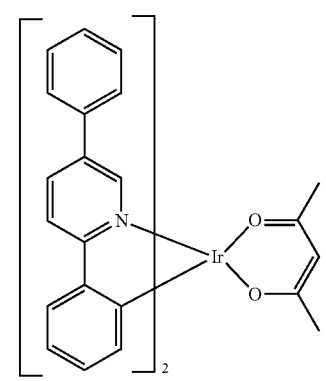
D-15
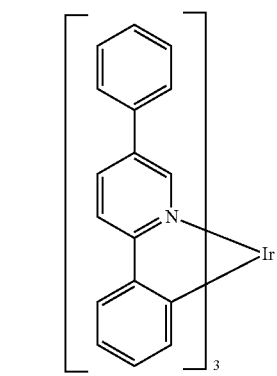
D-16
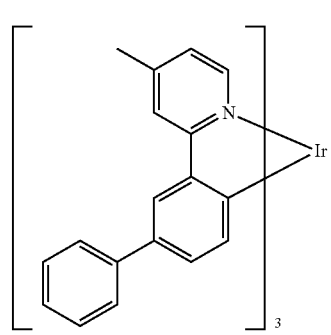
D-17
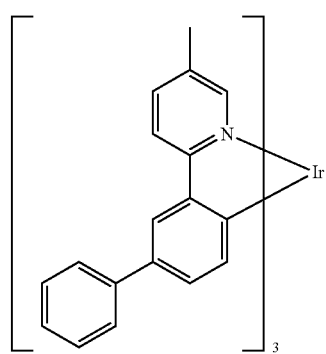
D-18
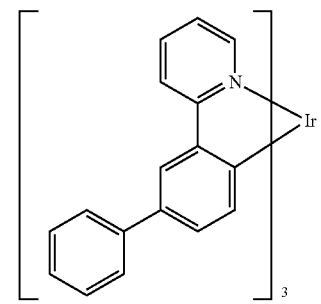
D-19
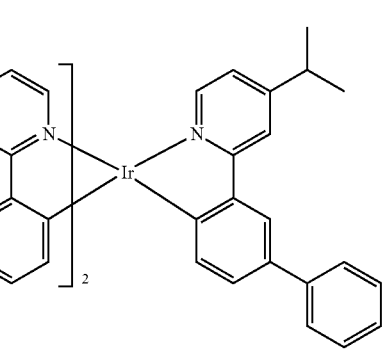
D-20
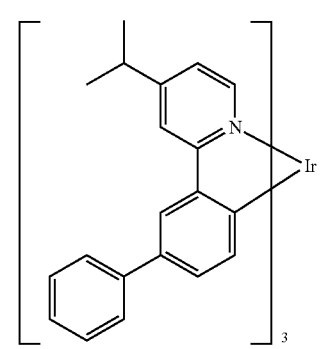

D-21
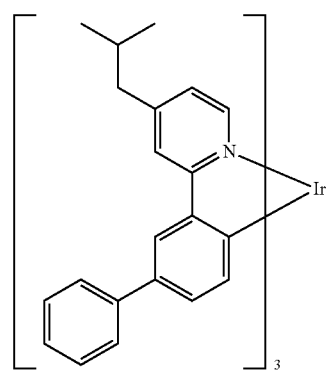
D-22
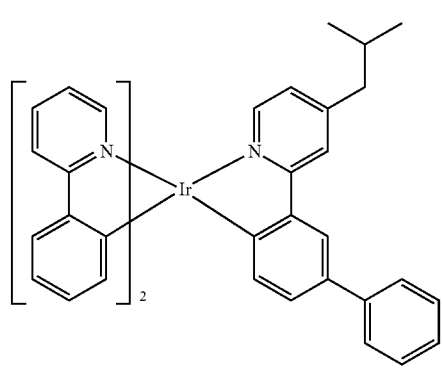
D-23
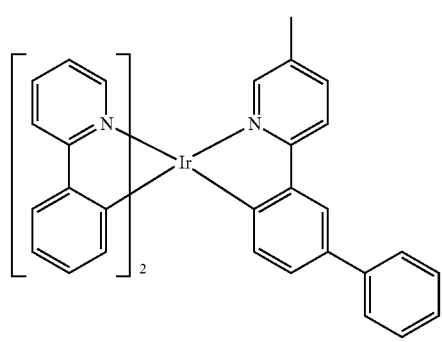
D-24
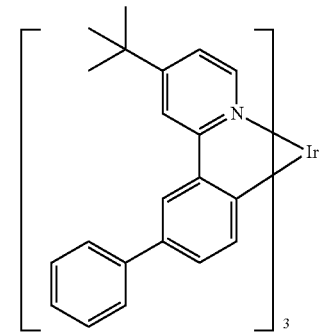
D-25
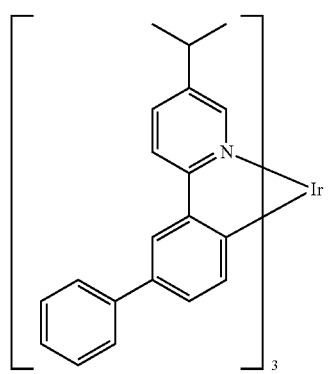
D-26
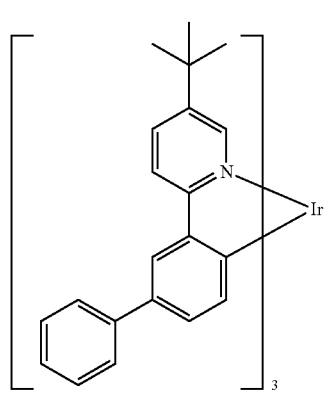
D-27
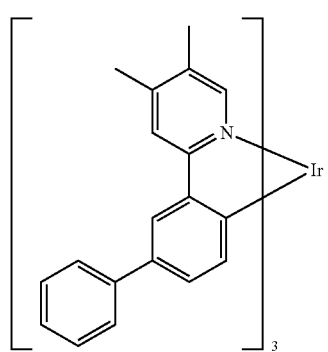
D-28
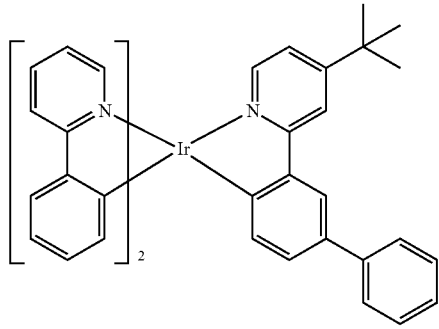

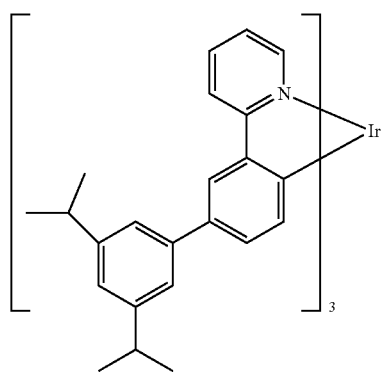
D-29
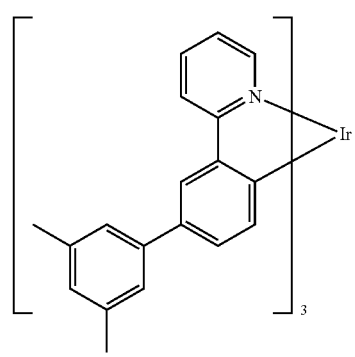
D-30
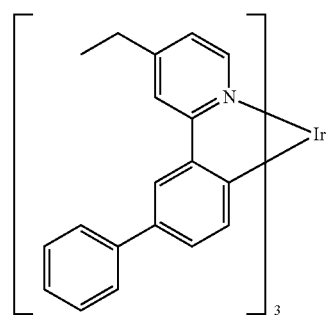
D-31
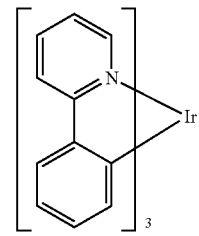
D-32
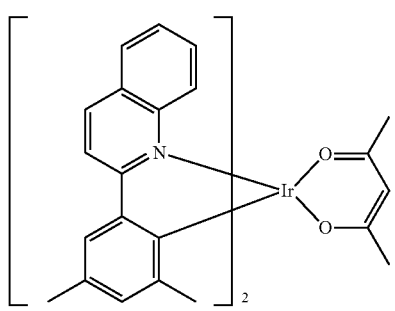
D-33
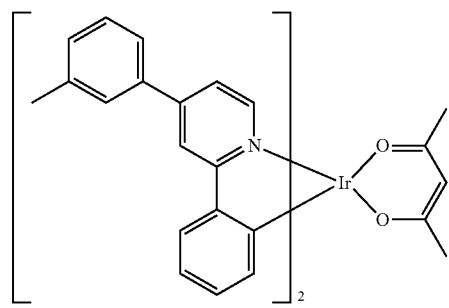
D-34
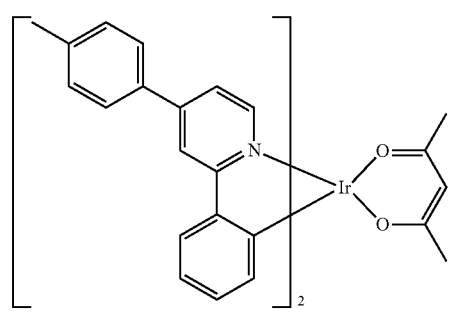
D-35
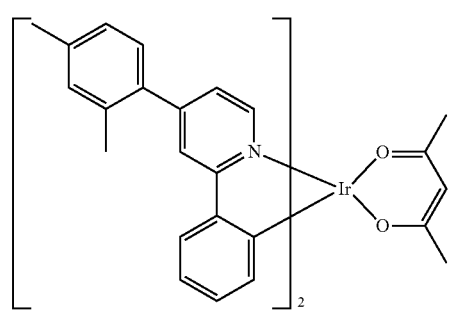
D-36
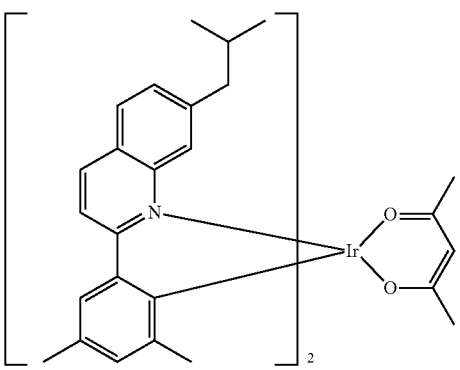
D-37
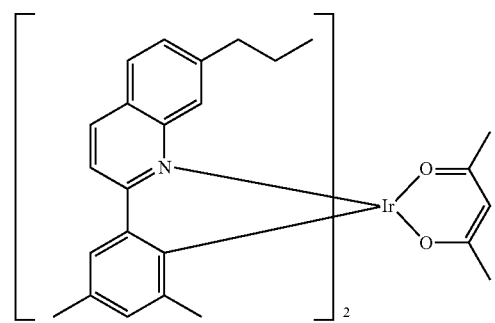
D-38

D-39
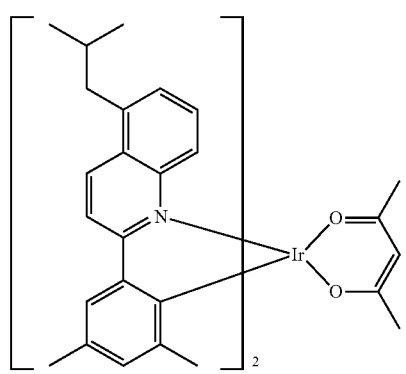
D-40
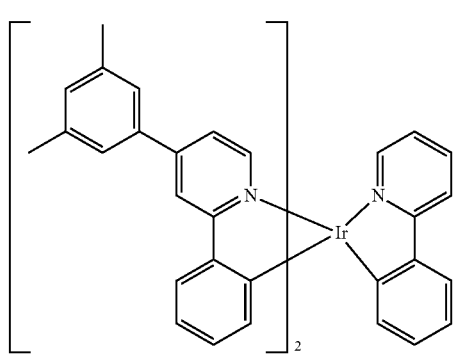
D-41
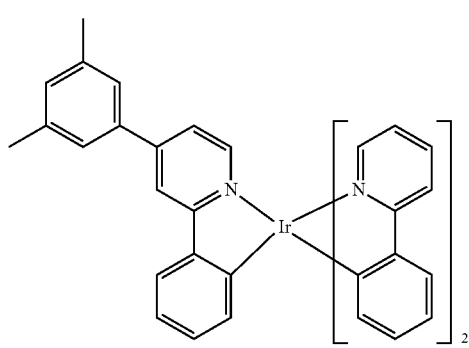
D-42
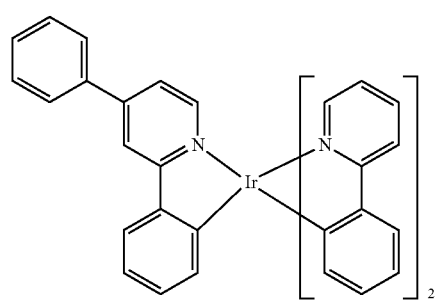
D-43
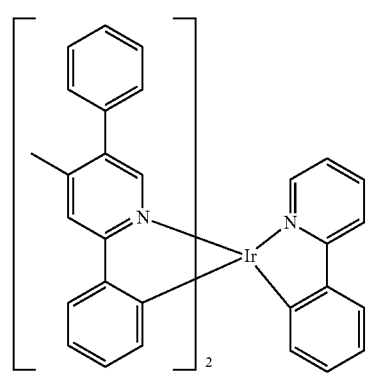
D-44
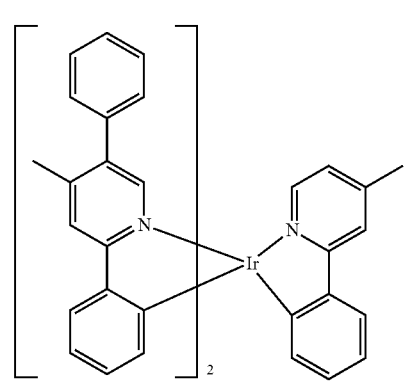
D-45
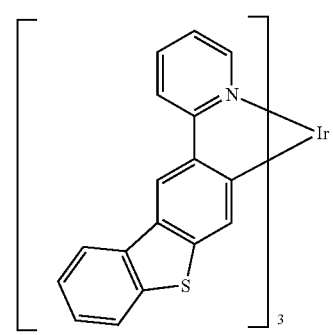
D-46
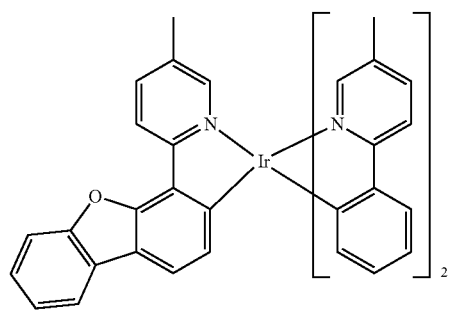

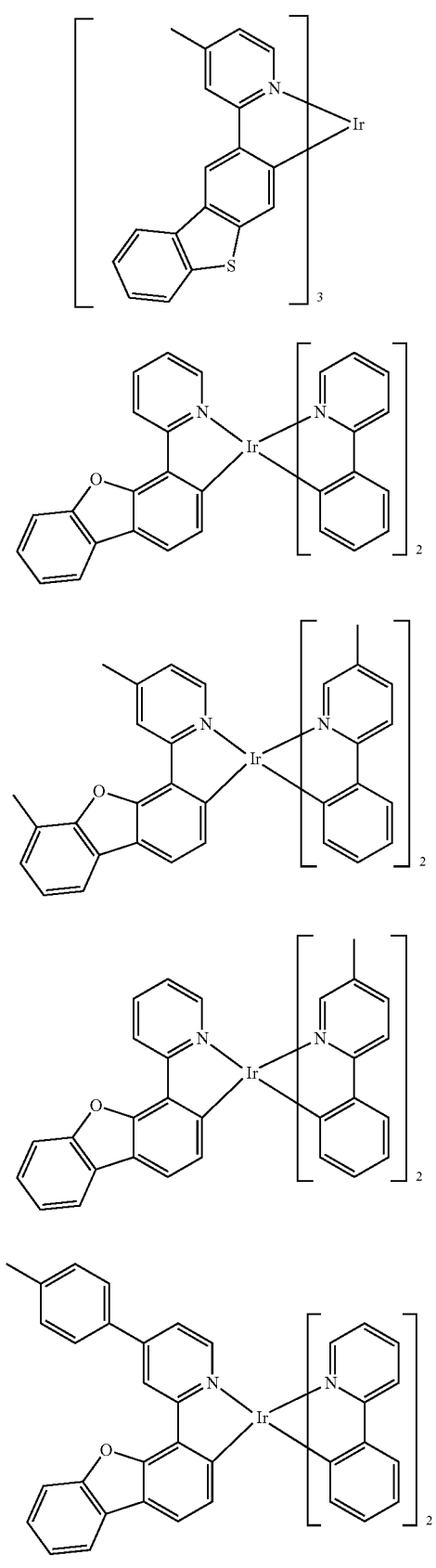
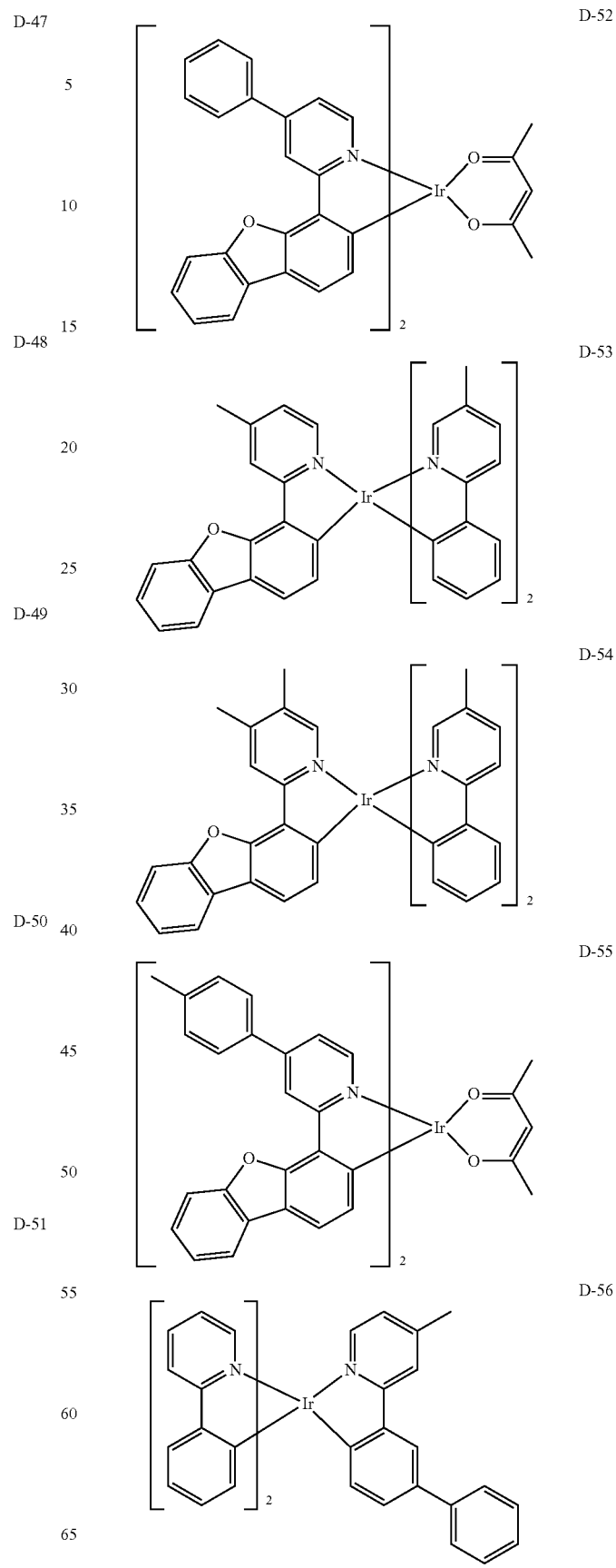

D-57
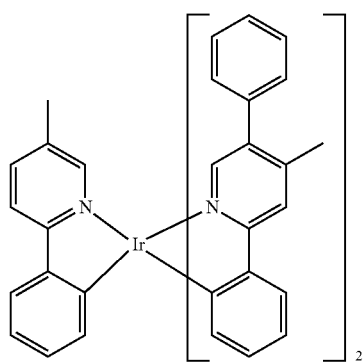
D-58
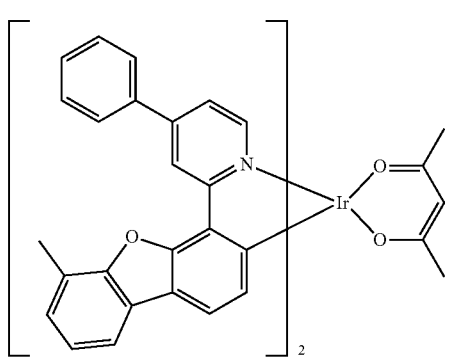
D-59
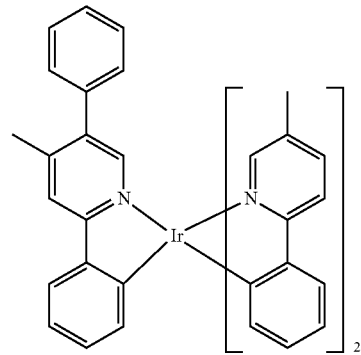
D-60
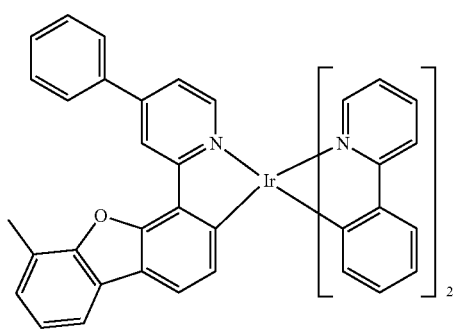
D-61
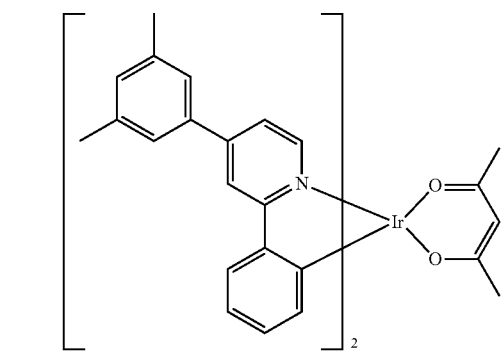
D-62
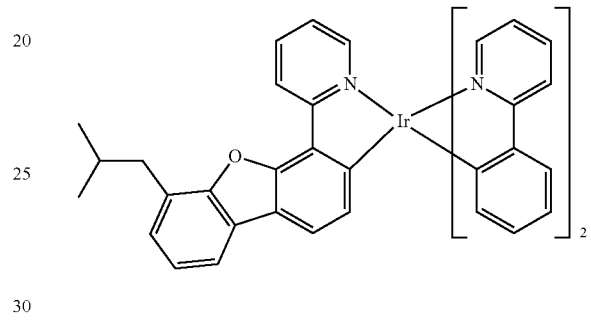
D-63
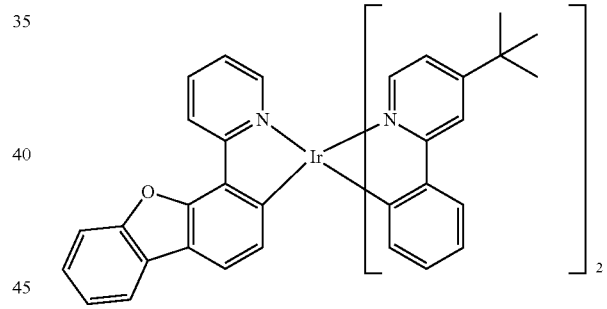
D-64
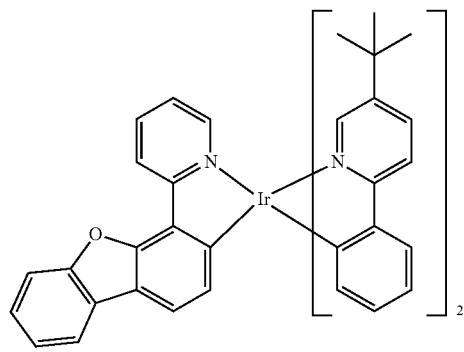

-continued
D-65
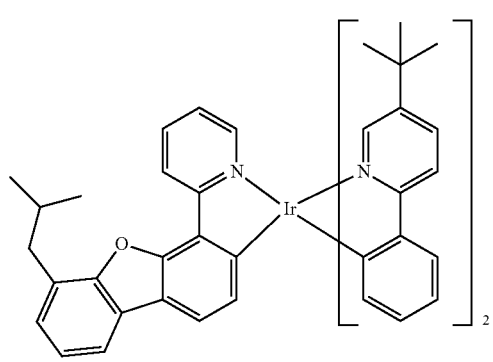
D-66
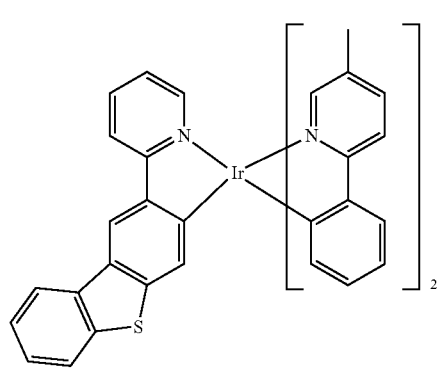
D-67
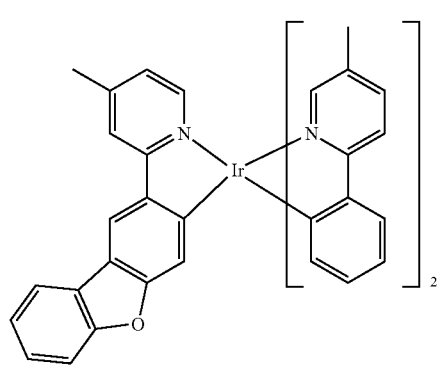
D-68
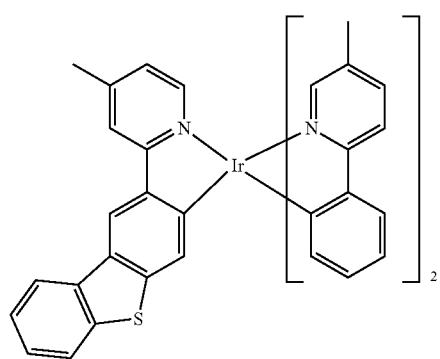
-continued
D-69
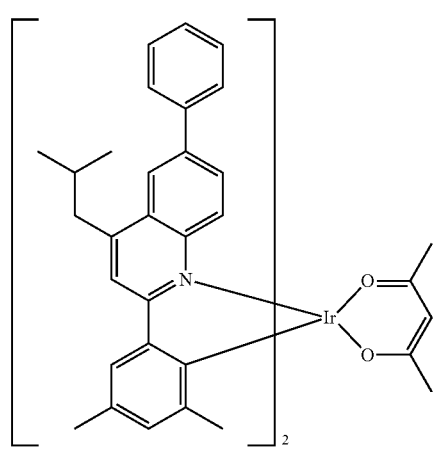
D-70
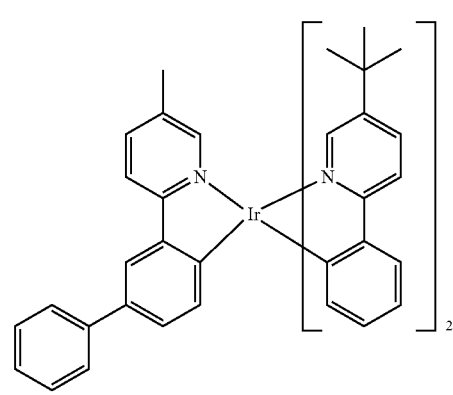
D-71
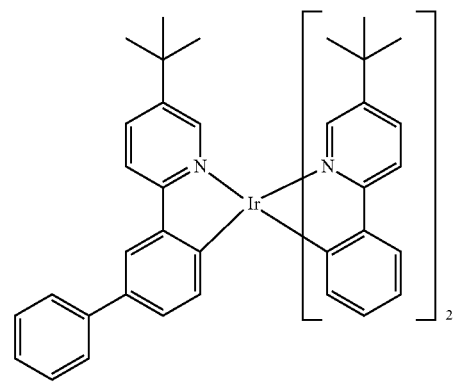
D-72
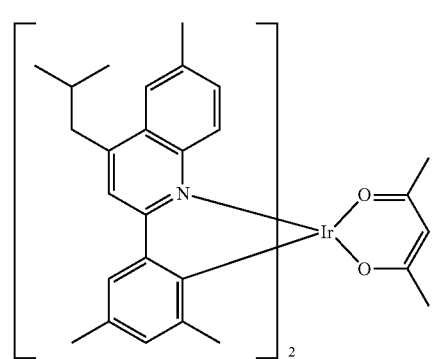

D-73
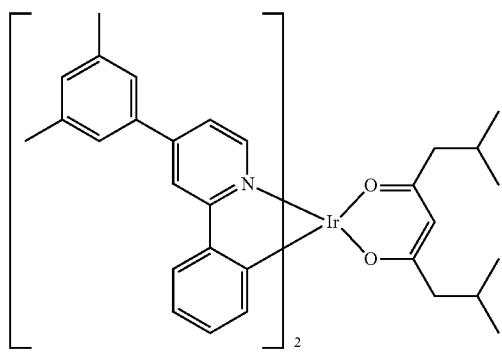
D-74
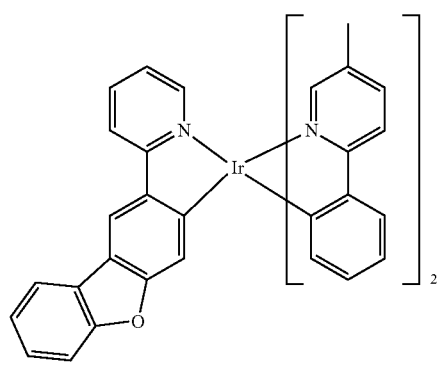
D-75
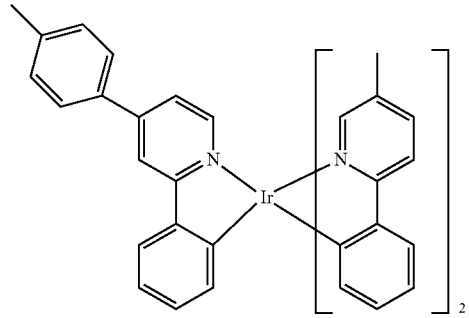
D-76
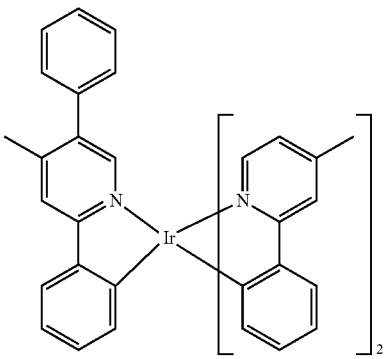
D-77
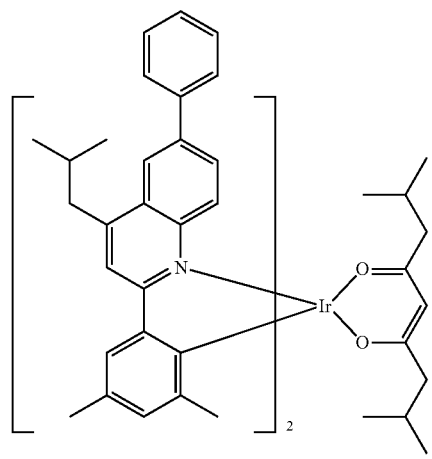
D-78
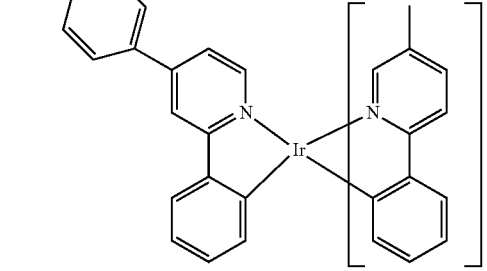
D-79
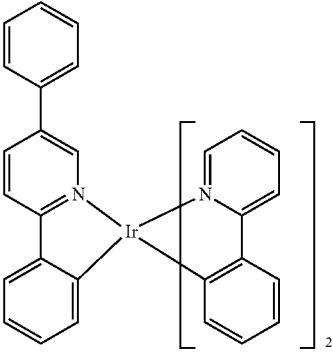
D-80

D-81
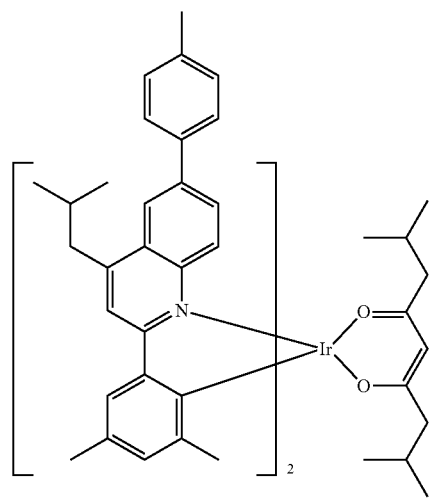
D-82
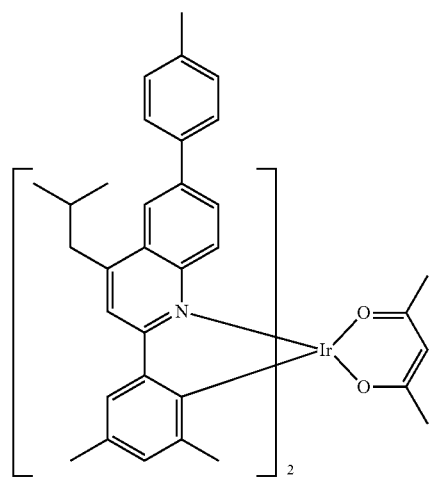
D-83
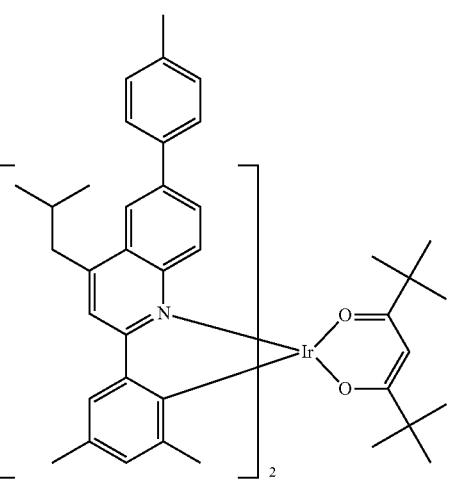
D-84
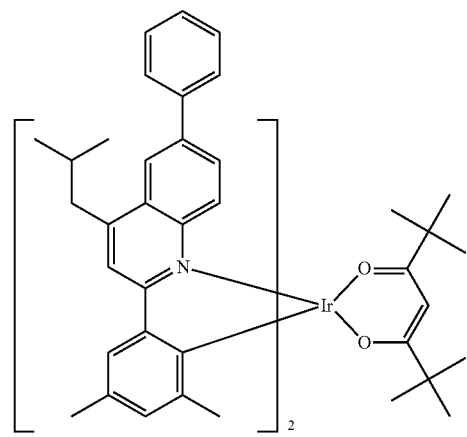
D-85
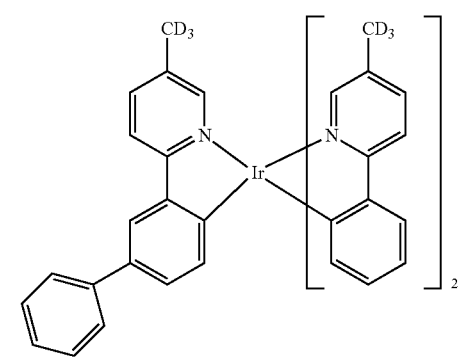
D-86
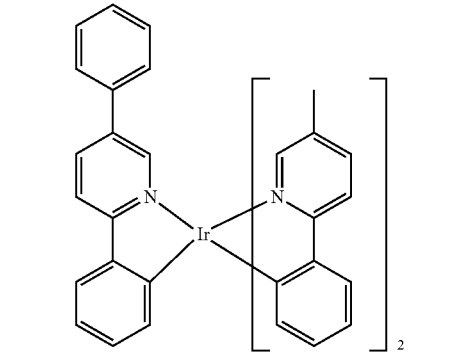
D-87
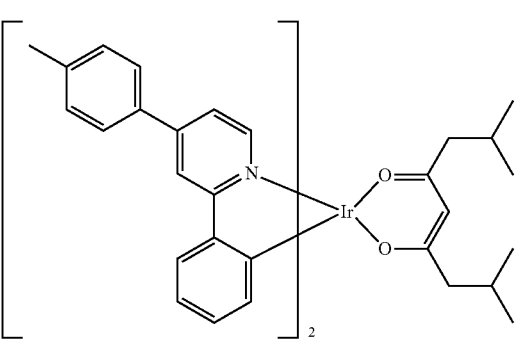

-continued
D-88
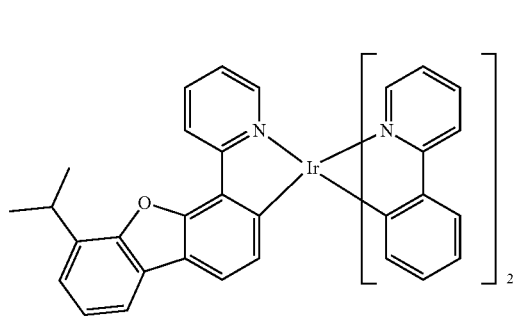
D-89
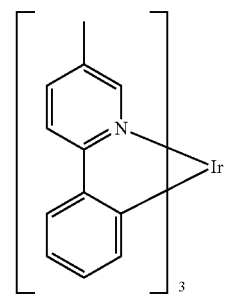
D-90
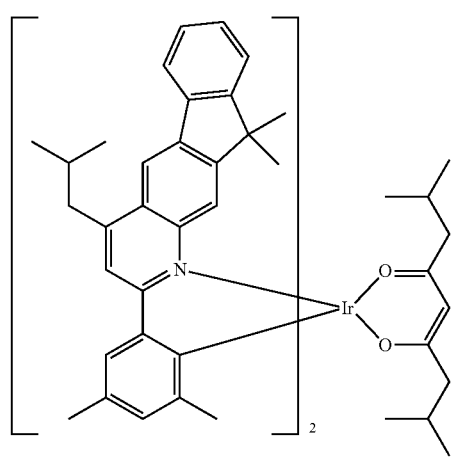
D-91
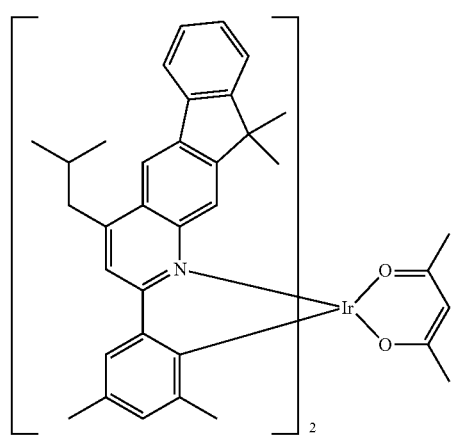
-continued
D-92
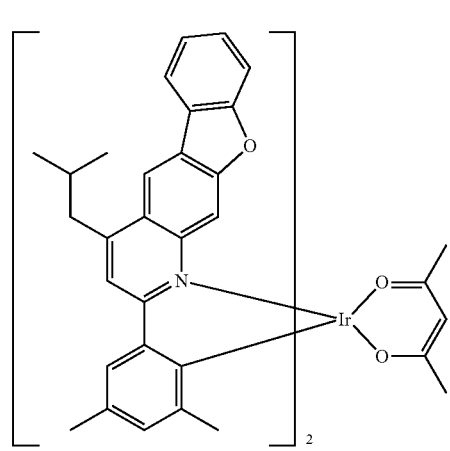
D-93
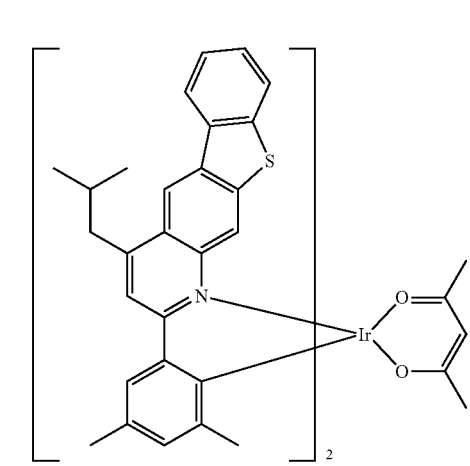
D-94
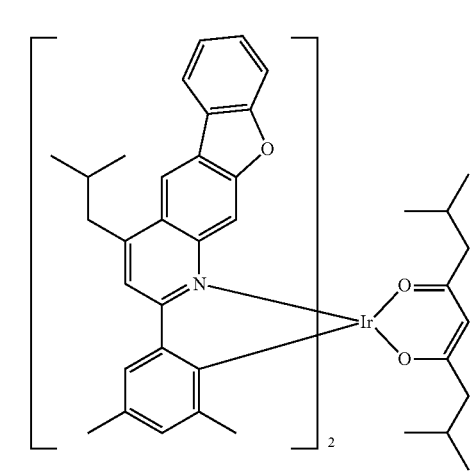

D-95
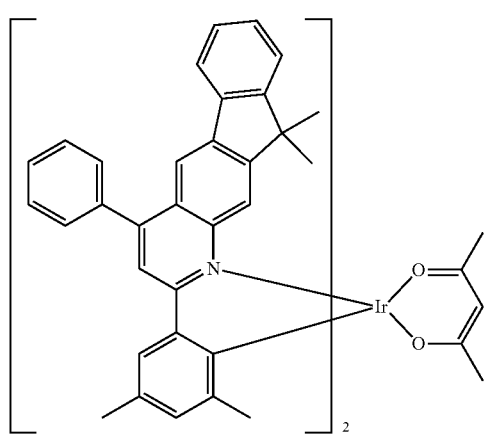
D-96
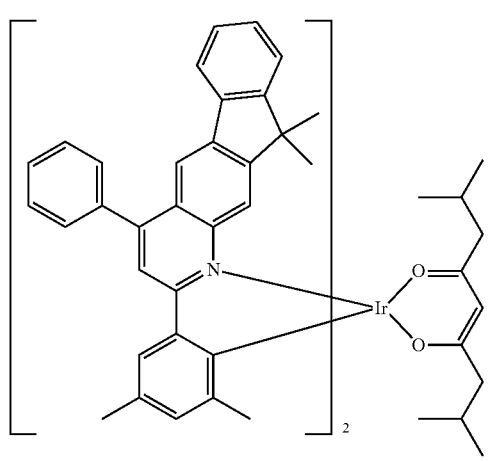
D-97
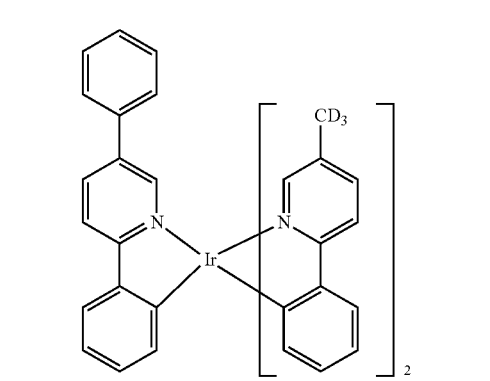
D-98
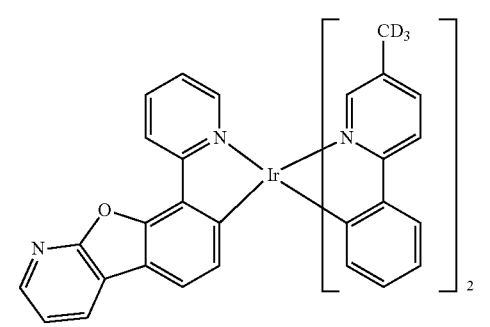
D-99
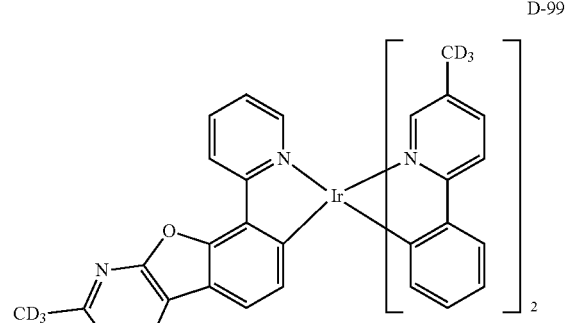
D-100
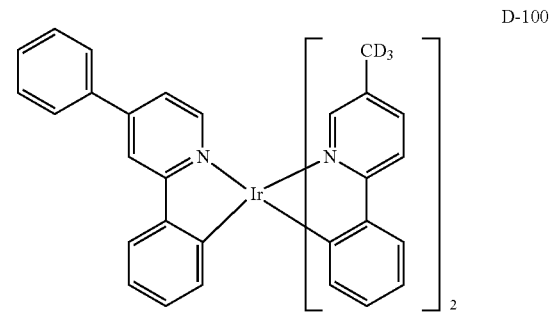
D-101
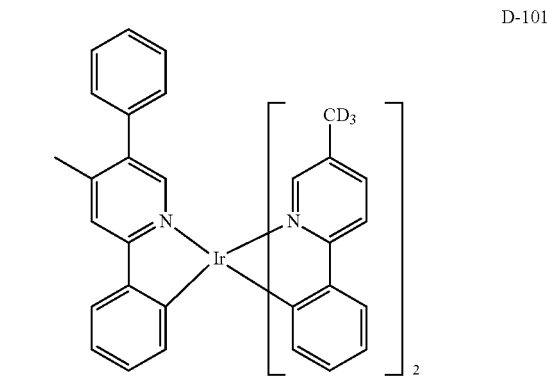
D-102
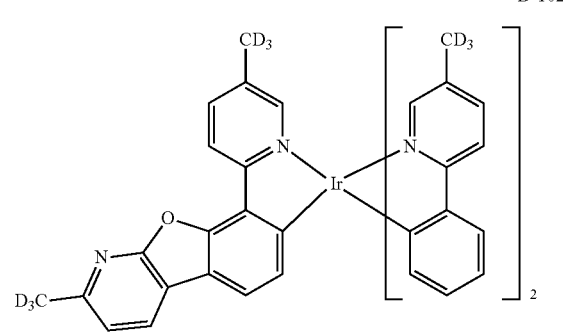

-continued
D-103
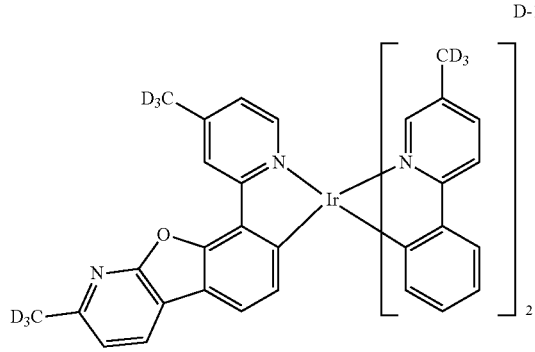
D-104
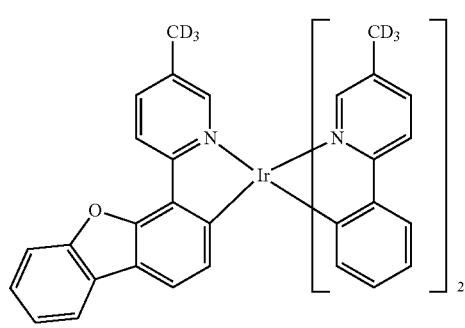
D-105
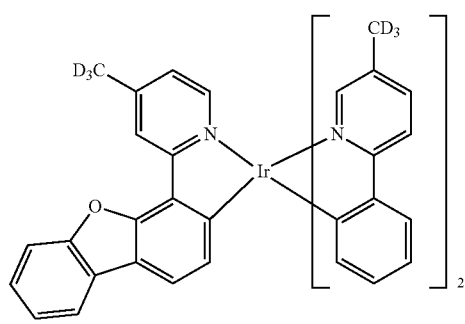
D-106
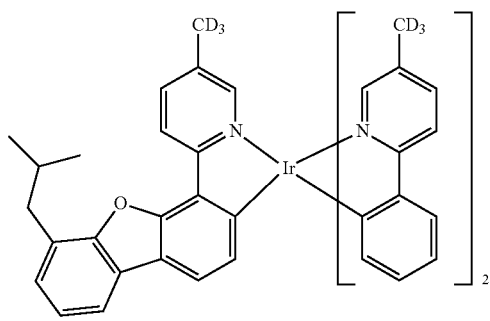
D-107
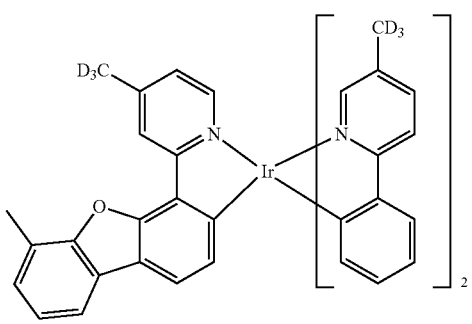
D-108
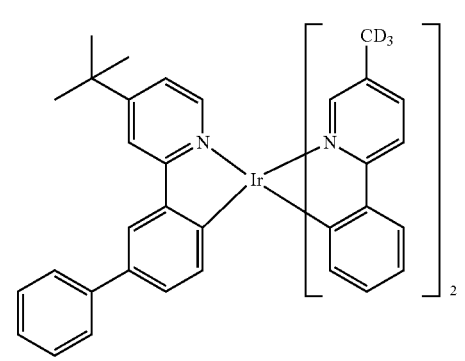
D-109
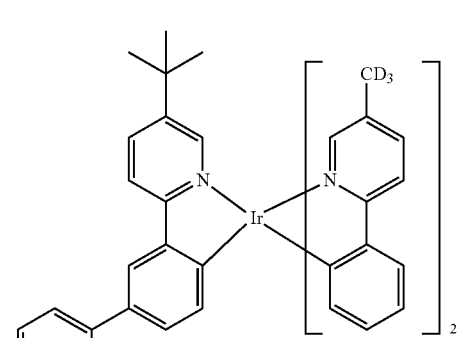
D-110
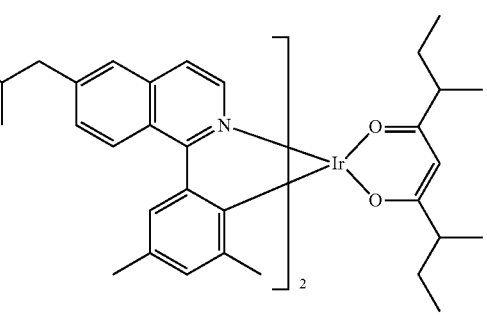

D-111
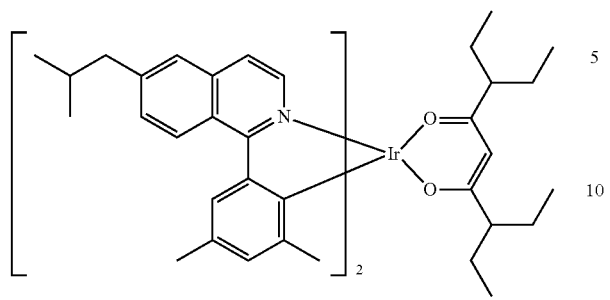
D-112
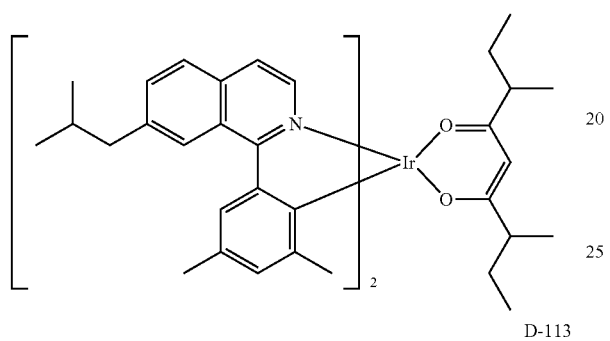
D-113
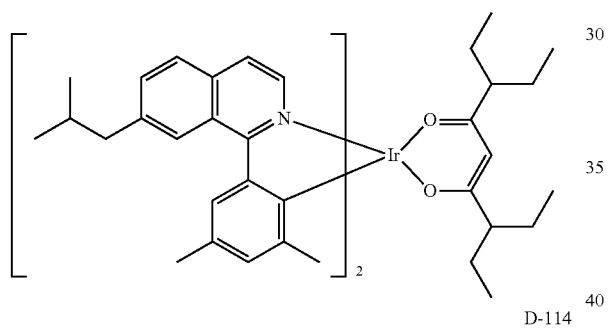
D-114
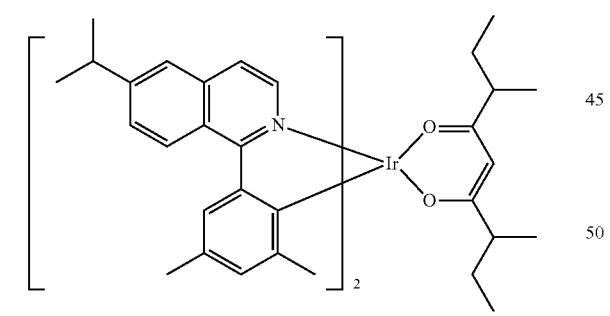
D-115
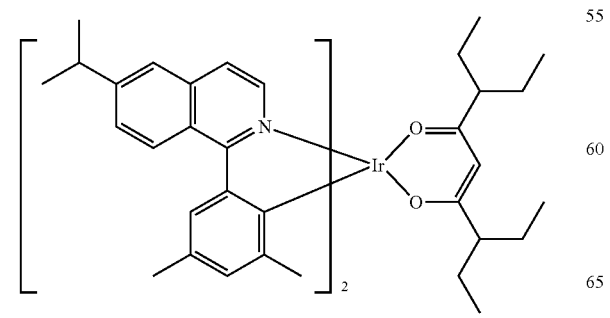
D-116
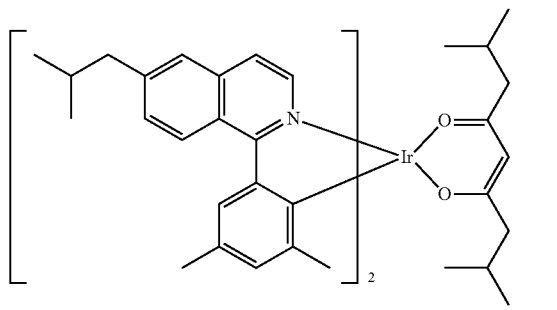
D-117
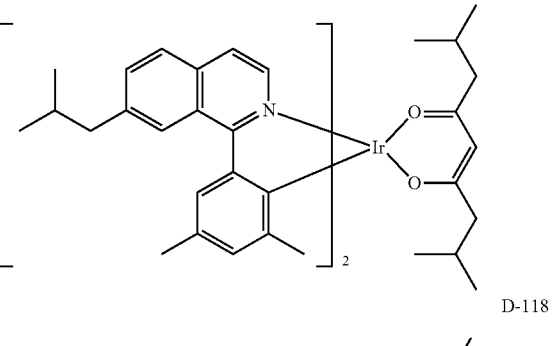
D-118
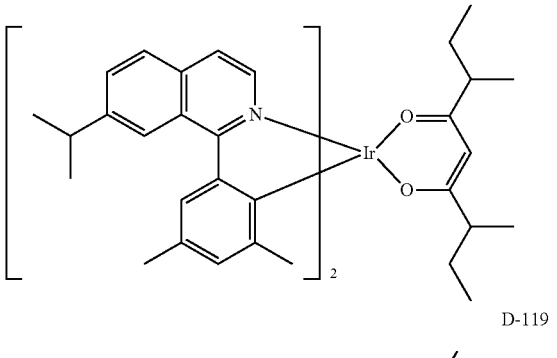
D-119
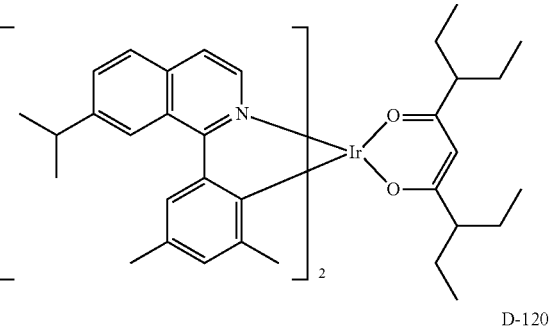
D-120
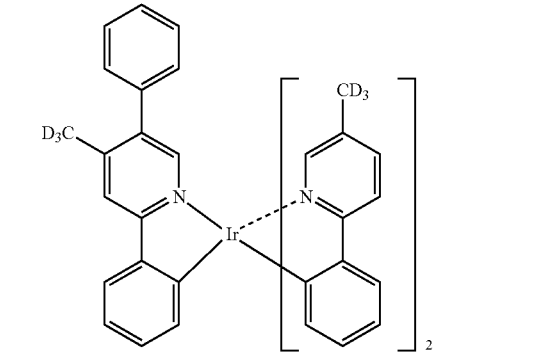

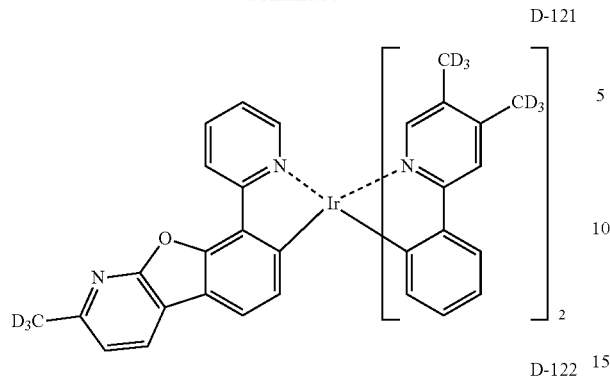
D-121
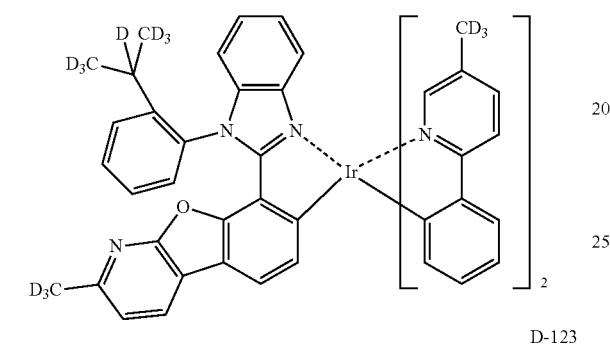
D-122
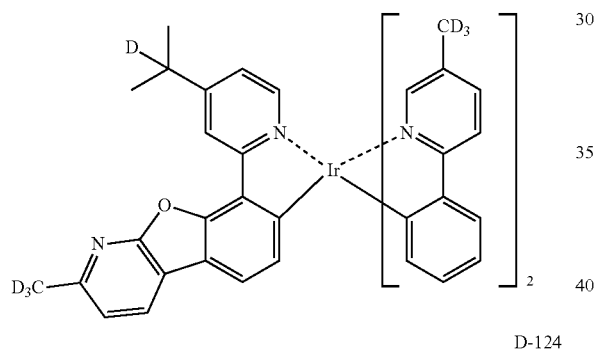
D-123
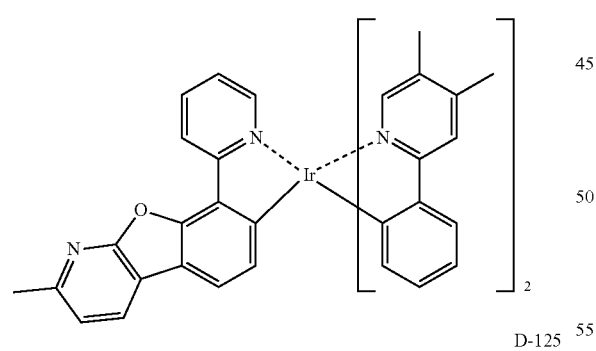
D-124
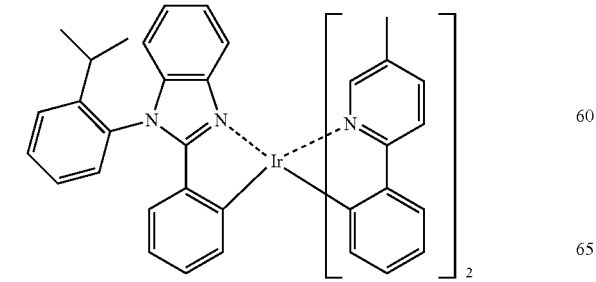
D-125
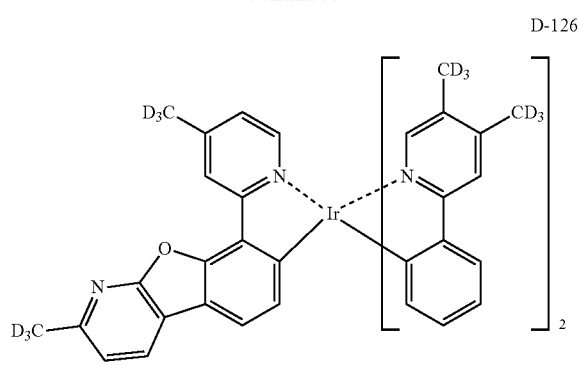
D-126
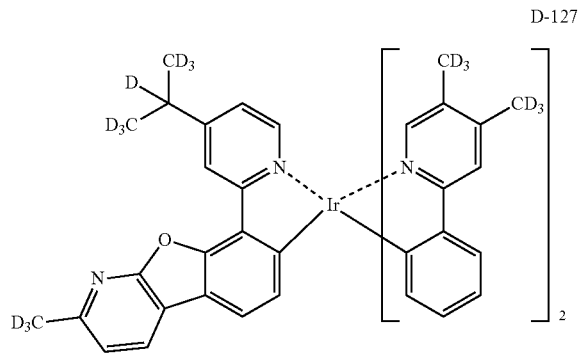
D-127
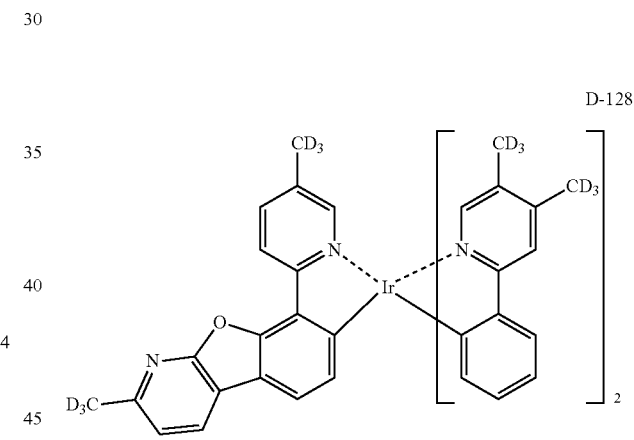
D-128
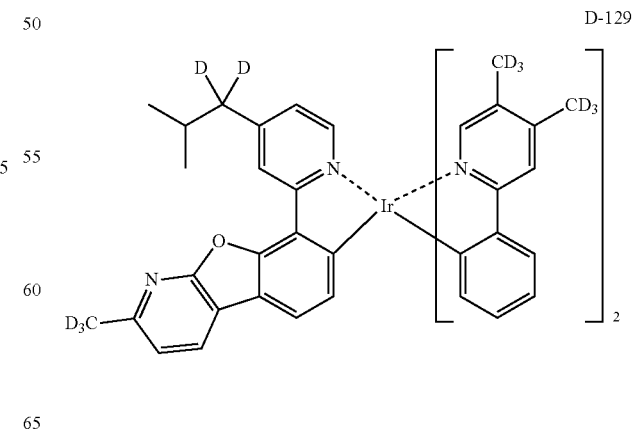
D-129

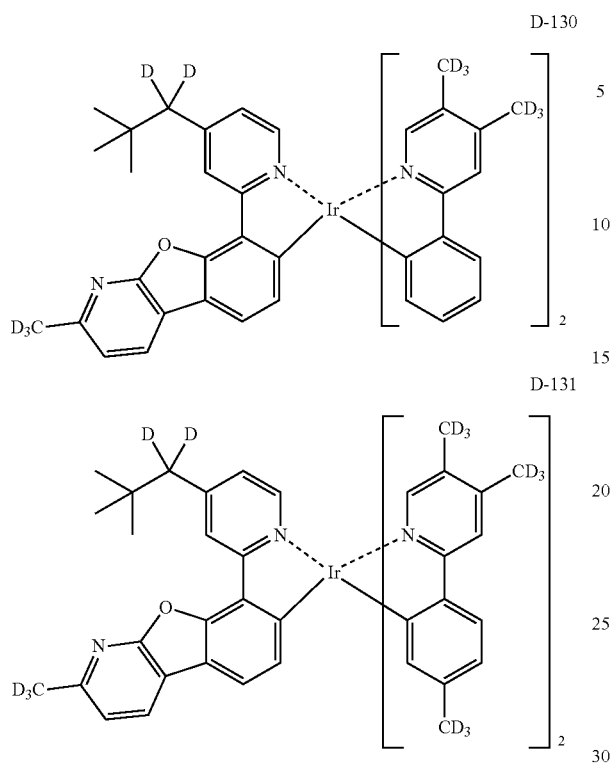
D-130
D-131
D-132
D-133
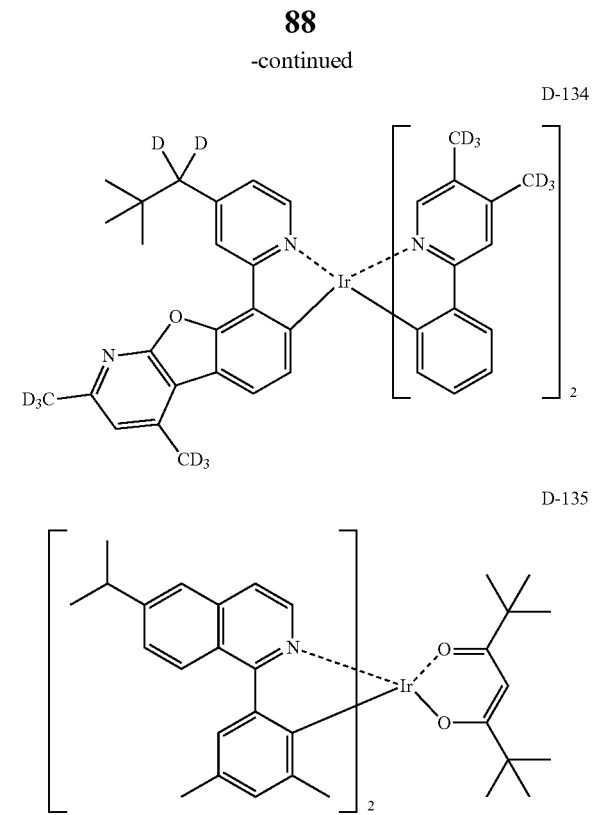
D-134
D-135
D-136
D-137

D-138
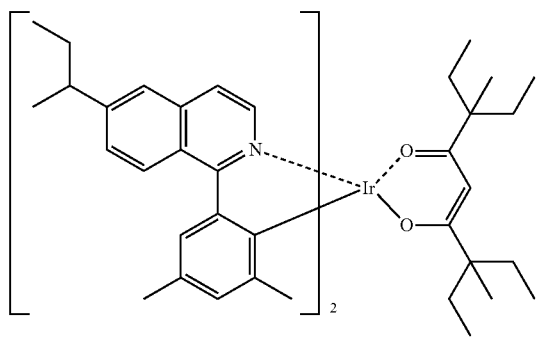
D-139
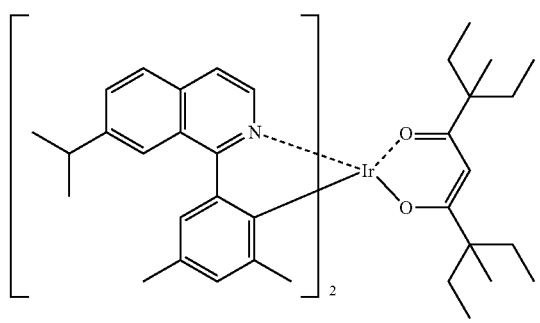
D-140
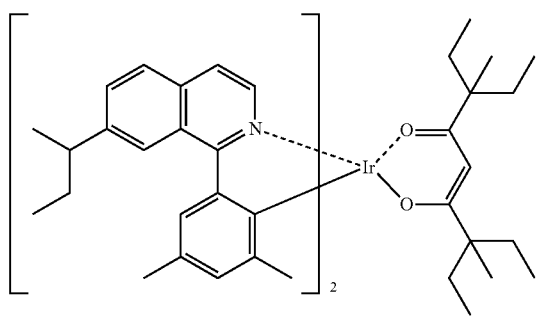
D-141
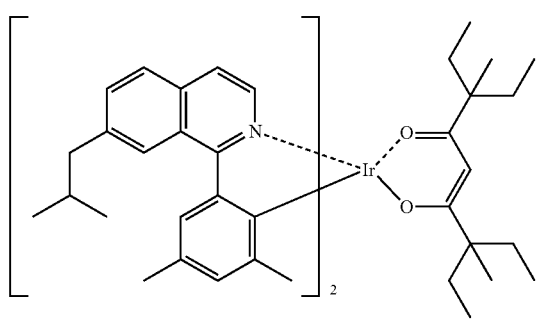
D-142
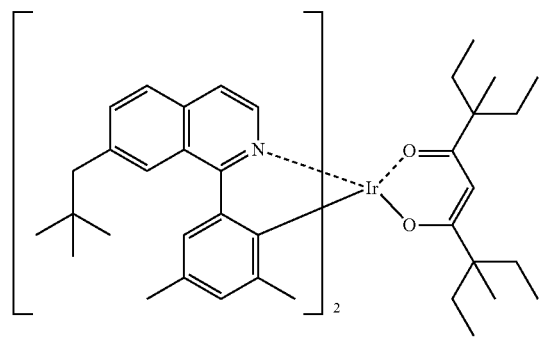
D-143
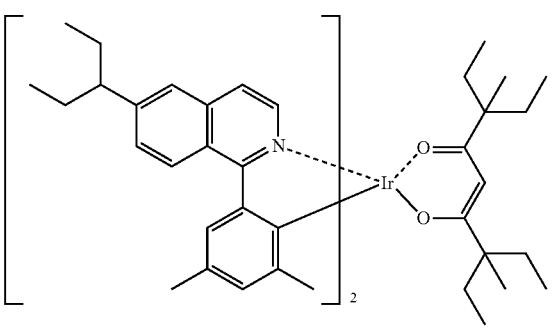
D-144
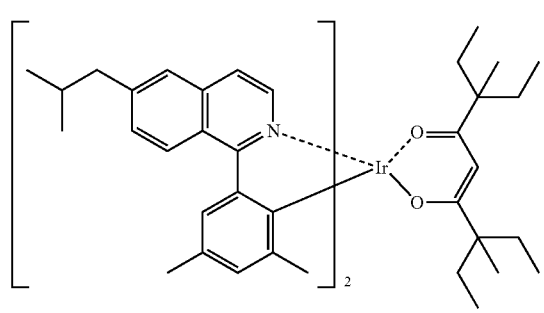
D-145
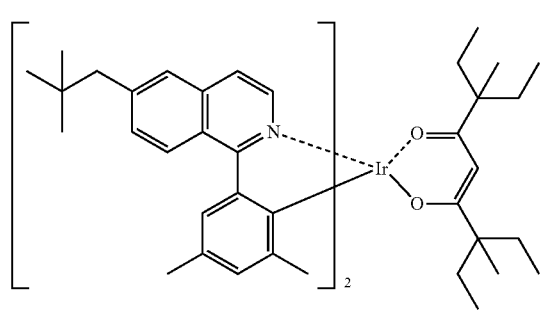

-continued

D-146
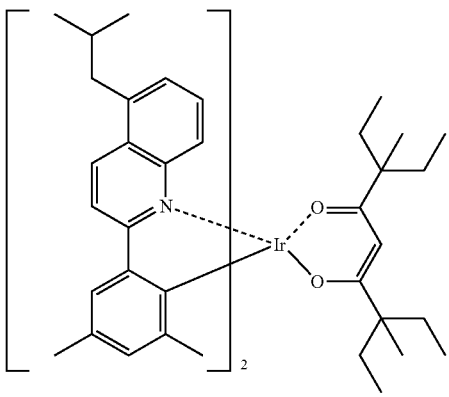

D-147
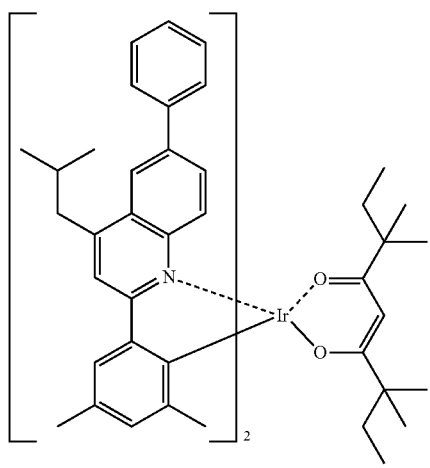

D-148
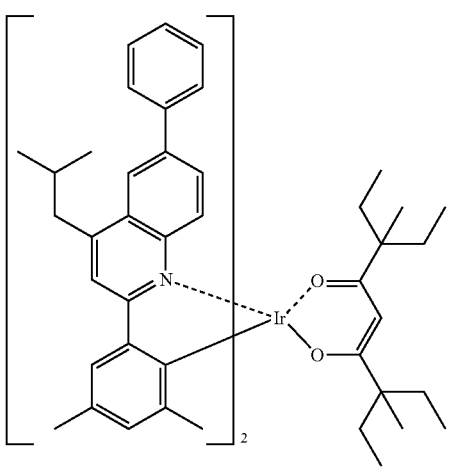

-continued

D-149
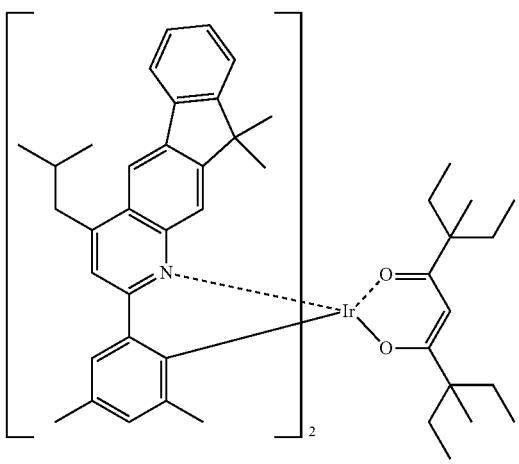

The present disclosure provides an organic electroluminescent material comprising the organic electroluminescent compound represented by formula 1, and an organic electroluminescent device comprising the material. The material may consist of the organic electroluminescent compound of the present disclosure alone, or may further comprise conventional materials contained in an organic electroluminescent material.

The organic electroluminescent compound of formula 1 of the present disclosure may be comprised in at least one layer of the light-emitting layer, the hole injection layer, the hole transport layer, the hole auxiliary layer, the light-emitting auxiliary layer, the electron transport layer, the electron buffer layer, the electron injection layer, the interlayer, the hole blocking layer, and the electron blocking layer, preferably in the light-emitting layer. When used in the light-emitting layer, the organic electroluminescent compound of formula 1 of the present disclosure may be comprised as a host material. If necessary, the organic electroluminescent compound of the present disclosure may be used as a co-host material. That is, the light-emitting layer may further comprise an organic electroluminescent compound other than the organic electroluminescent compound of formula 1 of the present disclosure (a first host material) as a second host material. In this case, the weight ratio of the first host material and the second host material is about 1:99 to about 99:1. When at least two materials are comprised in one layer, they may be mixture-evaporated to form a layer or may be separately co-evaporated at the same time to form a layer.

An organic electroluminescent device according to the present disclosure has a first electrode, a second electrode, and at least one organic layer between the first electrode and the second electrode. One of the first and second electrodes may be an anode, and the other may be a cathode. The organic layer comprises a light-emitting layer and may further comprise at least one layer selected from a hole injection layer, a hole transport layer, a hole auxiliary layer, a light-emitting auxiliary layer, an electron transport layer, an electron buffer layer, an electron injection layer, an interlayer, a hole blocking layer, and an electron blocking layer. Each of the layers may be further configured as a plurality of layers.

The first and second electrodes may be respectively formed with a transparent conductive material, or a transflective or reflective conductive material. The organic electroluminescent device may be a top emission type, a bottom emission type, or a both-sides emission type, depending on the materials forming the first and second electrodes. In addition, the hole injection layer may be further doped with a p-dopant, and the electron injection layer may be further doped with an n-dopant.

In the organic electroluminescent device of the present disclosure, the organic layer may further comprise at least one metal selected from the group consisting of metals of Group 1, metals of Group 2, transition metals of the $4^{th}$ period, transition metals of the $5^{th}$ period, lanthanides, and organic metals of the d-transition elements of the Periodic Table, or at least one complex compound comprising the metal.

In addition, the organic electroluminescent device of the present disclosure may emit white light by further comprising at least one light-emitting layer, which comprises a blue, a red, or a green electroluminescent compound known in the field, besides the compound of the present disclosure. If necessary, it may further comprise a yellow or an orange light-emitting layer.

In the organic electroluminescent device of the present disclosure, preferably, at least one layer selected from a chalcogenide layer, a metal halide layer, and a metal oxide layer (hereinafter, "a surface layer") may be placed on an inner surface(s) of one or both electrode(s). Specifically, a chalcogenide (including oxides) layer of silicon or aluminum is preferably placed on an anode surface of an electroluminescent medium layer, and a metal halide layer or a metal oxide layer is preferably placed on a cathode surface of an electroluminescent medium layer. Such a surface layer provides operation stability for the organic electroluminescent device. Preferably, the chalcogenide includes $SiO_X$ ($1 \leq X \leq 2$), $AlO_X$ ($1 \leq X \leq 1.5$), SiON, SiAlON, etc.; the metal halide includes LiF, $MgF_2$, $CaF_2$, a rare earth metal fluoride, etc.; and the metal oxide includes $Cs_2O$, $Li_2O$, MgO, SrO, BaO, CaO, etc.

A hole injection layer, a hole transport layer, an electron blocking layer, or a combination thereof can be used between the anode and the light-emitting layer. The hole injection layer may be multi-layers in order to lower the hole injection barrier (or hole injection voltage) from the anode to the hole transport layer or the electron blocking layer, wherein each of the multi-layers may use two compounds simultaneously. The hole transport layer or the electron blocking layer may also be multi-layers.

An electron buffer layer, a hole blocking layer, an electron transport layer, an electron injection layer, or a combination thereof can be used between the light-emitting layer and the cathode. The electron buffer layer may be multi-layers in order to control the injection of the electron and improve the interfacial properties between the light-emitting layer and the electron injection layer, wherein each of the multi-layers may use two compounds simultaneously. The hole blocking layer or the electron transport layer may also be multi-layers, wherein each of the multi-layers may use a plurality of compounds.

The light-emitting auxiliary layer may be placed between the anode and the light-emitting layer, or between the cathode and the light-emitting layer. When the light-emitting auxiliary layer is placed between the anode and the light-emitting layer, it can be used for promoting the hole injection and/or hole transport, or for preventing the overflow of electrons. When the light-emitting auxiliary layer is placed between the cathode and the light-emitting layer, it can be used for promoting the electron injection and/or electron transport, or for preventing the overflow of holes. Also, the hole auxiliary layer may be placed between the hole transport layer (or hole injection layer) and the light-emitting layer, and may be effective to promote or block the hole transport rate (or hole injection rate), thereby enabling the charge balance to be controlled. Further, the electron blocking layer may be placed between the hole transport layer (or hole injection layer) and the light-emitting layer, and can confine the excitons within the light-emitting layer by blocking the overflow of electrons from the light-emitting layer to prevent a light-emitting leakage. When an organic electroluminescent device includes two or more hole transport layers, the hole transport layer which is further included, may be used as a hole auxiliary layer or an electron blocking layer. The light-emitting auxiliary layer, the hole auxiliary layer or the electron blocking layer may have an effect of improving the efficiency and/or the lifetime of the organic electroluminescent device.

Preferably, in the organic electroluminescent device of the present disclosure, a mixed region of an electron transport compound and a reductive dopant, or a mixed region of a hole transport compound and an oxidative dopant may be placed on at least one surface of a pair of electrodes. In this case, the electron transport compound is reduced to an anion, and thus it becomes easier to inject and transport electrons from the mixed region to the light-emitting medium. Furthermore, the hole transport compound is oxidized to a cation, and thus it becomes easier to inject and transport holes from the mixed region to the light-emitting medium. Preferably, the oxidative dopant includes various Lewis acids and acceptor compounds; and the reductive dopant includes alkali metals, alkali metal compounds, alkaline earth metals, rare-earth metals, and mixtures thereof. The reductive dopant layer may be employed as a charge-generating layer to prepare an organic electroluminescent device having two or more light-emitting layers and emitting white light.

The organic electroluminescent material according to the present disclosure may be used as a light-emitting material for a white organic light-emitting device. The white organic light-emitting device has been suggested to have various structures such as a side-by-side structure or a stacking structure depending on the arrangement of R (red), G (green) or YG (yellow green), and B (blue) light-emitting parts, or color conversion material (CCM) method, etc. The organic electroluminescent material according to the present disclosure may also be used in an organic electroluminescent device comprising a quantum dot (QD).

In order to form each layer of the organic electroluminescent device of the present disclosure, dry film-forming methods such as vacuum evaporation, sputtering, plasma, ion plating methods, etc., or wet film-forming methods such as ink jet printing, nozzle printing, slot coating, spin coating, dip coating, flow coating methods, etc., can be used. When using a wet film-forming method, a thin film can be formed by dissolving or diffusing materials forming each layer into any suitable solvent such as ethanol, chloroform, tetrahydrofuran, dioxane, etc. The solvent can be any one where the materials forming each layer can be dissolved or diffused, and where there are no problems in film-formation capability.

In addition, it is possible to produce a display system, for example, a display system for smart phones, tablets, notebooks, PCs, TVs, or cars; or a lighting system, for example an outdoor or indoor lighting system, by using the organic electroluminescent device of the present disclosure.

Hereinafter, the preparation method of the compounds according to the present disclosure and the properties thereof will be explained in detail with reference to the representative compounds of the present disclosure. However, the present disclosure is not limited by the following examples.

Example 1: Preparation of Compound C-14

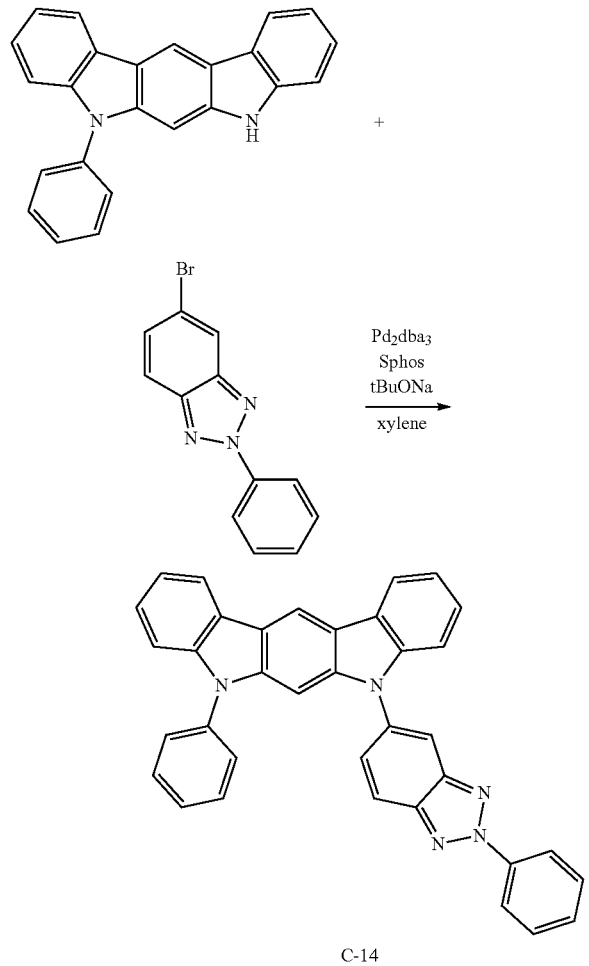

5-phenyl-5,7-dihydroindolo[2,3-b]carbazole (10 g, 30 mmol), 5-bromo-2-phenyl-2H-benzo[d][1,2,3]triazole (9.03 g, 33 mmol), tris(dibenzylideneacetone)dipalladium(0) (1.3 g, 1.5 mmol), 2-dicyclohexylphosphino-2',6'-dimethoxybiphenyl (1.23 g, 3 mmol), sodium tert-butoxide (7.2 g, 75 mmol), and 150 mL of xylene were added to a flask, and the mixture was stirred under reflux at 120° C. for 1 hour. After completion of the reaction, the reaction mixture was extracted with ethyl acetate, and separated by column chromatography to obtain compound C-14 (11 g, yield: 69.8%).

| Compound | MW | M.P. |
|---|---|---|
| C-14 | 525.2 | 223.9° C. |

Example 2: Preparation of Compound C-3

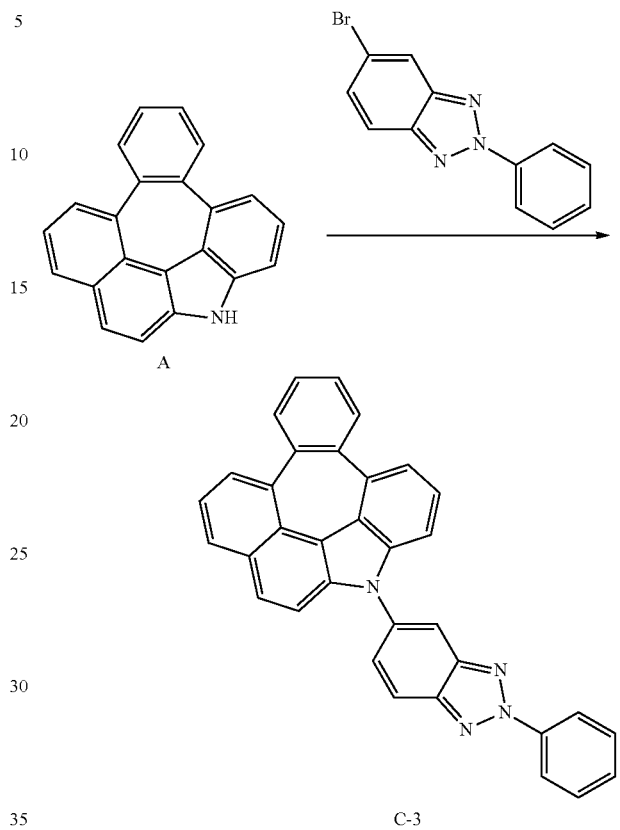

Compound A (5.9 g, 20 mmol), 5-bromo-2-phenyl-2H-benzo[d][1,2,3]triazole (5 g, 18.3 mmol), palladium acetate (II) (0.21 g, 0.9 mmol), 2-dicyclohexylphosphino-2',6'-dimethoxybiphenyl (0.75 g, 1.8 mmol), sodium tert-butoxide (4.4 g, 46 mmol), and 150 mL of xylene were added to a flask, and the mixture was stirred under reflux at 120° C. for 1 hour. After completion of the reaction, the reaction mixture was extracted with ethyl acetate, and separated by column chromatography to obtain compound C-3 (1.8 g, yield: 20%).

| Compound | MW | M.P. |
|---|---|---|
| C-3 | 484.5 | 228° C. |

Example 3: Preparation of Compound C-1

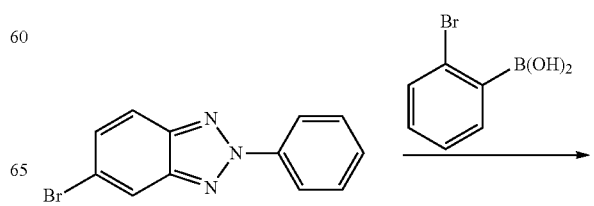

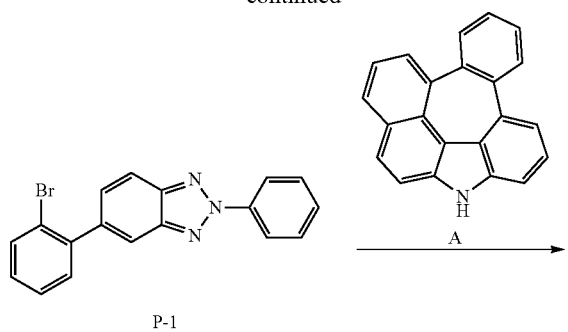

P-1 + A →

Synthesis of Compound P-1

In a flask, 5-bromo-2-phenyl-2H-benzo[d][1,2,3]triazole (30 g, 109.9 mmol), (2-bromophenyl)boronic acid (27 g, 131 mmol), Pd(PPh$_3$)$_4$ (7 g, 5.5 mmol), and K$_2$CO$_3$ (31 g, 220 mmol) were dissolved in 500 mL of toluene, 100 mL of ethanol, and 100 mL of water, and the mixture was refluxed at 130° C. for 2 hours. After completion of the reaction, the organic layer was extracted with ethyl acetate, and residual moisture was removed with magnesium sulfate. The residue was dried and separated by column chromatography to obtain compound P-1 (25 g, yield: 65%).

Synthesis of Compound C-1

In a flask, 5-(2-bromophenyl)-2-phenyl-2H-benzo[d][1,2,3]triazole (15 g, 43 mmol), compound A (21 g, 55.9 mmol), CuSO$_4$ (3 g, 17.2 mmol), and K$_2$CO$_3$ (11 g, 86 mmol) were dissolved in 200 mL of dichlorobenzene, and the mixture was stirred under reflux at 120° C. for 3 hours. After completion of the reaction, the reaction mixture was extracted with ethyl acetate, and separated by column chromatography to obtain compound C-1 (6 g, yield: 25%).

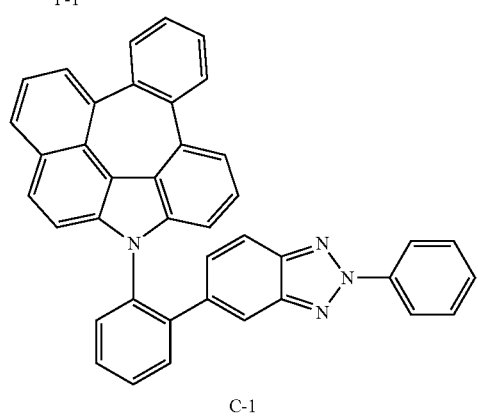

C-1

| Compound | MW | M.P. |
|---|---|---|
| C-1 | 560.66 | 277° C. |

Example 4: Preparation of Compound C-2

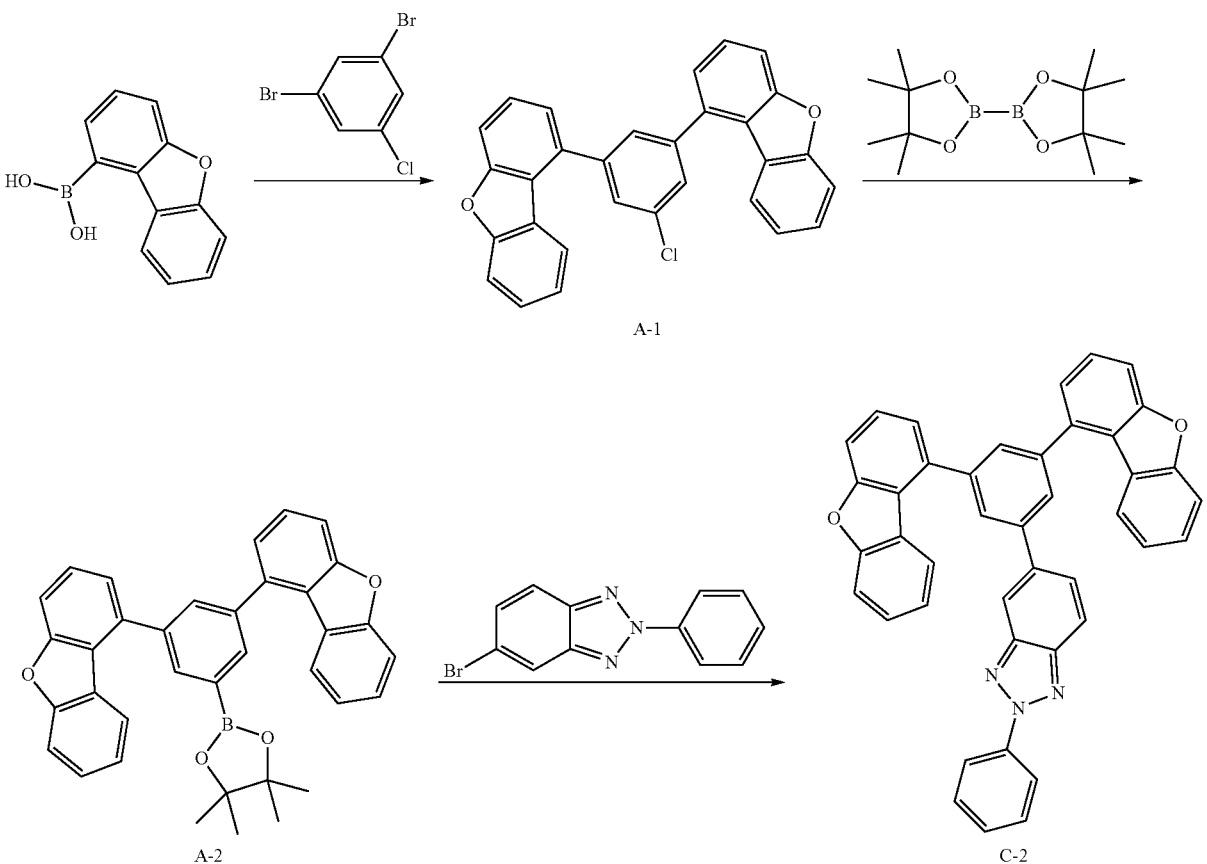

Synthesis of Compound A-1

In a flask, dibenzo[b,d]furan-1-yl boronic acid (47 g, 222 mmol), 1,3-dibenzo-5-chlorobenzene (30 g, 111 mmol), Pd(PPha)$_4$ (12 g, 5.5 mmol), and K$_2$CO$_3$ (31 g, 222 mmol) were dissolved in 500 mL of toluene, 100 mL of ethanol, and 100 mL of water, and the mixture was refluxed at 130° C. for 2 hours. After completion of the reaction, the organic layer was extracted with ethyl acetate, and residual moisture was removed with magnesium sulfate. The residue was dried and separated by column chromatography to obtain compound A-1 (44 g, yield: 89%).

Synthesis of Compound A-2

In a flask, compound A-1 (30 g, 67.5 mmol), bis(pinacolato)diboron (26 g, 101 mmol), Pd$_2$(dba)$_3$ (154 g, 168 mmol), SPhos (82 g, 202 mmol), and KOAc (17 g, 168 mmol) were dissolved in 350 mL of dioxane, and the mixture was refluxed at 130° C. for 2 hours. After completion of the reaction, the organic layer was extracted with ethyl acetate, and residual moisture was removed with magnesium sulfate. The residue was dried and separated by column chromatography to obtain compound A-2 (15 g, yield: 41%).

Synthesis of Compound C-2

In a flask, compound A-2 (12 g, 21 mmol), 5-bromo-2-phenyl-2H-benzo[d][1,2,3]triazole (5 g, 18.3 mmol), Pd(PPh$_3$)$_4$ (1.1 g, 0.9 mmol), and K$_2$CO$_3$ (5.1 g, 36.6 mmol) were dissolved in 100 mL of toluene, 30 mL of ethanol, and 30 mL of water, and the mixture was refluxed at 130° C. for 2 hours. After completion of the reaction, the organic layer was extracted with ethyl acetate, and residual moisture was removed with magnesium sulfate. The residue was dried and separated by column chromatography to obtain compound C-2 (1.5 g, yield: 15%).

| Compound | MW | M.P. |
| --- | --- | --- |
| C-2 | 603.68 | 235° C. |

Example 5: Preparation of Compound C-111

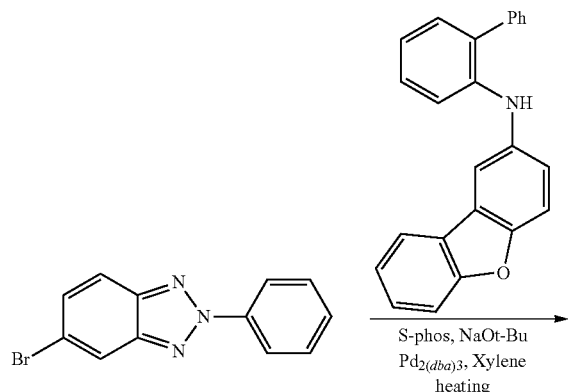

N-([1,1'-bisphenyl]-2-yl)dibenzo[b,d]furan-2-amine (13.5 g, 40 mmol), 5-bromo-2-phenyl-2H-benzo[d][1,2,3]triazole (10 g, 37 mmol), tris(dibenzylideneacetone)dipalladium (1.7 g, 1.85 mmol), 2-dicyclohexylphosphino-2',6'-dimethoxybiphenyl (1.5 g, 3.6 mmol), sodium tert-butoxide (5.3 g, 55 mmol), and 150 mL of xylene were added to a flask, and the mixture was stirred under reflux for 3 hours. After completion of the reaction, the reaction mixture was extracted with ethyl acetate, and separated by column chromatography to obtain compound C-111 (7 g, yield: 36%).

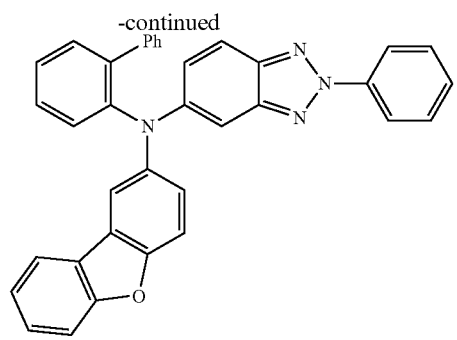

C-111

| Compound | MW | M.P. |
| --- | --- | --- |
| C-111 | 528.62 | 148° C. |

Hereinafter, a method of producing an organic electroluminescent device (OLED) comprising the organic electroluminescent compound according to the present disclosure and the luminous efficiency and lifetime properties thereof will be explained in detail. However, the present disclosure is not limited by the following examples.

Device Examples 1 to 3: Producing an OLED Deposited with the Compound According to the Present Disclosure as a Host OLEDs according to the present disclosure were produced. A transparent electrode indium tin oxide (ITO) thin film (10 Ω/sq) on a glass substrate for an OLED (GEOMATEC CO., LTD., Japan) was subjected to an ultrasonic washing with acetone and isopropyl alcohol, sequentially, and then was stored in isopropanol. The ITO substrate was then mounted on a substrate holder of a vacuum vapor deposition apparatus. Compound HI-1 was introduced into a cell of the vacuum vapor deposition apparatus, and compound HT-1 was introduced into another cell of the vacuum vapor deposition apparatus. The two materials were evaporated at different rates, and compound HI-1 was deposited in a doping amount of 3 wt % based on the total amount of compound HI-1 and compound HT-1 to form a hole injection layer having a thickness of 10 nm on the ITO substrate. Next, compound HT-1 was deposited on the hole injection layer to form a first hole transport layer having a thickness of 80 nm. Compound HT-2 was then introduced into another cell of the vacuum vapor deposition apparatus and was evaporated by applying an electric current to the cell, thereby forming a second hole transport layer having a thickness of 60 nm on the first hole transport layer. After forming the hole injection layer and the hole transport layers, a light-emitting layer was formed thereon as follows:

the compound shown in Table 1 was introduced into a cell of the vacuum vapor deposition apparatus as a host, and compound D-39 was introduced into another cell as a dopant. The two materials were evaporated at different rates and the dopant was deposited in a doping amount of 3 wt % based on the total amount of the host and the dopant to form a light-emitting layer having a thickness of 40 nm on the second hole transport layer. Compound ET-1 and compound EI-1 were evaporated in a rate of 1:1 to form an electron transport layer having a thickness of 35 nm on the light-emitting layer. After depositing compound EI-1 as an electron injection layer having a thickness of 2 nm on the electron transport layer, an Al cathode having a thickness of 80 nm was deposited on the electron injection layer by another vacuum vapor deposition apparatus. Thus, an OLED was produced.

Comparative Examples 1 and 2: Producing an OLED Comprising a Comparative Compound as a Host OLEDs were produced in the same manner as in Device Example 1, except that the compound shown in Table 1 was used as a host of the light-emitting layer.

The luminous efficiency and light-emitting color at a luminance of 1,000 nit, and the time taken for luminance to decrease from 100% to 95% at a luminance of 5,000 nit (lifetime; T95) of the OLEDs produced in the Device Examples and the Comparative Examples are provided in Table 1 below.

TABLE 1

|  | Host | Luminous Efficiency [cd/A] | Light-Emitting Color | Lifetime (T95) [hr] |
| --- | --- | --- | --- | --- |
| Device Example 1 | C-3 | 31.0 | Red | 458 |
| Device Example 2 | C-1 | 30.1 | Red | 183 |
| Device Example 3 | C-111 | 31.0 | Red | 16.2 |
| Comparative Example 1 | CBP | 11.7 | Red | 0.31 |
| Comparative Example 2 | A | 25.0 | Red | 14.1 |

From Table 1 above, it can be confirmed that the organic electroluminescent device comprising the compound according to the present disclosure in a light-emitting layer has improved luminous efficiency and/or lifetime properties, compared to the organic electroluminescent device comprising the conventional compound. It is understood that the compound according to the present disclosure is suitable for use as an ambipolar host material, since it has better electron-acceptor properties than conventional compounds.

The compounds used in the Device Examples and the Comparative Examples are shown in Table 2 below.

TABLE 2

Hole Injection Layer/Hole Transport Layer

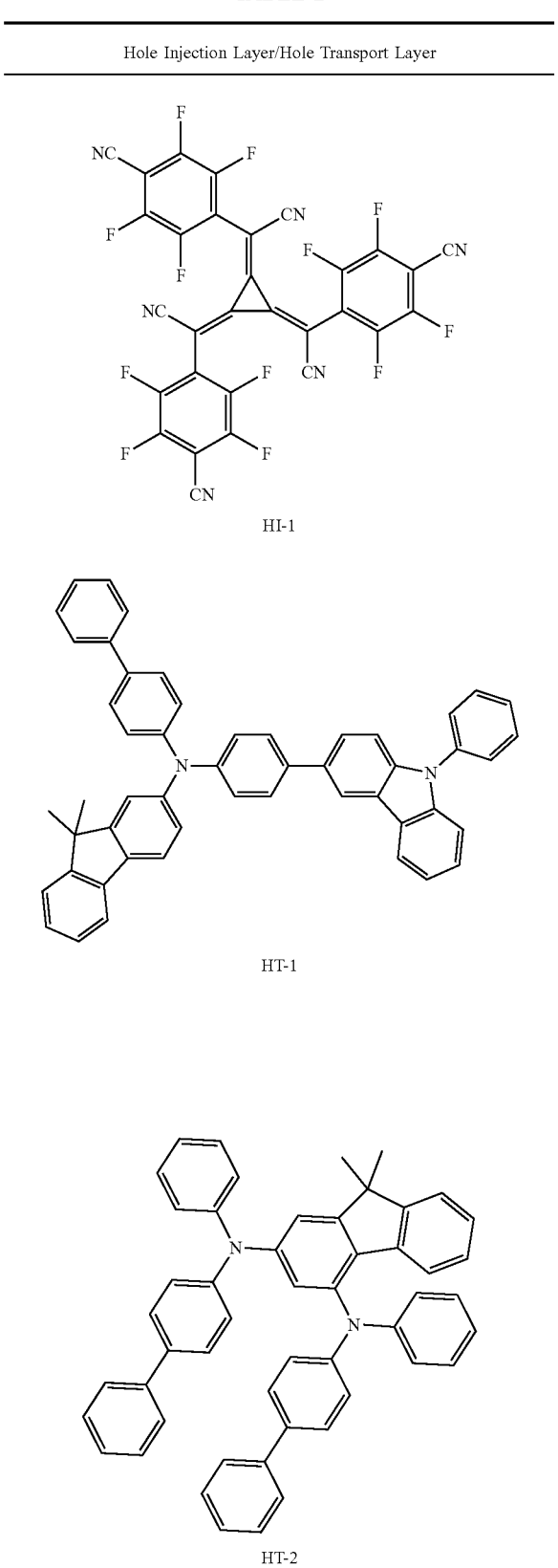

TABLE 2-continued
Light-Emitting Layer
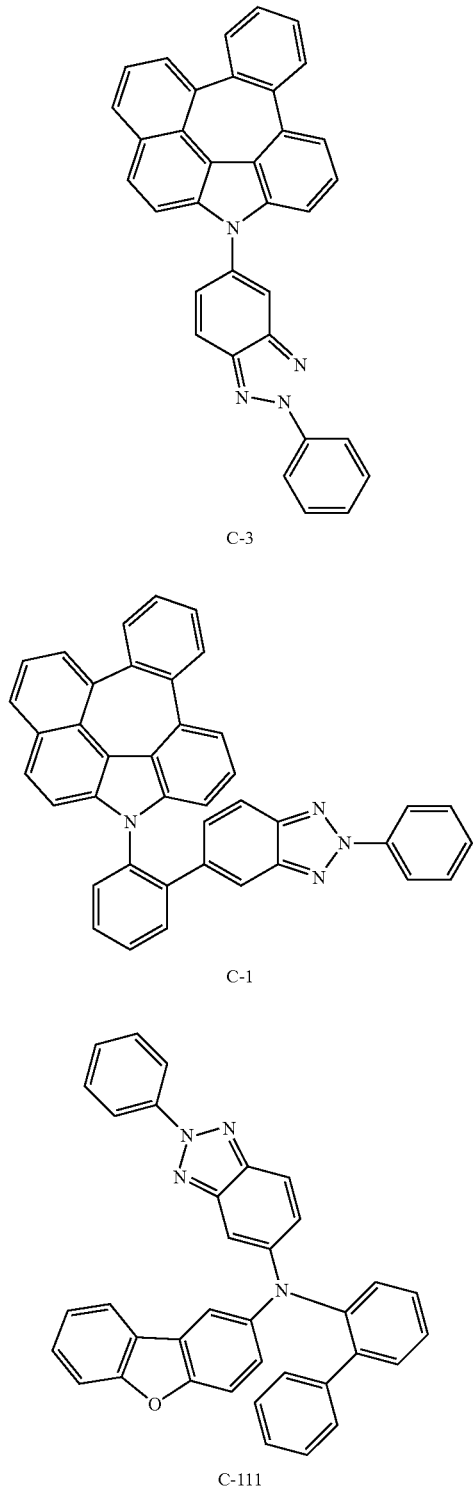
C-3
C-1
C-111
TABLE 2-continued
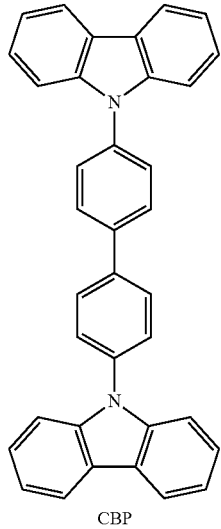
CBP
A
D-39
Electron Transport Layer/ Electron Injection Layer
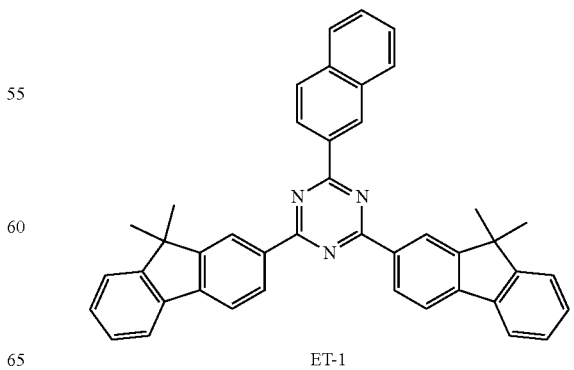
ET-1

TABLE 2-continued

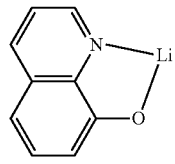

EI-1

The invention claimed is:

1. An organic electroluminescent compound represented by following formula 1-1:

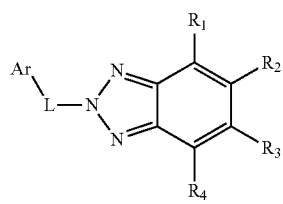

(1-1)

Ar represents a substituted or unsubstituted (C1-C30) alkyl, a substituted or unsubstituted (C6-C30) aryl, or a substituted or unsubstituted (3- to 30-membered) heteroaryl;

L represents a single bond, a substituted or unsubstituted (C6-C30) arylene, or a substituted or unsubstituted (3- to 30-membered) heteroarylene;

$R_1$, $R_2$, $R_3$, and $R_4$, each independently, represent hydrogen, deuterium, a cyano, a (C1-C30)alkyl, a (C2-C30) alkenyl, a (C2-C30)alkynyl, a (C3-C30) cycloalkyl; a (C3-C30)cycloalkenyl, a (3- to 7-membered)heterocycloalkyl, a (C6-C30)aryloxy, a (C6-C30)arylthio, a (C6-C30)aryl, a tri(C1-C30)alkylsilyl, a tri(C6-C30) arylsilyl, a di(C1-C30)alkyl(C6-C30)arylsilyl, a (C1-C30)alkyldi(C6-C30)arylsilyl, a di(C6-C30)arylboronyl, a di(C1-C30)alkylboronyl, a (C1-C30)alkyl(C6-C30)arylboronyl, a (C6-C30)aryl(C1-C30)alkyl, a (C1-C30)alkyl(C6-C30)aryl, or -$L_1$($Ar_1$) a, with the proviso that at least one of $R_1$, $R_2$, $R_3$, and $R_4$ represents -L1 ($Ar_1$)a; and $L_1$ represents a single bond, a substituted or unsubstituted (C6-C30)arylene, or a substituted or unsubstituted (3- to 30-membered)heteroarylene;

$Ar_1$, each independently, is represented by any one of the following formulas 1-11 to 1-20:

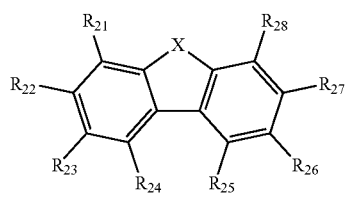

(1-11)

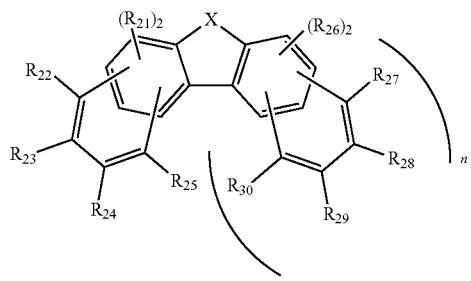

(1-12)

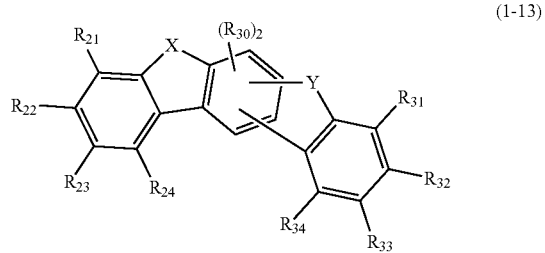

(1-13)

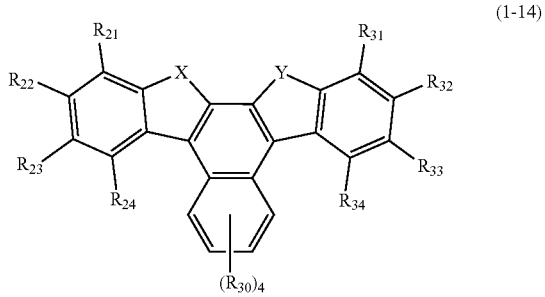

(1-14)

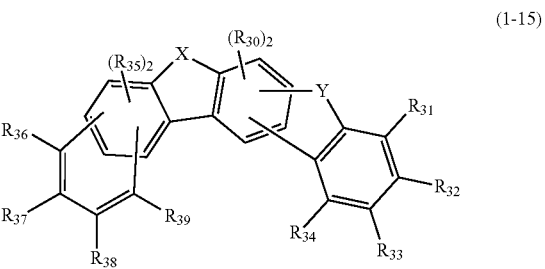

(1-15)

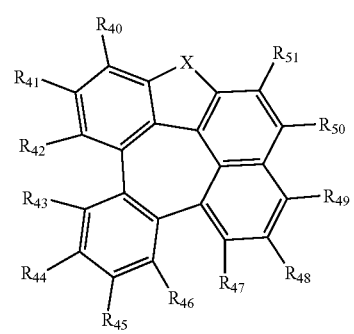

(1-16)

-continued

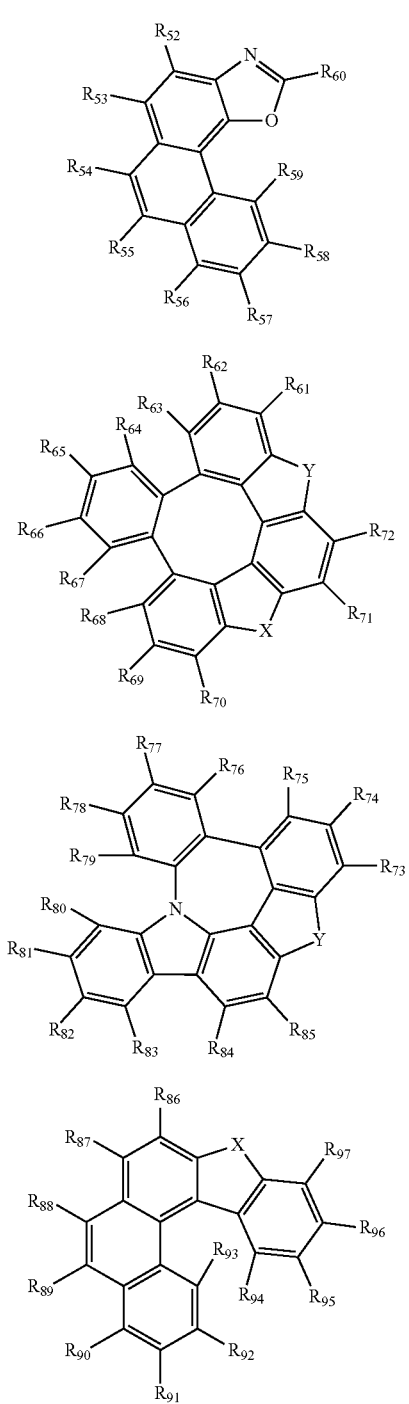

in formulas 1-11, X represents O, or S;
in formula 1-12, formula 1-16, and formula 1-20, X represents O, S, or N(Ra);
in formula 1-13, formula 1-14, formula 1-15, and formula 1-18, X represents O, S, or N(Ra) and Y represents O, S, N(Ra), or C(Rb)(Rc);
in formula 1-19, Y represents O, S, N(Ra), or C(Rb)(Rc);
n represents an integer of 0 or 1; and
$R_{21}$, $R_{22}$, $R_{23}$, $R_{24}$, $R_{25}$, $R_{26}$, $R_{27}$, $R_{28}$, $R_{29}$, $R_{30}$, $R_{31}$, $R_{32}$, $R_{33}$, $R_{34}$, $R_{35}$, $R_{36}$, $R_{37}$, $R_{38}$, $R_{39}$, $R_{40}$, $R_{41}$, $R_{42}$, $R_{43}$, $R_{44}$, $R_{45}$, $R_{46}$, $R_{47}$, $R_{48}$, $R_{49}$, $R_{50}$, $R_{51}$, $R_{52}$, $R_{53}$, $R_{54}$, $R_{55}$, $R_{56}$, $R_{57}$, $R_{58}$, $R_{59}$, $R_{60}$, $R_{61}$, $R_{62}$, $R_{63}$, $R_{64}$, $R_{65}$, $R_{66}$, $R_{67}$, $R_{68}$, $R_{69}$, $R_{70}$, $R_{71}$, $R_{72}$, $R_{73}$, $R_{74}$, $R_{75}$, $R_{76}$, $R_{77}$, $R_{78}$, $R_{79}$, $R_{80}$, $R_{81}$, $R_{82}$, $R_{83}$, $R_{84}$, $R_{85}$, $R_{86}$, $R_{87}$, $R_{88}$, $R_{89}$, $R_{90}$, $R_{91}$, $R_{92}$, $R_{93}$, $R_{94}$, $R_{95}$, $R_{96}$, $R_{97}$, Ra, Rb, and Rc, each independently, represent a position linked to -$L_1$, or represent hydrogen, deuterium, a substituted or unsubstituted (C1-C30)alkyl, a substituted or unsubstituted (C6-C30)aryl, or a substituted or unsubstituted (3- to 30-membered)heteroaryl, in which each of two $R_{30}$, each of two $R_{35}$ may be the same or different wherein the substituent(s) of the substituted alkyl, the substituted aryl, the substituted arylene, the substituted heteroaryl, and the substituted heteroarylene, each independently, are at least one selected from the group consisting of deuterium; a halogen; a cyano; a carboxyl; a nitro; a phosphineoxide; a (C1-C30)alkyl; a halo(C1-C30)alkyl; a (C2-C30)alkenyl; a (C2-C30)alkynyl; a (C1-C30)alkylthio; a (C3-C30)cycloalkyl; a (C6-C30)cycloalkenyl; a (3- to 7-membered)heterocycloalkyl; a (C6-C30)aryloxy; a (C6-C30)arylthio; a (3- to 30-membered)heteroaryl unsubstituted or substituted with a (C6-C30)aryl(s); a (C6-C30)aryl unsubstituted or substituted with a (3- to 30-membered)heteroaryl(s); a tri(C1-C30)alkylsilyl; a tri(C6-C30)arylsilyl; a di(C1-C30)alkyl(C6-C30)arylsilyl; a (C1-C30)alkyldi(C6-C30)arylsilyl; a (C1-C30)alkylcarbonyl; a (C1-C30)alkoxycarbonyl; a (C6-C30)arylcarbonyl; a (C6-C30)arylphosphine; a di(C6-C30)arylboronyl; a di(C1-C30)alkylboronyl; a (C1-C30)alkyl(C6-C30)arylboronyl; a (C6-C30)aryl(C1-C30)alkyl; and a (C1-C30)alkyl(C6-C30)aryl; and a represents an integer of 1 or 2, where if a is an integer of 2, each of $Ar_1$ may be the same or different; and with the proviso that when $R_1$ and $R_4$ represent -$L_1$ ($Ar_1$)a, $L_1$ represents a single bond, $Ar_1$ is represented by formula 1-11, and a represents an integer of 1, then neither $R_{21}$ nor $R_{28}$ is a position linked to -$L_1$.

2. An electroluminescent compound selected from the following compounds:

C-1

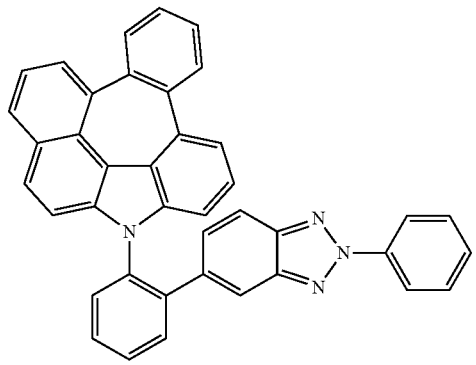 [SMILES: c1ccc(-n2nc3ccc(-c4ccccc4-n4c5cccc6c5c5c7c(cccc7ccc54)-c4ccccc4-6)cc3n2)cc1]

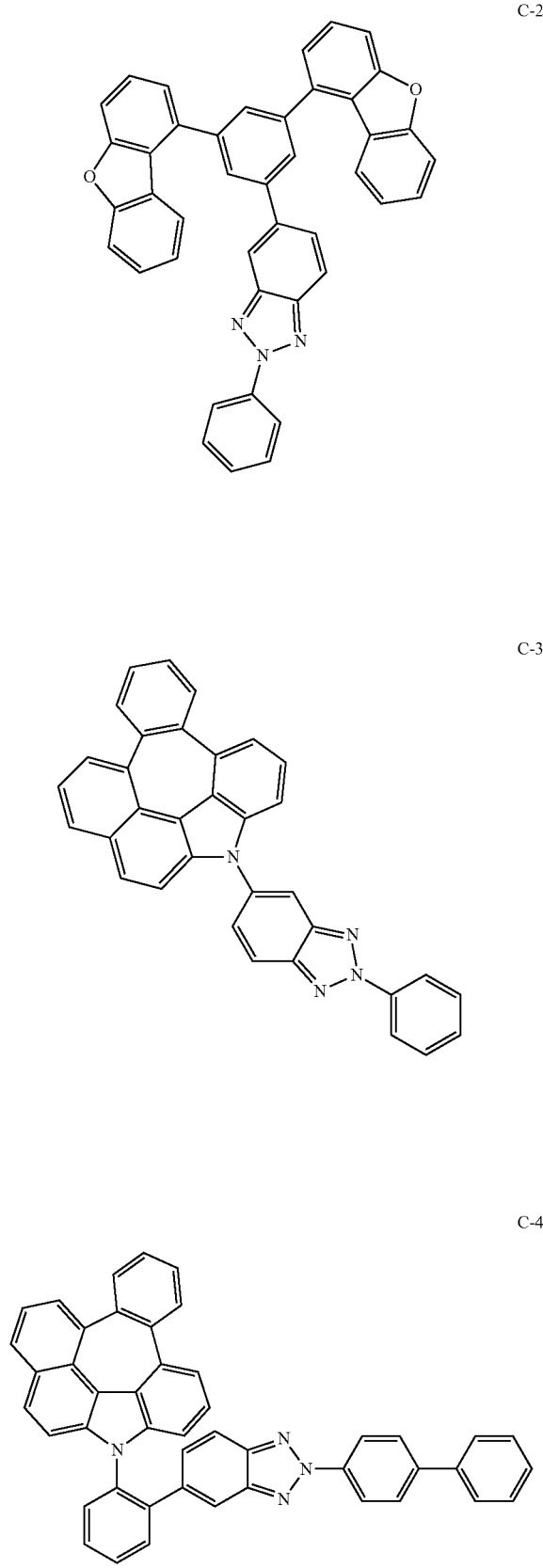
C-2
C-3
C-4
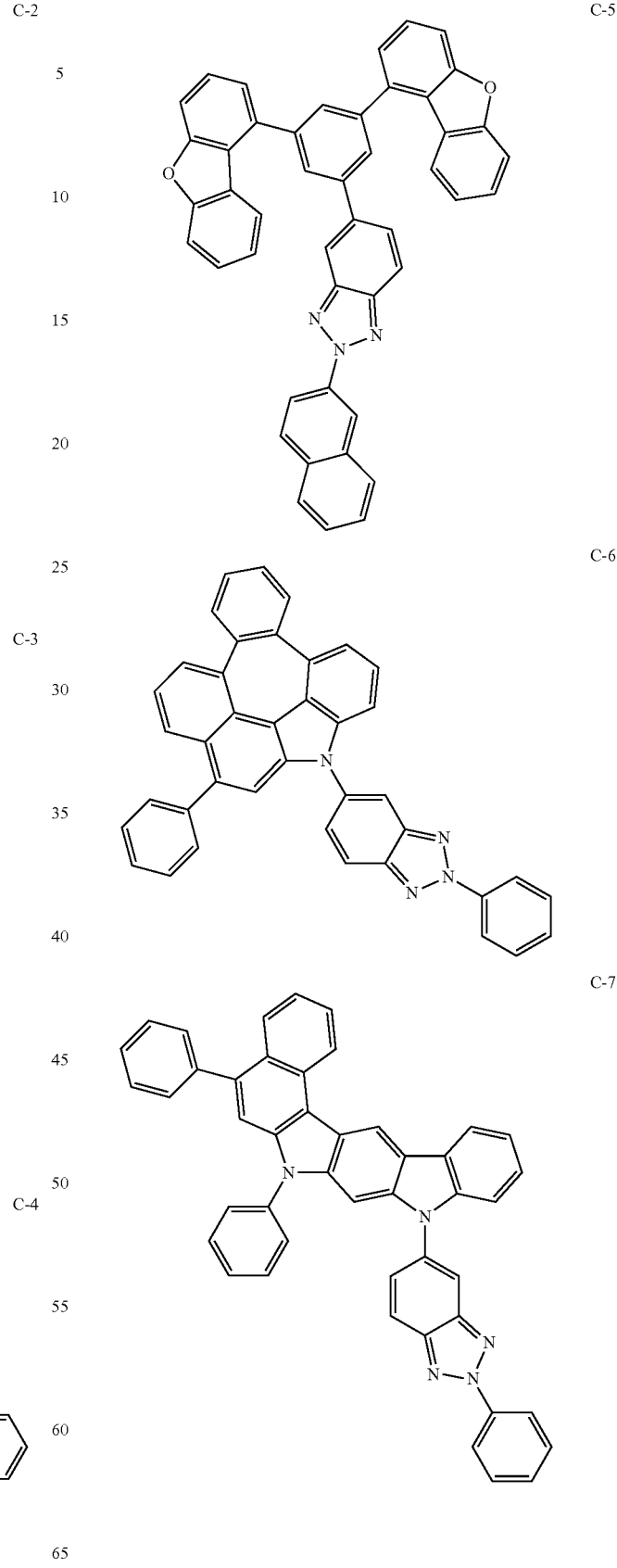
C-5
C-6
C-7

-continued
C-9
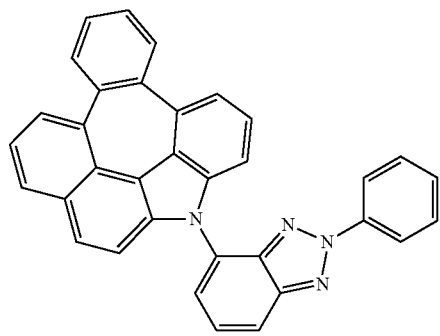
C-10
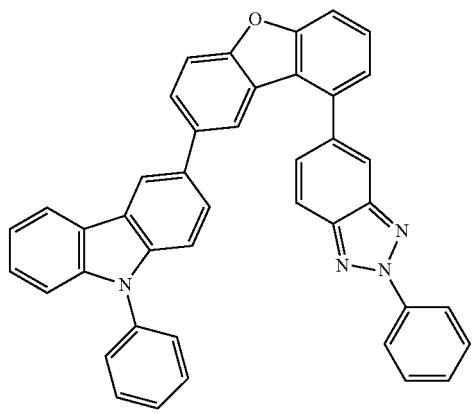
C-11
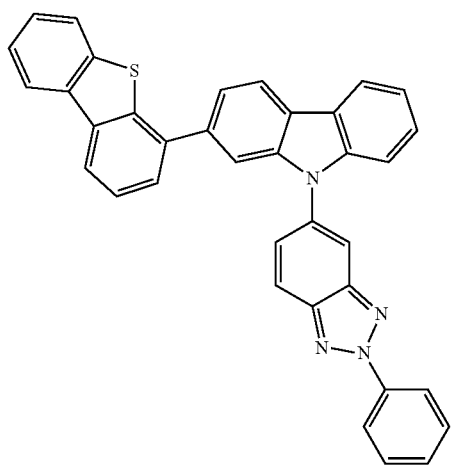
C-12
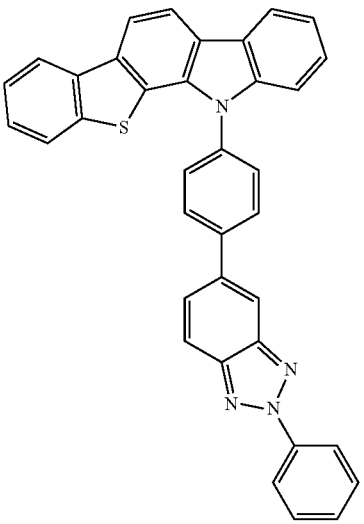
C-13
C-14
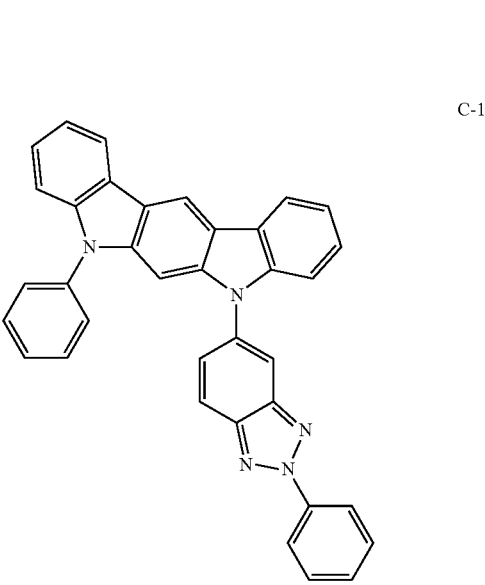

C-15
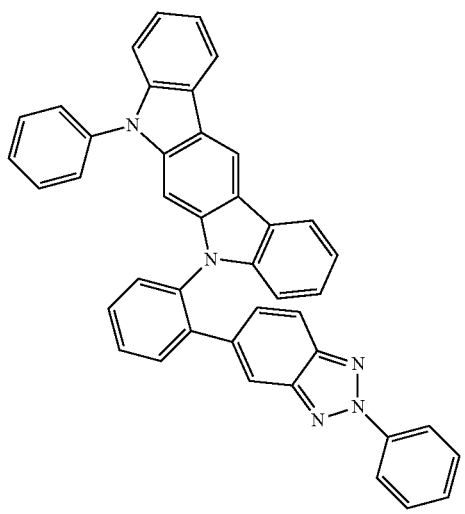
C-16
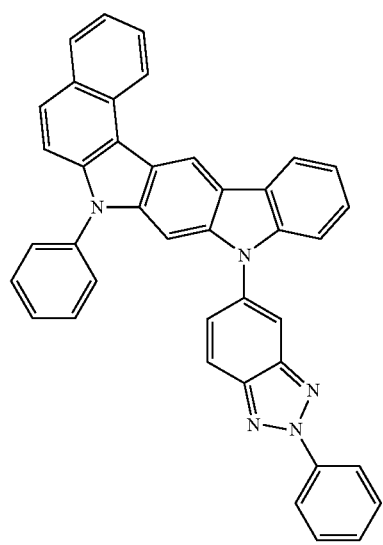
C-18
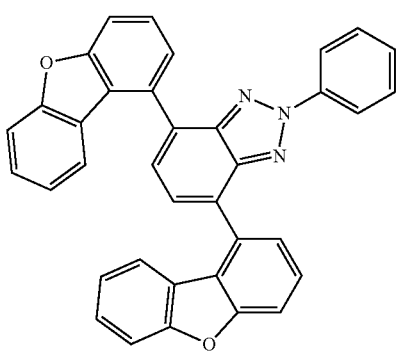
C-19
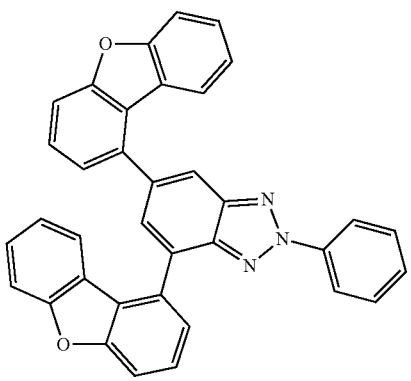
C-20
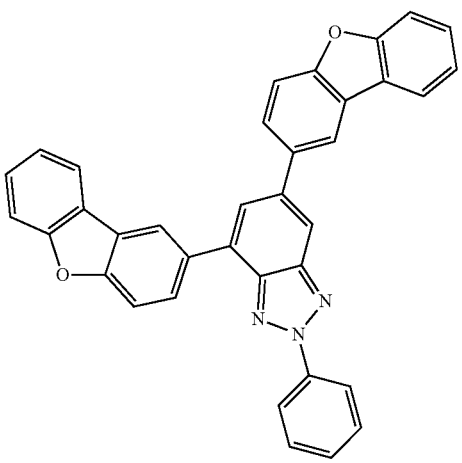
C-21
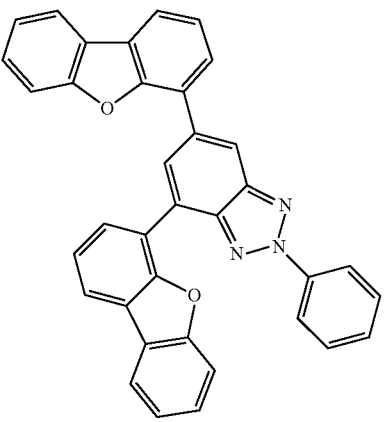

C-22
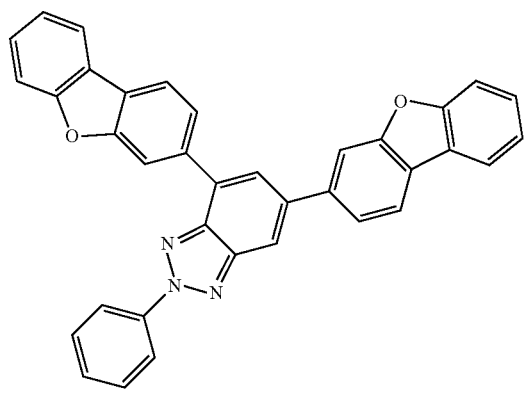
C-23
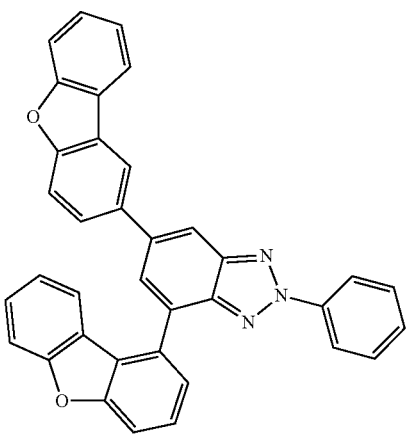
C-24
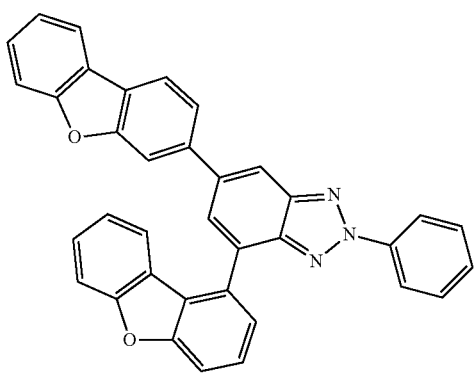
C-25
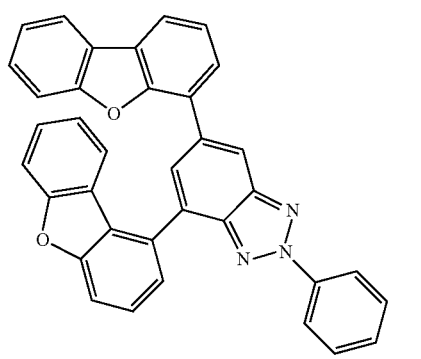
C-26
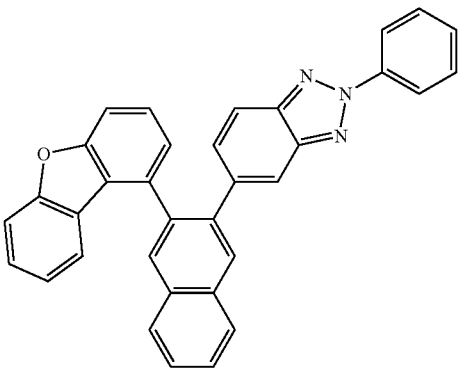
C-27
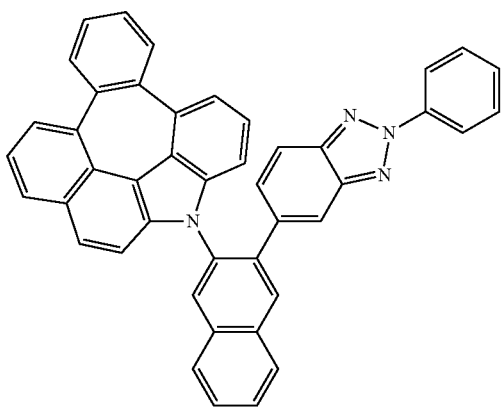
C-30
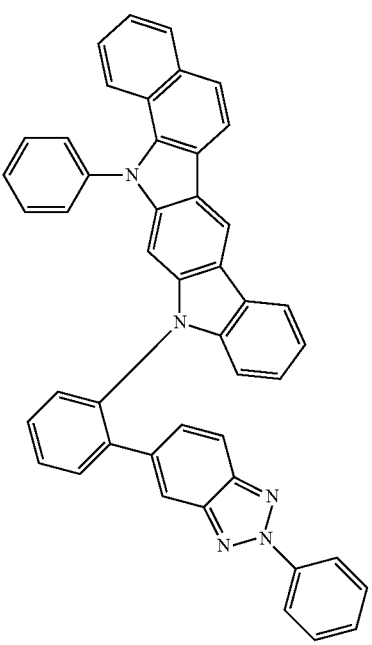

C-31
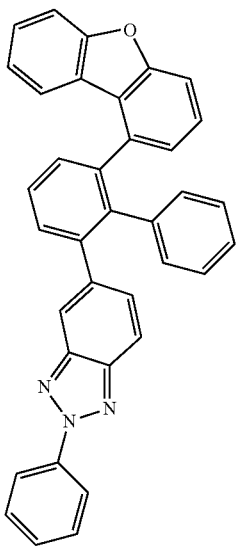
C-32
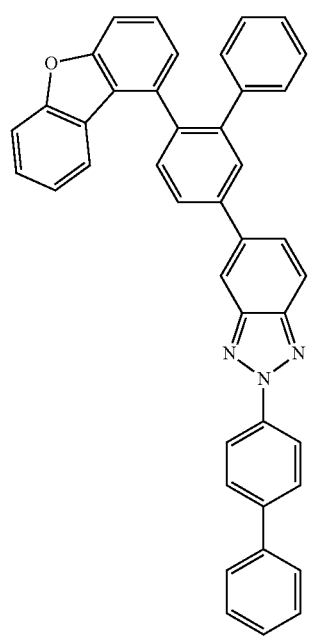
C-33
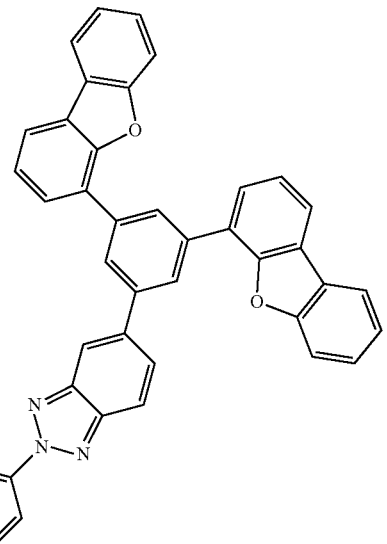
C-34
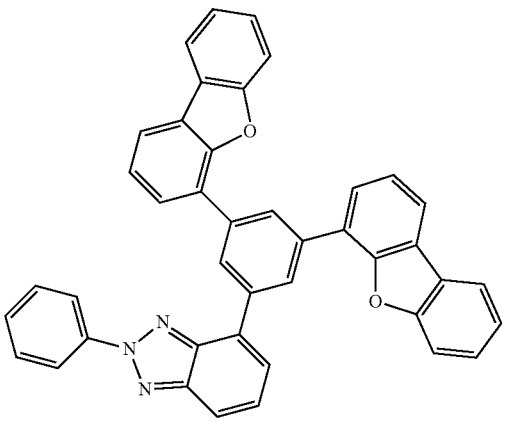
C-35

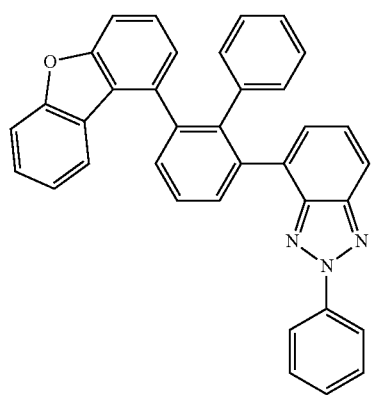
C-36
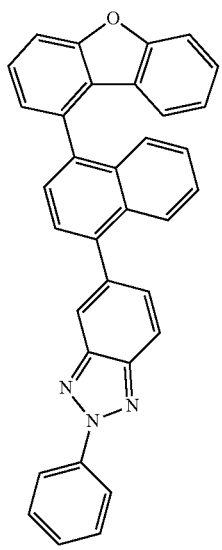
C-41
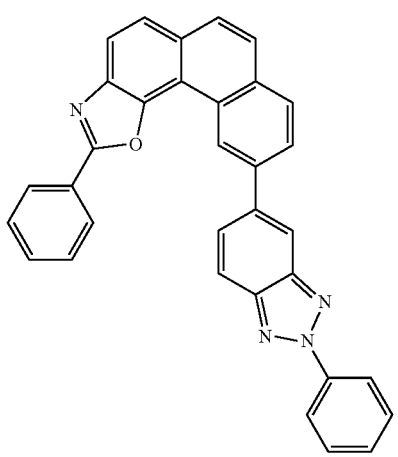
C-39
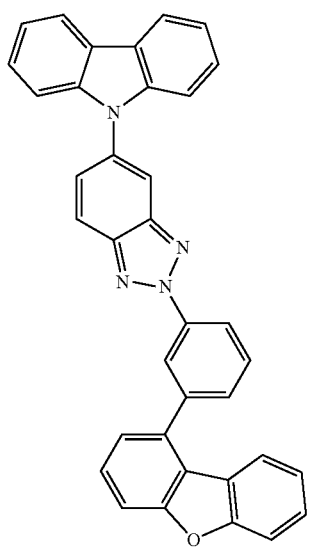
C-42
C-40
C-43

121
-continued
C-44
C-45
C-46
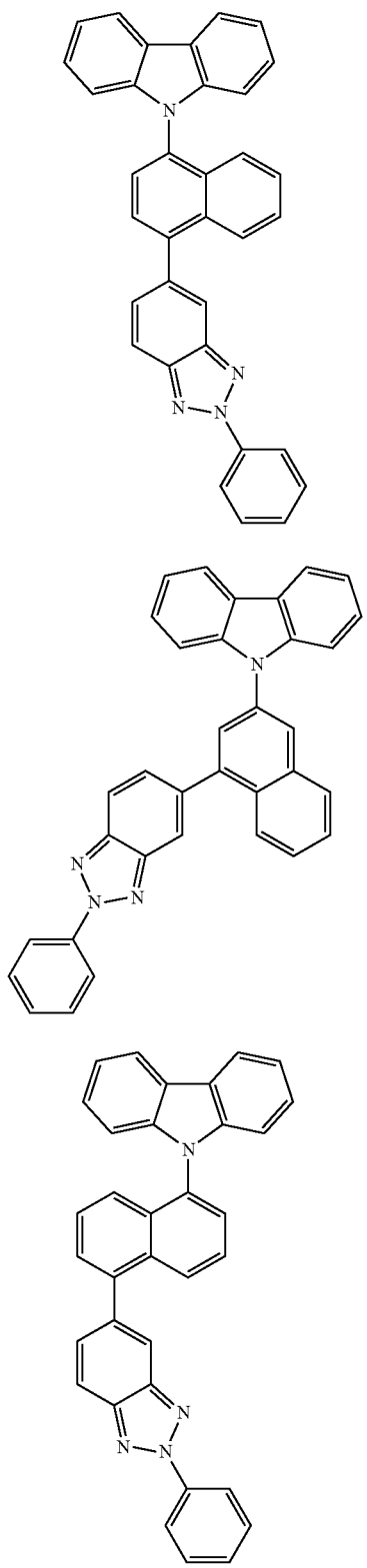
122
-continued
C-48
C-49
C-50
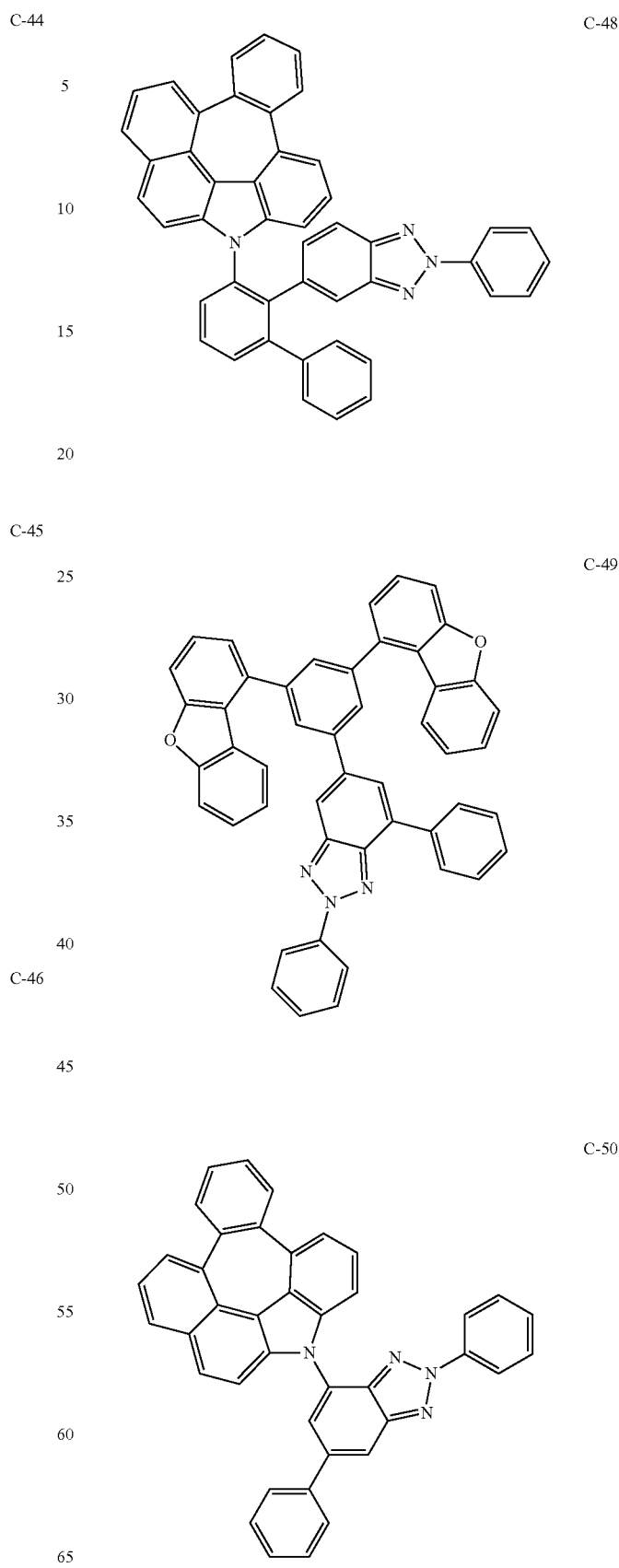

C-51
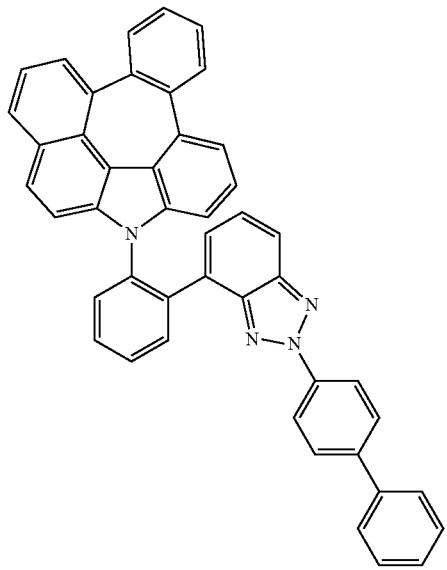
C-52
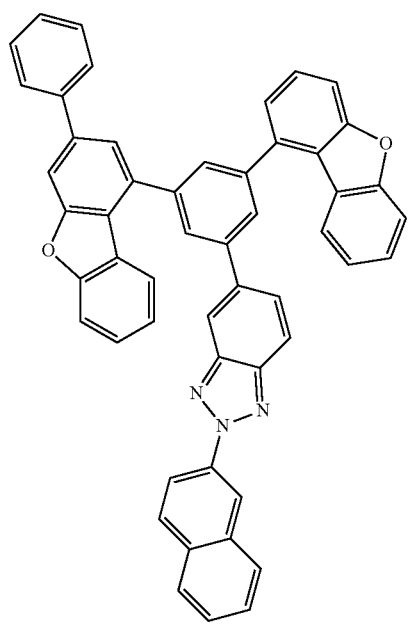
C-53
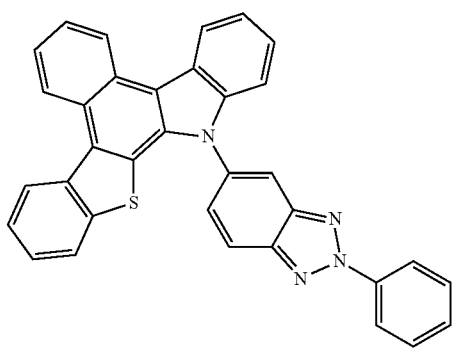
C-54
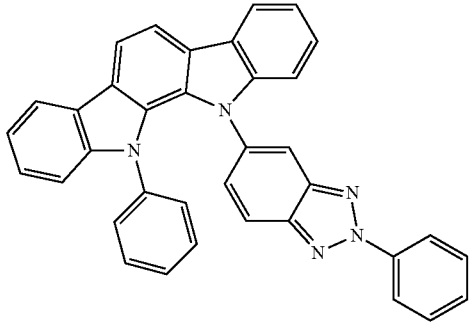
C-57
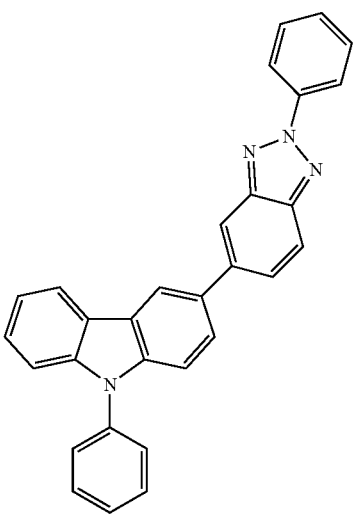
C-58
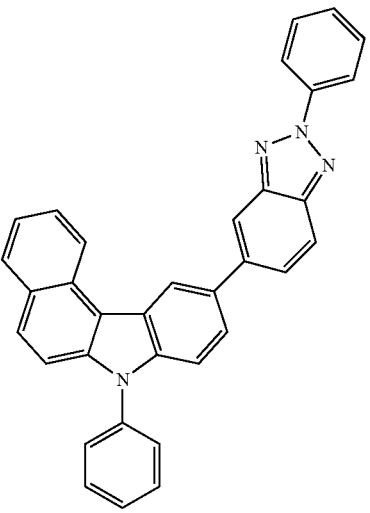

C-59
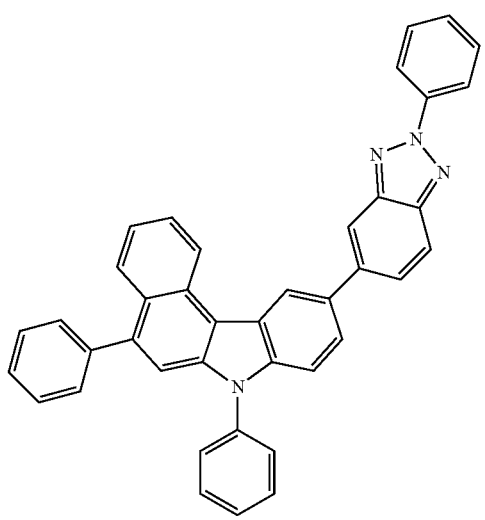
C-60
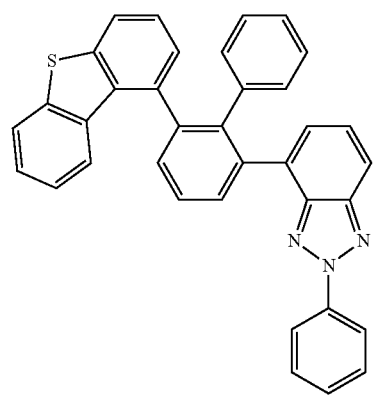
C-66
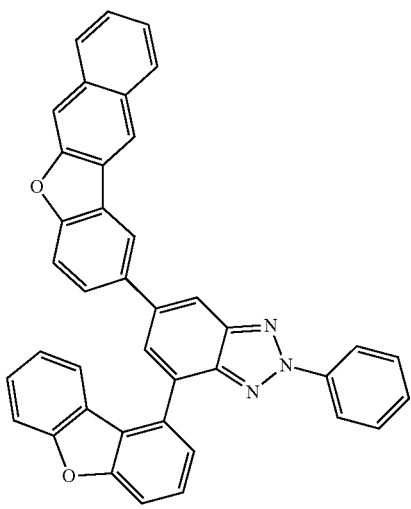
C-67
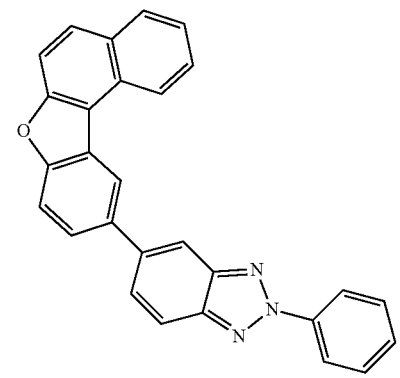
C-68
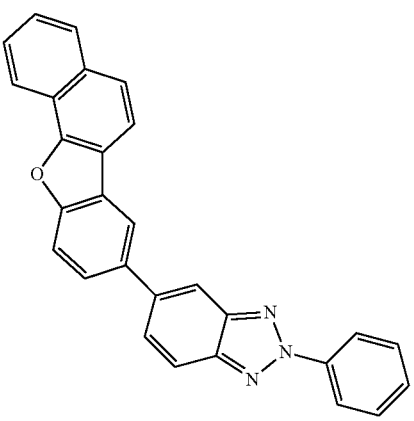
C-69
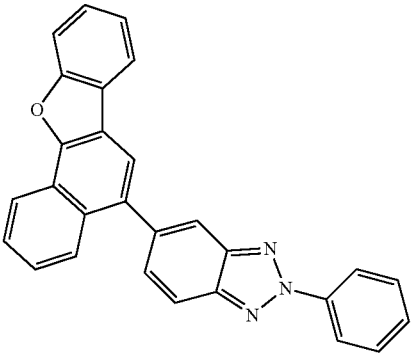
C-70
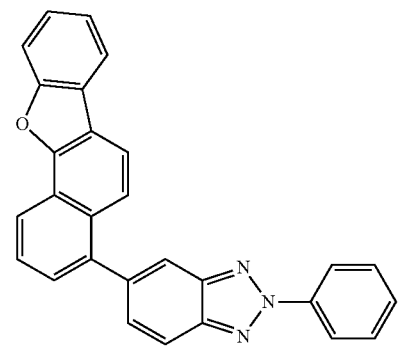

C-71
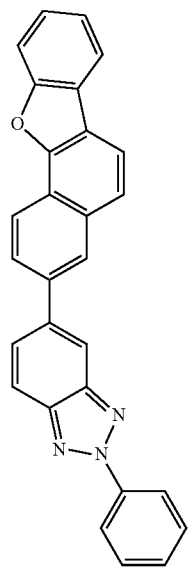
C-72
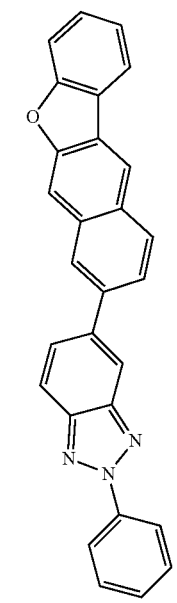
C-73
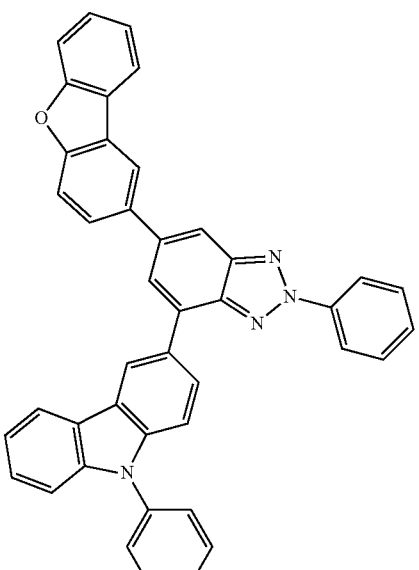
C-74
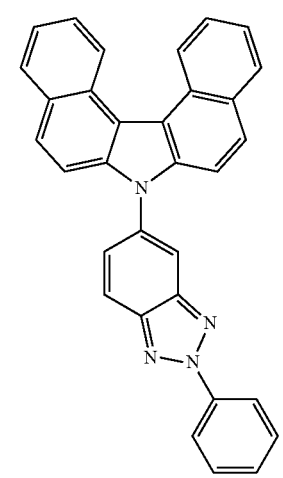
C-75
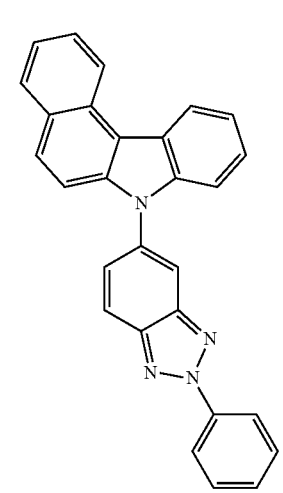

C-76 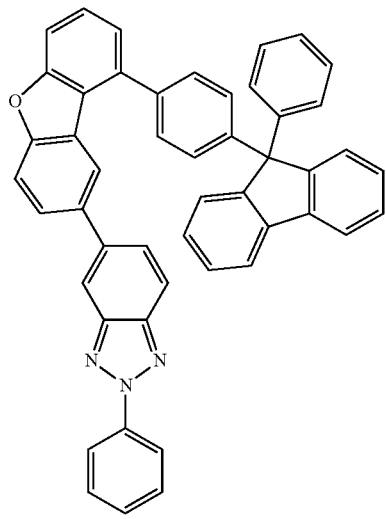
C-77 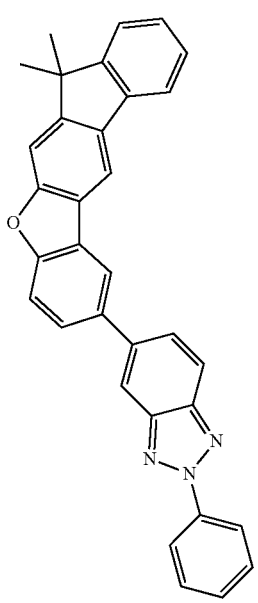
C-78 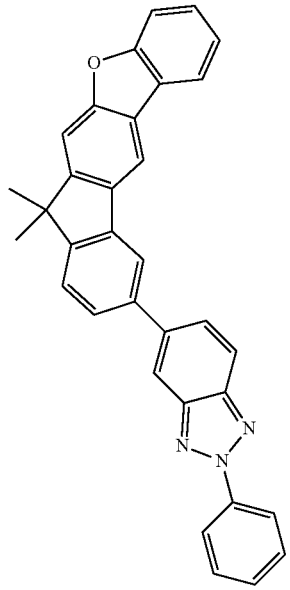
C-79 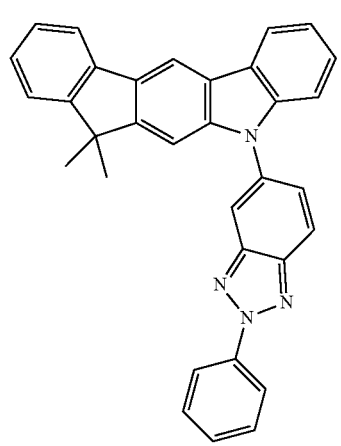
C-80 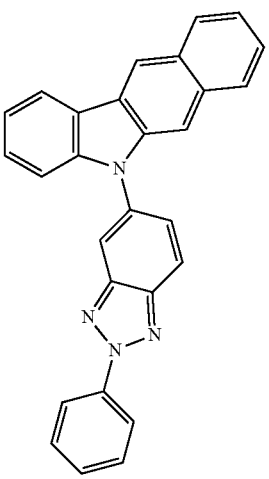

-continued
C-81
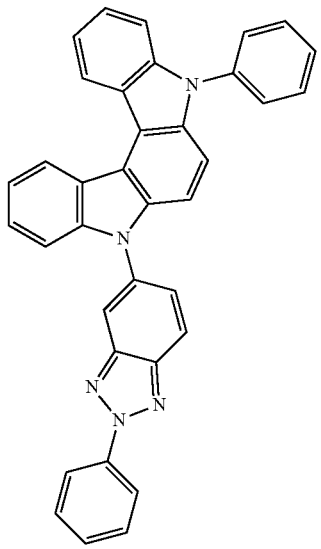
C-82
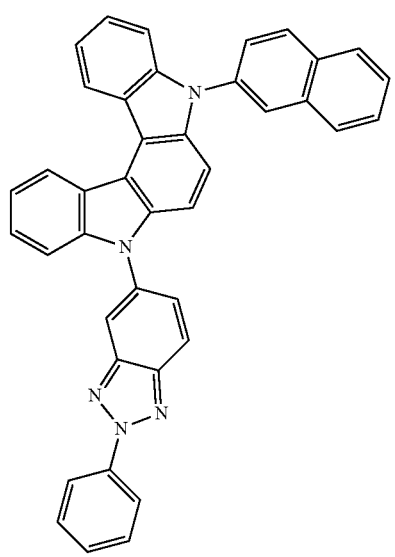
C-84
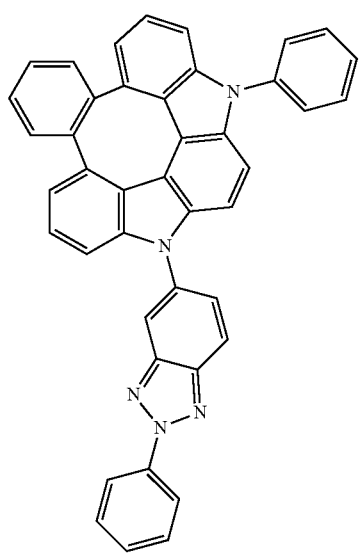
-continued
C-85
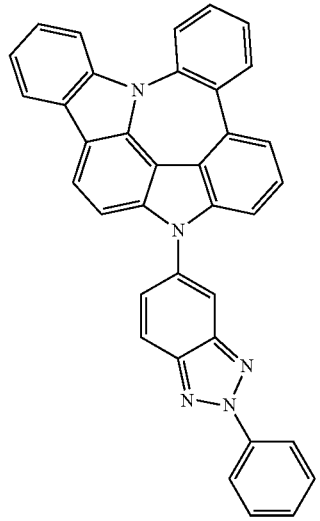
C-86
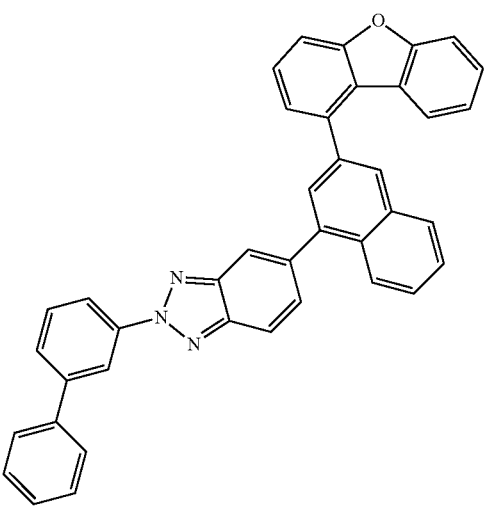
C-87
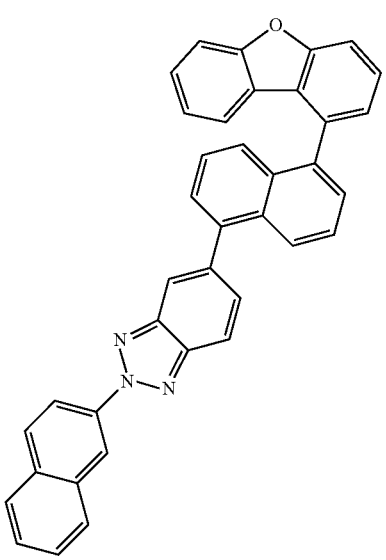

C-88
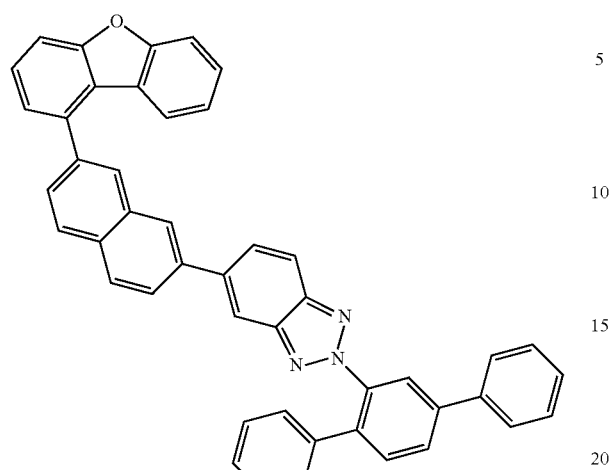
C-89
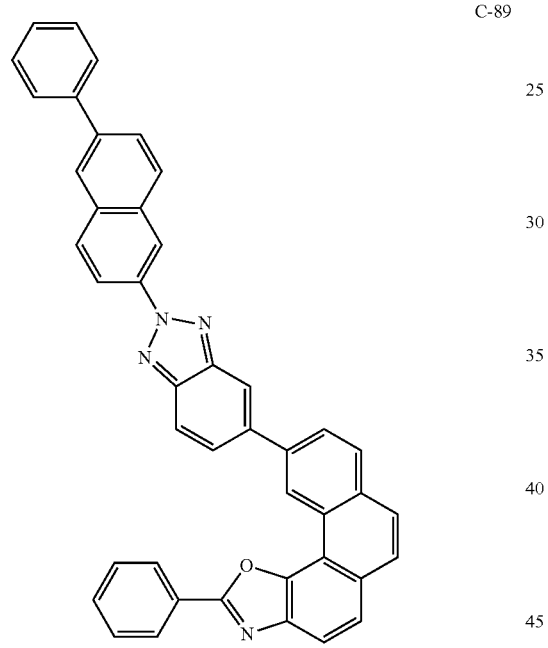
C-90
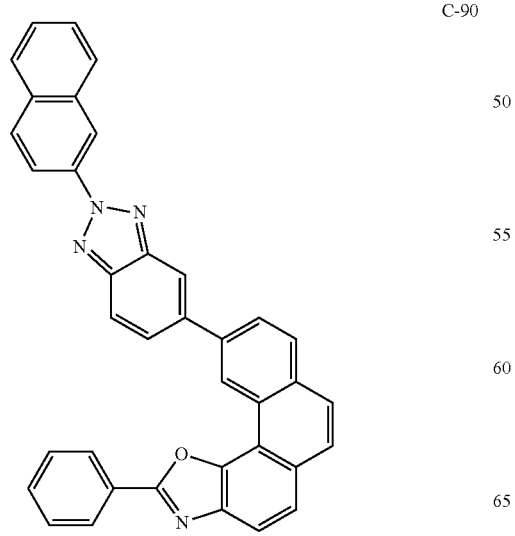
C-91
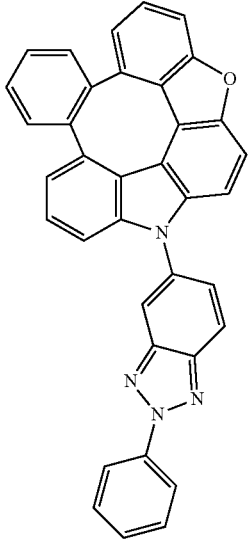
C-92
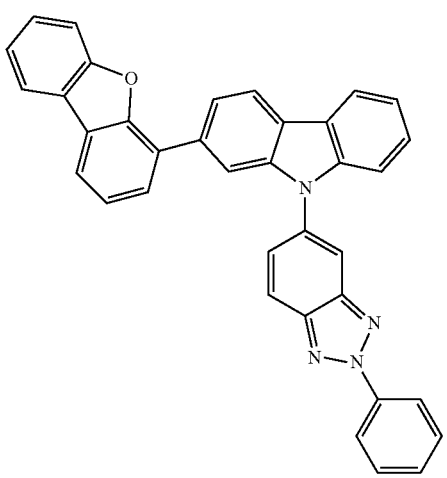
C-93
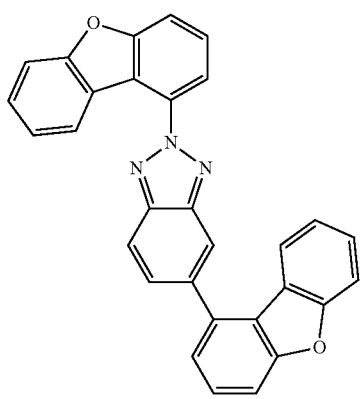

C-94
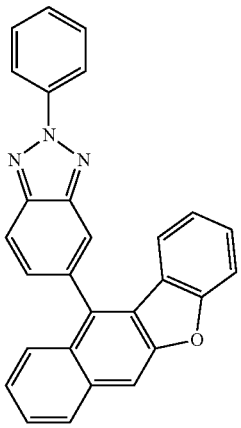
C-95
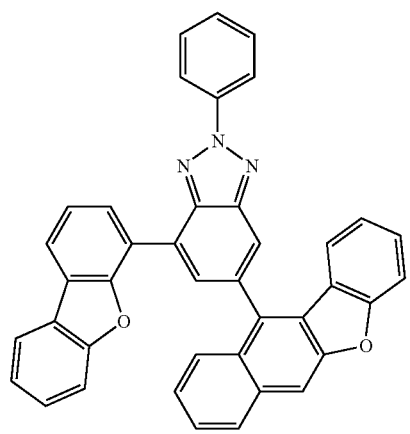
C-96
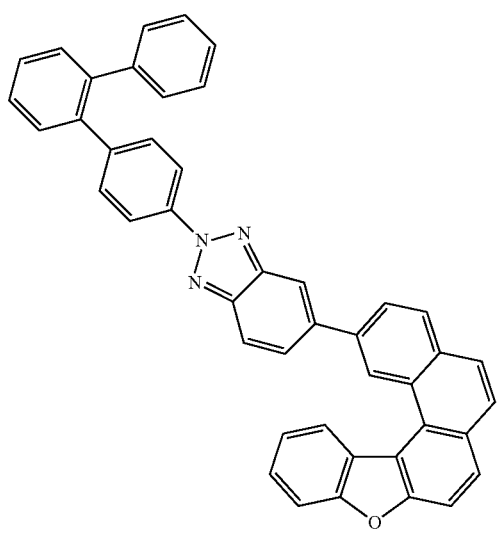
C-97
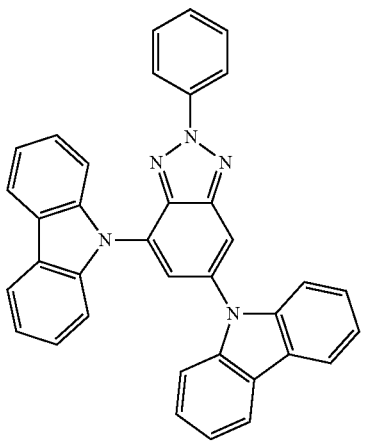
C-98
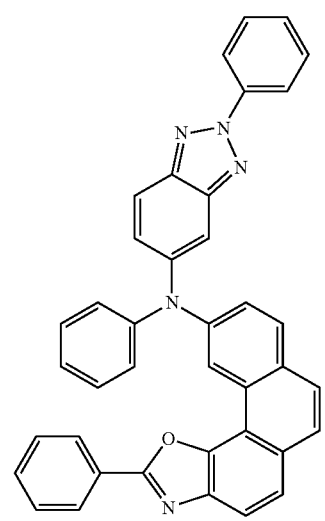
C-99
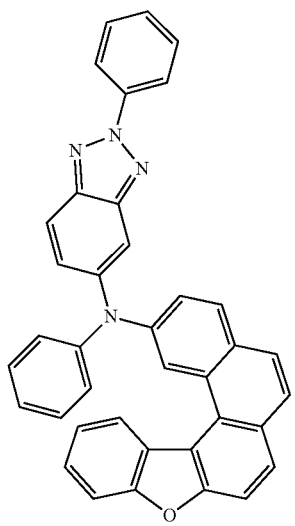

C-100
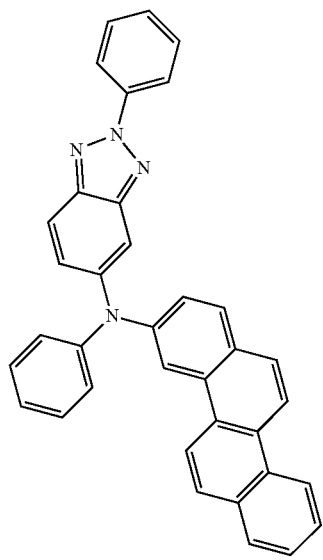
C-109
C-110
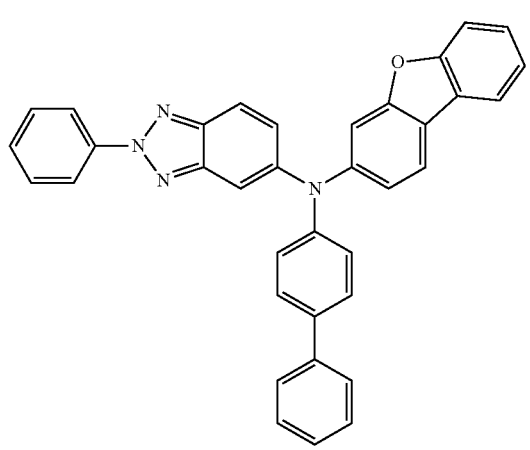
C-111
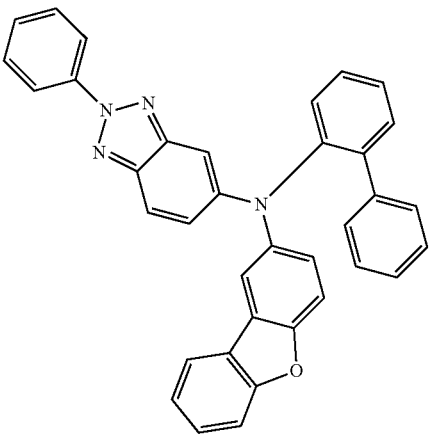
C-111
C-112

C-113

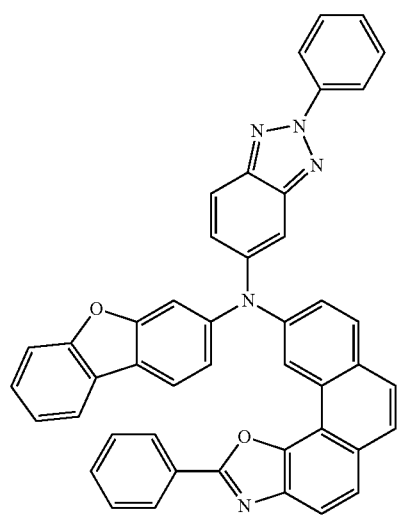

C-114

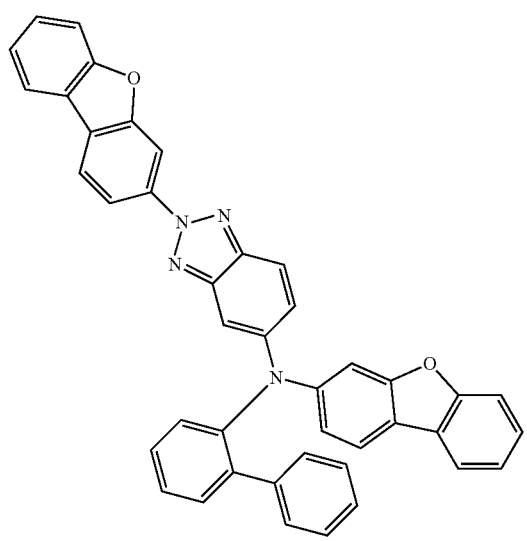

and

C-115

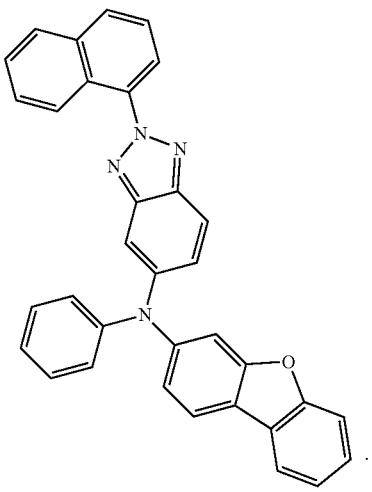

.

3. An organic electroluminescent material, wherein the organic electroluminescent material comprises at least one the organic electroluminescent compound according to claim 1.

4. An organic electroluminescent material, wherein the organic electroluminescent material comprises at least one organic electroluminescent compound according to claim 2.

* * * * *